(12) United States Patent
Hiraiwa et al.

(10) Patent No.: US 8,569,735 B2
(45) Date of Patent: Oct. 29, 2013

(54) SEMICONDUCTOR LIGHT-EMITTING ELEMENT, ELECTRODE AND MANUFACTURING METHOD FOR THE ELEMENT, AND LAMP

(75) Inventors: Daisuke Hiraiwa, Ichihara (JP); Takehiko Okabe, Chiba (JP); Remi Ohba, Tokyo (JP); Munetaka Watanabe, Chiba (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 175 days.

(21) Appl. No.: 12/999,530

(22) PCT Filed: Jun. 16, 2009

(86) PCT No.: PCT/JP2009/060926
§ 371 (c)(1),
(2), (4) Date: Dec. 16, 2010

(87) PCT Pub. No.: WO2009/154191
PCT Pub. Date: Dec. 23, 2009

(65) Prior Publication Data
US 2011/0089401 A1    Apr. 21, 2011

(30) Foreign Application Priority Data

Jun. 16, 2008 (JP) ................................. 2008-157248
Aug. 1, 2008 (JP) ................................. 2008-199802
Sep. 5, 2008 (JP) ................................. 2008-228133
Jun. 2, 2009 (JP) ................................. 2009-133177

(51) Int. Cl.
*H01L 33/04* (2010.01)
*H01L 33/46* (2010.01)
*H01L 33/42* (2010.01)

(52) U.S. Cl.
USPC  257/13; 257/98; 257/E33.008; 257/E33.064; 257/99; 257/100; 438/28; 438/29; 438/614; 438/605; 438/34

(58) Field of Classification Search
USPC ......... 257/98, 13, E33.008, E33.064, E33.72, 257/99, 100, 784; 438/28, 29, 614, 605, 34, 438/39, 46
See application file for complete search history.

(56) References Cited

U.S. PATENT DOCUMENTS 6,414,339 B1   7/2002   Tsutsui
6,610,589 B2   8/2003   Tsutsui
(Continued)

FOREIGN PATENT DOCUMENTS

CN   1213863 A   4/1999
CN   1755899 A   4/2006
(Continued)

OTHER PUBLICATIONS

Chinese Office Action dated Jul. 24, 2012 for corresponding Chinese Patent Application No. 200980131958.1.

(Continued)

*Primary Examiner* — Cathy N Lam
(74) *Attorney, Agent, or Firm* — Sughrue Mion, PLLC

(57) ABSTRACT

A semiconductor light-emitting element including a substrate, a laminated semiconductor layer including a light-emitting layer formed over the substrate, one electrode (111) formed over the upper face of the laminated semiconductor layer, and an other electrode formed over the exposed surface of the semiconductor layer, from which the laminated semiconductor layer is partially cut off. The one electrode (111) includes a junction layer (110) and a bonding pad electrode (120) formed to cover the junction layer. The bonding pad electrode has a maximum thickness larger than that of the junction layer, and is composed of one or two or more layers. Slopes (110c), (117c) and (119c), which are made gradually thinner toward the outer circumference, are formed in the outer circumference portions (110d) and (120d) of the junction layer and the bonding pad electrode. Also disclosed is a method for manufacturing the element and a lamp.

17 Claims, 33 Drawing Sheets

(56) References Cited

U.S. PATENT DOCUMENTS

| | | | |
|---|---|---|---|
| 2003/0207480 A1* | 11/2003 | Kobayashi et al. | 438/22 |
| 2003/0222270 A1 | 12/2003 | Uemura | |
| 2004/0256632 A1 | 12/2004 | Stein et al. | |
| 2007/0117235 A1 | 5/2007 | Stein et al. | |
| 2010/0047943 A1* | 2/2010 | Lee et al. | 438/28 |

FOREIGN PATENT DOCUMENTS

| | | |
|---|---|---|
| JP | 4-111422 A | 4/1992 |
| JP | 2803742 B2 | 11/1994 |
| JP | 10-107318 A | 4/1998 |
| JP | 11-340506 A | 12/1999 |
| JP | 2004-006498 A | 1/2004 |
| JP | 2004-260178 A | 9/2004 |
| JP | 2005-045038 A | 2/2005 |
| JP | 2005-209733 A | 8/2005 |
| JP | 2006-066903 A | 3/2006 |
| JP | 2006-324511 A | 11/2006 |
| JP | 2007-194401 A | 8/2007 |
| JP | 2008-041866 A | 2/2008 |
| TW | 1243488 B | 11/2005 |
| TW | 200618353 A | 6/2006 |
| TW | 1275190 B | 3/2007 |

OTHER PUBLICATIONS

Japanese Office Action, dated Nov. 6, 2012, issued in corresponding Japanese Application No. 2008-228133.

Taiwanese Office Action, dated Nov. 27, 2012, issued in corresponding Taiwanese Application No. 098120108.

Japanese Office Action ("Notice of Reasons for Rejection") issued Aug. 6, 2013 for corresponding Japanese Patent Application No. JP 2009-133177.

* cited by examiner

SEMICONDUCTOR LIGHT-EMITTING ELEMENT, ELECTRODE AND MANUFACTURING METHOD FOR THE ELEMENT, AND LAMP

BACKGROUND OF THE INVENTION

1. Field of the Invention

The present invention relates to a semiconductor light-emitting element, an electrode and a manufacturing method for the element, and a lamp, and more particularly to a semiconductor light-emitting element having an electrode with improved junction and anticorrosion properties, an electrode and a manufacturing method for the element, and a lamp.

Priority is claimed on Japanese Patent Application No. 2008-157248, filed in the Japan Patent Office on Jun. 16, 2008, Japanese Patent Application No. 2008-199802, filed in Japan Patent Office on Aug. 1, 2008, Japanese Patent Application No. 2008-228133, filed in the Japan Patent Office on Sep. 5, 2008, and Japanese Patent Application No. 2009-133177, filed in the Japan Patent Office on Jun. 2, 2009, the contents of which are incorporated herein by reference.

2. Description of Related Art

Recently, as a semiconductor material for a short-wavelength light-emitting element, a GaN-based compound semiconductor has received attention. A GaN-based compound semiconductor is formed on a substrate of various oxides or group III-V compounds including sapphire monocrystals by a thin film-forming means such as a metalorganic chemical vapor deposition (MOCVD) method or a molecular beam epitaxy (MBE) method.

A thin film made of a GaN-based compound semiconductor has the characteristic of small current diffusion in an in-plane direction of the thin film. Further, a p-type GaN-based compound semiconductor has the characteristic of a high resistivity in comparison to an n-type GaN-based compound semiconductor. Due to this, in the case where only a p-type electrode made of metal is laminated on the surface of the p-type semiconductor layer, there is almost no spread of current in the in-plane direction of the p-type semiconductor layer.

In a semiconductor light-emitting element using the GaN-based compound semiconductor as described above, if a laminated semiconductor layer having an LED structure composed of an n-type semiconductor layer, a light-emitting layer, and a p-type semiconductor layer is formed, and a p-type electrode is formed on the p-type semiconductor layer of an uppermost portion, only a portion of the light-emitting layer that is positioned just below the p-type electrode emits light. Accordingly, in order to extract the emitted light, which occurs just below the p-type electrode, out of the semiconductor light-emitting element, it is necessary to make the p-type electrode transmit the emitted light and extract the light by making a p-type electrode having transparency.

As a method of making a p-type electrode having transparency, a method is known that uses a conductive metal oxide such as ITO having transparency or a metal thin film of about several tens of nanometers. For example, PATENT DOCUMENT 1 discloses a method that uses a metal thin film of about several tens of nanometers, and proposes to simultaneously perform acceleration of low resistance of the p-type semiconductor layer and formation of the p-type electrode having transparency and ohmicity by laminating Ni and Au of about several tens of nanometers on the p-type semiconductor layer as the p-type electrode and then performing an alloying treatment through heating under an oxygen atmosphere.

However, the transparent electrode composed of metal oxide such as ITO or the ohmic electrode composed of a metal thin film of about several tens of nanometers has as low a strength as the electrode itself, and thus it is difficult to use the electrode itself as a bonding pad electrode.

In order to improve the strength of the electrode itself, a bonding pad electrode has been used, in which a pad electrode for bonding with a specified thickness is arranged on a p-type electrode, such as a transparent electrode made of metal oxide such as ITO, an ohmic electrode made of a metal thin film of about several tens of nanometers.

However, since this bonding pad electrode is a metal material having a specified thickness, it has no transparency and shields the emitted light that has transmitted the p-type electrode having transparency. As a result, there is a problem that it may not be possible to extract a portion of the emitted light out of the light-emitting element.

In order to solve this problem, for example, PATENT DOCUMENT 2 discloses a method of laminating a bonding pad electrode made of a reflection film, such as Ag, Al, on a p-type electrode. Accordingly, it is possible that the emitted light that has transmitted the p-type electrode is reflected to the inside of the light-emitting element by the bonding pad electrode and the reflected light is extracted from a portion other than a bonding pad electrode forming area to the outside of the light-emitting element.

However, if it is intended to bond a bonding wire or the like with the bonding pad electrode in the case where the metal oxide such as ITO is used as the p-type electrode and the reflection film such as Ag, Al, is used as the bonding pad electrode, the bonding pad electrode is unable to resist the tensile stress during bonding of the bonding wire, and thus the pad electrode may be peeled off.

Also, as the bonding pad electrode is peeled off from the transparent electrode, the yield in manufacturing a lamp that uses such electrodes may deteriorate.

Also, in the semiconductor light-emitting element in the related art, the anticorrosion property is insufficient, and thus there is a demand for improvement of the anticorrosion property.

CITATION LIST

Patent Literature

PATENT DOCUMENT 1 Japanese Patent No. 2803742
PATENT DOCUMENT 2 Japanese Unexamined Patent Application Publication No. 2006-66903

SUMMARY OF THE INVENTION

The present invention has been made in view of the above-described problems, and an object of the invention is to provide a semiconductor light-emitting element having an electrode that is superior in junction and anticorrosion properties, a manufacturing method for the element, and a lamp that can be manufactured using the element with superior anticorrosion and good yield.

In order to achieve the above object, the present invention adopts the following configuration. That is:

(1) A semiconductor light-emitting element including a substrate, a laminated semiconductor layer including a light-emitting layer formed on the substrate, one electrode formed on an upper surface of the laminated semiconductor layer, and the other electrode formed on an exposed surface of the semiconductor layer, from which the laminated semiconductor layer is partially cut off; wherein at least one of the one electrode and the other electrode includes a junction layer and a bonding pad electrode formed to cover the junction layer, the bonding pad electrode has a maximum thickness that is larger than the maximum thickness of the junction layer, and includes one or two or more layers, and slopes, which are made gradually thinner toward the outer circumference, are formed in outer circumference portions of the junction layer and the bonding pad electrode.

(2) The semiconductor light-emitting element as described in (1), wherein the junction layer is made of at least one kind of element selected from the group consisting of Al, Ti, V, Cr, Mn, Co, Zn, Ge, Zr, Nb, Mo, Ru, Hf, Ta, W, Re, Rh, Ir, and Ni, and is a thin film of which the maximum thickness is equal to or more than 10 Å and equal to or less than 1000 Å.

(3) The semiconductor light-emitting element as described in (1) or (2), wherein the bonding pad electrode is composed of a bonding layer made of Au, Al, or an alloy including any one of these metals, and the bonding layer is a thin film of which the maximum thickness is equal to or more than 50 nm and equal to or less than 2000 nm.

(4) The semiconductor light-emitting element as described in any one of (1) to (3), wherein the bonding pad electrode includes a metal reflection layer formed to cover the junction layer and a bonding layer formed to cover the metal reflection layer, and the metal reflection layer is made of any one of Ag, Al, Ru, Rh, Pd, Os, Ir, Pt, and Ti or an alloy including any one of these metals, and is a thin film of which the maximum thickness is equal to or more than 20 nm and equal to or less than 3000 nm.

(5) The semiconductor light-emitting element as described in any one of (1) to (4), wherein a transparent electrode is formed between the one electrode and the upper surface of the laminated semiconductor layer or between the other electrode and the exposed surface of the semiconductor layer, and the transparent electrode is made of a transparent conductive material selected from the group consisting of any one kind of a conductive oxide including any one kind of In, Zn, Al, Ga, Ti, Bi, Mg, W, Ce, Sn, and Ni, zinc sulfide, and chromium sulfide.

(6) The semiconductor light-emitting element as described in any one of (1) to (5), wherein the laminated semiconductor layer is formed by laminating in order an n-type semiconductor layer, the light-emitting layer, and a p-type semiconductor layer from the substrate, and the light-emitting layer has a multiple quantum well structure.

(7) The semiconductor light-emitting element as described in any one of (1) to (6), wherein the laminated semiconductor layer includes gallium nitride-based semiconductor as the main body.

(8) A lamp including a semiconductor light-emitting element as described in any one of (1) to (7), a first frame on which the semiconductor light-emitting element is arranged and which is wire-bonded with one electrode of the semiconductor light-emitting element, a second frame which is wire-bonded with the other electrode of the semiconductor light-emitting element, and a mold formed around the semiconductor light-emitting element.

(9) An electrode for a semiconductor light-emitting element including a substrate, a laminated semiconductor layer including a light-emitting layer formed on the substrate, one electrode formed on an upper surface of the laminated semiconductor layer, and the other electrode formed on an exposed surface of the semiconductor layer, from which the laminated semiconductor layer is partially cut off; wherein at least one of the one electrode and the other electrode includes a junction layer and a bonding pad electrode formed to cover the junction layer, the bonding pad electrode has a maximum thickness that is larger than the maximum thickness of the junction layer, and includes one or two or more layers, and slopes, which are made gradually thinner toward the outer circumference, are formed in outer circumference portions of the junction layer and the bonding pad electrode.

(10) The electrode for a semiconductor light-emitting element as described in (9), wherein the junction layer is made of at least one kind of element selected from the group consisting of Al, Ti, V, Cr, Mn, Co, Zn, Ge, Zr, Nb, Mo, Ru, Hf, Ta, W, Re, Rh, Ir, and Ni, and is a thin film of which the maximum thickness is equal to or more than 10 Å and equal to or less than 1000 Å.

(11) The electrode for a semiconductor light-emitting element as described in (9) or (10), wherein the bonding pad electrode is composed of a bonding layer made of Au, Al, or an alloy including any one of these metals, and the bonding layer is a thin film of which the maximum thickness is equal to or more than 50 nm and equal to or less than 2000 nm.

(12) The electrode for a semiconductor light-emitting element as described in any one of (9) to (11), wherein the bonding pad electrode includes a metal reflection layer formed to cover the junction layer, and a bonding layer formed to cover the metal reflection layer, and the metal reflection layer is made of any one of Ag, Al, Ru, Rh, Pd, Os, Ir, Pt, and Ti or an alloy including any one of these metals, and is a thin film of which the maximum thickness is equal to or more than 20 nm and equal to or less than 3000 nm.

(13) The electrode for a semiconductor light-emitting element as described in any one of (9) to (12), wherein a transparent electrode is formed between the one electrode and the upper surface of the laminated semiconductor layer or between the other electrode and the exposed surface of the semiconductor layer, and the transparent electrode is made of a transparent conductive material selected from the group consisting of any one kind of a conductive oxide including any one kind of In, Zn, Al, Ga, Ti, Bi, Mg, W, Ce, Sn, and Ni, zinc sulfide, and chromium sulfide.

(14) A method of manufacturing a semiconductor light-emitting element including the steps of forming a laminated semiconductor layer including a light-emitting layer on a substrate, forming an exposed surface of the semiconductor layer by partially cutting off the laminated semiconductor layer, and forming one electrode and the other electrode on an upper surface of the laminated semiconductor layer and the exposed surface of the semiconductor layer, respectively; wherein the step of forming the electrodes includes the steps of forming a junction layer on the upper surface of the laminated semiconductor layer or the exposed surface of the semiconductor layer after forming a reverse-tapered mask on at least one of the upper surface of the laminated semiconductor layer and the exposed surface of the semiconductor layer, and forming the one electrode or the other electrode by forming a bonding pad electrode, which has a maximum thickness that is larger than the maximum thickness of the junction layer, to cover the junction layer.

(15) The method of manufacturing a semiconductor light-emitting element as described in (14), further including the step of forming a transparent electrode on the upper surface of the laminated semiconductor layer or the exposed surface of the semiconductor layer before the step of forming the electrode.

(16) The method of manufacturing a semiconductor light-emitting element as described in (14) or (15), wherein the step of forming the electrode includes the steps of forming a metal reflection layer, which has a maximum thickness that is larger than the maximum thickness of the junction layer, to cover the junction layer after forming the reverse-tapered mask and the junction layer, and forming the one electrode or the other electrode by forming a bonding layer, which has a maximum thickness that is larger than the maximum thickness of the metal reflection layer, to cover the metal reflection layer.

(17) The method of manufacturing a semiconductor light-emitting element as described in any one of (14) to (16), wherein the forming of the junction layer, the metal reflection layer, and the bonding layer in the step of forming the electrode is performed by a sputtering method.

(18) The method of manufacturing a semiconductor light-emitting element as described in any one of (14) to (17), further including the step of forming a protection film on the upper surface of the transparent electrode and the upper surface of the laminated semiconductor layer or the exposed surface of the semiconductor layer before the step of forming the mask.

(19) A semiconductor light-emitting element including a substrate, a laminated semiconductor layer including a light-emitting layer formed on the substrate, one electrode formed on an upper surface of the laminated semiconductor layer, and the other electrode formed on an exposed surface of the semiconductor layer, from which the laminated semiconductor layer is partially cut off; wherein at least one of the one electrode and the other electrode includes a transparent electrode having a junction recess portion formed on its upper surface, a junction layer formed to cover the junction recess portion, and a bonding pad electrode formed to cover the junction layer and having slopes which are made gradually thinner toward the outside and which are formed in an outer circumference portion of the bonding pad electrode.

(20) The semiconductor light-emitting element as described in (19), wherein the junction layer is made of at least one kind of element selected from the group consisting of Al, Ti, V, Cr, Mn, Co, Zn, Ge, Zr, Nb, Mo, Ru, Hf, Ta, W, Re, Rh, Ir, and Ni, and is a thin film of which the maximum thickness is equal to or more than 10 Å and equal to or less than 400 Å.

(21) The semiconductor light-emitting element as described in (19) or (20), wherein the bonding pad electrode includes a bonding layer made of Au, Al, or an alloy including any one of these metals.

(22) The semiconductor light-emitting element as described in (21), wherein the bonding pad electrode includes a metal reflection layer formed to cover the junction layer and a bonding layer formed to cover the metal reflection layer, and the metal reflection layer is made of any one of Ag, Al, Ru, Rh, Pd, Os, Ir, Pt, and Ti or an alloy including any one of these metals.

(23) The semiconductor light-emitting element as described in any one of (19) to (22), wherein the transparent electrode is made of a transparent conductive material selected from the group consisting of any one kind of a conductive oxide including any one kind of In, Zn, Al, Ga, Ti, Bi, Mg, W, Ce, Sn, and Ni, zinc sulfide, and chromium sulfide.

(24) The semiconductor light-emitting element as described in any one of (19) to (23), further including an edge portion protection film formed to cover an outer edge portion of the bonding pad electrode and to partially expose the bonding pad electrode.

(25) The semiconductor light-emitting element as described in any one of (19) to (24), further including a transparent protection filmtransparent protective film formed to cover an area where the junction recess portion is not formed on the upper surface of the transparent electrode, wherein the outer edge portion of the junction layer and the outer edge portion of the bonding pad electrode are arranged on the transparent protection filmtransparent protective film.

(26) The semiconductor light-emitting element as described in any one of (19) to (25), wherein the laminated semiconductor layer is formed by laminating in order an n-type semiconductor layer, a light-emitting layer, and a p-type semiconductor layer from the substrate, and the light-emitting layer has a multiple quantum well structure.

(27) The semiconductor light-emitting element as described in any one of (19) to (26), wherein the laminated semiconductor layer is composed of gallium nitride-based semiconductor as the main body.

(28) A lamp including a semiconductor light-emitting element as described in any one of (19) to (27), a first frame on which the semiconductor light-emitting element is arranged and which is wire-bonded with one electrode of the semiconductor light-emitting element, a second frame which is wire-bonded with the other electrode of the semiconductor light-emitting element, and a mold formed around the semiconductor light-emitting element.

(29) A method of manufacturing a semiconductor light-emitting element including a substrate, a laminated semiconductor layer including a light-emitting layer formed on the substrate, one electrode formed on an upper surface of the laminated semiconductor layer, and the other electrode formed on an exposed surface of the semiconductor layer, from which the laminated semiconductor layer is partially cut off; wherein the step of manufacturing at least one of the one electrode and the other electrode includes the steps of forming a transparent electrode; forming a mask including an opening having an inner wall shape, of which the cross-sectional area is gradually widened toward a bottom surface, on an upper surface of the transparent electrode; forming a junction recess portion by etching the upper surface of the transparent electrode that is exposed from the opening; forming a junction layer to cover the junction recess portion; forming a bonding pad electrode formed to cover the junction layer and having slopes, which are made gradually thinner toward the outside and which are formed in an outer circumference portion of the bonding pad electrode, by forming the shape of the outer circumference portion along the inner wall shape of the opening; and removing the mask.

(30) An electronic appliance incorporated with the lamp described in (28).

(31) A mechanical device incorporated with the electronic appliance described in (30).

(32) A semiconductor light-emitting element including a substrate, a laminated semiconductor layer including a light-emitting layer formed on the substrate, one electrode formed on an upper surface of the laminated semiconductor layer, and the other electrode formed on an exposed surface of the semiconductor layer, from which the laminated semiconductor layer is partially cut off; wherein any one or both of the one electrode and the other electrode include an ohmic junction layer formed on the upper surface of the laminated semiconductor layer or the exposed surface of the semiconductor layer, a junction layer formed on the ohmic junction layer, and a bonding pad electrode formed to cover the junction layer.

(33) The semiconductor light-emitting element as described in (32), wherein the junction layer is made of at least one kind of element selected from the group consisting of Al, Ti, V, Cr, Mn, Co, Zn, Ge, Zr, Nb, Mo, Ru, Hf, Ta, W, Re, Rh, Ir, and Ni.

(34) The semiconductor light-emitting element as described in (32) or (33), wherein the bonding pad electrode includes a bonding layer made of Au, Al, or an alloy including any one of these metals.

(35) The semiconductor light-emitting element as described in (34), wherein the bonding pad electrode includes a metal reflection layer formed to cover the junction layer and a bonding layer formed to cover the metal reflection layer, and the metal reflection layer is made of any one of Ag, Al, Ru, Rh, Pd, Os, Ir, Pt, and Ti or an alloy including any one of these metals.

(36) The semiconductor light-emitting element as described in any one of (32) to (35), wherein the ohmic junction layer is made of a transparent conductive material selected from the group consisting of any one kind of a conductive oxide including any one kind of In, Zn, Al, Ga, Ti, Bi, Mg, W, Ce, Sn, and Ni, zinc sulfide, and chromium sulfide.

(37) The semiconductor light-emitting element as described in any one of (32) to (36), wherein the laminated semiconductor layer is composed of gallium nitride-based semiconductor as the main body.

(38) The semiconductor light-emitting element as described in any one of (32) to (37), wherein the laminated semiconductor layer is formed by laminating in order an n-type semiconductor layer, a light-emitting layer, and a p-type semiconductor layer from the substrate, and the light-emitting layer has a multiple quantum well structure.

(39) A lamp including a semiconductor light-emitting element as described in any one of (32) to (38), a first frame on which the semiconductor light-emitting element is arranged and which is wire-bonded with one electrode of the semiconductor light-emitting element, a second frame which is wire-bonded with the other electrode of the semiconductor light-emitting element, and a mold formed around the semiconductor light-emitting element.

(40) A method of manufacturing a semiconductor light-emitting element including the steps of forming a laminated semiconductor layer including a light-emitting layer on a substrate, forming one electrode on an upper surface of the laminated semiconductor layer, and forming an exposed surface of the semiconductor layer by partially cutting off the laminated semiconductor layer and forming the other electrode on the exposed surface of the semiconductor layer; wherein both the step of forming the one electrode and the step of forming the other electrode include a pad forming step of forming an ohmic junction layer on the upper surface of the laminated semiconductor layer or the exposed surface of the semiconductor layer, forming a junction layer on the ohmic junction layer, and forming a bonding pad electrode to cover the junction layer; and a heat-treatment step of performing a heat-treatment to improve the adhesion of the ohmic junction layer and the junction layer at a temperature of 80° C. to 700° C.

(41) The method of manufacturing a semiconductor light-emitting element as described in (40), wherein the pad forming step and the heat-treatment step are simultaneously performed in the step of forming the one electrode and in the step of forming the other electrode.

(42) An electronic appliance incorporated with the lamp described in (39).

(43) A mechanical device incorporated with the electronic appliance described in (42).

Advantageous Effects of Invention

According to the above-described configuration of the present invention, a semiconductor light-emitting element having an electrode with improved junction and anticorrosion properties, a manufacturing method therefor, and a lamp can be provided.

According to a semiconductor light-emitting element according to the present invention, one electrode is composed of a junction layer and a bonding pad electrode formed to cover the junction layer, the bonding pad electrode has a maximum thickness that is larger than the maximum thickness of the junction layer and is composed of one or two or more layers, and slopes, which are made gradually thinner toward the outer circumference, are formed in outer circumference portions of the junction layer and the bonding pad electrode. Accordingly, penetration of external air or moisture into the junction layer can be prevented, and thus the anticorrosion property of the junction layer can be improved to lengthen the life span of the semiconductor light-emitting element.

According to the semiconductor light-emitting element according to the present invention, the junction layer is made of at least one kind of element selected from the group consisting of Al, Ti, V, Cr, Mn, Co, Zn, Ge, Zr, Nb, Mo, Ru, Hf, Ta, W, Re, Rh, Ir, and Ni, and is a thin film of which the maximum thickness is equal to or more than 10 Å and equal to or less than 1000 Å. Accordingly, the junction between the transparent electrode and the bonding pad electrode is improved, and thus the electrode is prevented from being peeled off due to the tensile stress occurring during the bonding of the bonding wire.

According to the semiconductor light-emitting element according to the present invention, the bonding pad electrode is composed of a bonding layer made of Au, Al, or an alloy including any one of these metals, and the bonding layer is a thin film of which the maximum thickness is equal to or more than 50 nm and equal to or less than 2000 nm. Accordingly, the junction of the wire bonding to the bonding pad electrode is improved, and thus the electrode is prevented from being peeled off due to the tensile stress occurring during the bonding of the bonding wire.

According to the semiconductor light-emitting element according to the present invention, the bonding pad electrode is composed of a metal reflection layer formed to cover the junction layer and a bonding layer formed to cover the metal reflection layer, and the metal reflection layer 117 is made of any one of Ag, Al, Ru, Rh, Pd, Os, Ir, Pt, and Ti or an alloy including any one of these metals, and is a thin film of which the maximum thickness is equal to or more than 20 nm and equal to or less than 3000 nm. Accordingly, the junction and anticorrosion properties of the electrode are improved, and thus the light-emitting characteristics of the semiconductor light-emitting element can be improved.

According to an electrode for a semiconductor light-emitting element according to the present invention, at least one of the one electrode and the other electrode is composed of a junction layer and a bonding pad electrode formed to cover the junction layer, the bonding pad electrode has a maximum thickness that is larger than the maximum thickness of the junction layer and is composed of one or two or more layers, and slopes, which are made gradually thinner toward the outer circumference, are formed in outer circumference portions of the junction layer and the bonding pad electrode. Accordingly, the electrode has improved junction and anticorrosion properties. The electrode for a semiconductor light-emitting element according to the present invention can also be used for the intended purpose in addition to the light-emitting element.

According to a method of manufacturing a semiconductor light-emitting element according to the present invention, the step of forming the electrodes includes the steps of forming a junction layer on the upper surface of the laminated semiconductor layer after forming a reverse-tapered mask on the upper surface of the laminated semiconductor layer, and forming the one electrode by forming a bonding pad electrode, which has a maximum thickness that is larger than the maximum thickness of the junction layer, to cover the junction layer. Thus, slopes, which are made gradually thinner toward the outer circumference, can be formed in outer circumference portions of the junction layer and the bonding pad electrode. Accordingly, penetration of external air or moisture into the junction layer can be prevented, and thus anticorrosion of the junction layer can be improved to lengthen the life span of the semiconductor light-emitting element.

According to a semiconductor light-emitting element according to the present invention, at least one of the one electrode and the other electrode includes a transparent electrode having a junction recess portion formed on its upper surface, a junction layer formed to cover the junction recess portion, and a bonding pad electrode formed to cover the junction layer and having slopes which are made gradually thinner toward the outside and which are formed in an outer circumference portion of the bonding pad electrode. Thus, the junction layer is formed to be incorporated with the junction recess portion of the transparent electrode to achieve high junction strength between the transparent electrode and the junction layer, and the bonding pad electrode is formed to cover the junction layer to achieve high junction strength between the bonding pad electrode and the junction layer. Accordingly, sufficiently high junction strength is obtained between the transparent electrode and the bonding pad electrode, and thus the electrode has a superior junction property.

Further, according to the semiconductor light-emitting element according to the present invention, since the bonding pad electrode having slopes, which are made gradually thinner toward the outside, formed on the outer circumference portion is formed to cover the junction layer, a sufficient contact area is secured between the outer circumference portion of the bonding pad electrode and the lower surface of the outer circumference portion of the bonding pad electrode, and a superior junction property is obtained. Also, penetration of external air or moisture into the junction layer through a gap between the outer circumference portion of the bonding pad electrode and the lower surface thereof can be effectively prevented, and thus superior anticorrosion property of the junction layer can be obtained.

Also, since a lamp according to the present invention is provided with a semiconductor light-emitting element according to the present invention which includes electrodes having superior junction and anticorrosion properties, it can be manufactured with good yield, and has superior anticorrosion property.

Also, according to a method of manufacturing a semiconductor light-emitting element according to the present invention, the step of manufacturing at least one of the one electrode and the other electrode includes the steps of forming a transparent electrode; forming a mask including an opening having an inner wall shape, of which the cross-sectional area is gradually widened toward a bottom surface, on an upper surface of the transparent electrode; forming a junction recess portion by etching the upper surface of the transparent electrode that is exposed from the opening; forming a junction layer to cover the junction recess portion; forming a bonding pad electrode formed to cover the junction layer and having slopes, which are made gradually thinner toward the outside and which are formed in an outer circumference portion of the bonding pad electrode, by forming the shape of the outer circumference portion along the inner wall shape of the opening; and removing the mask. Accordingly, the semiconductor light-emitting element according to the present invention which includes electrodes having superior junction and anti-corrosion properties can be easily manufactured.

According to a semiconductor light-emitting element according to the present invention, any one or both of the one electrode and the other electrode include an ohmic junction layer formed on the upper surface of the laminated semiconductor layer or the exposed surface of the semiconductor layer, a junction layer formed on the ohmic junction layer, and a bonding pad electrode formed to cover the junction layer. Accordingly, in any one or both of the one electrode and the other electrode, the ohmic junction layer and the bonding pad electrode have sufficiently high junction strength through the junction layer formed on the ohmic junction layer and the bonding pad electrode formed to cover the junction layer, and thus the electrode having a superior junction property can be provided.

Also, since a lamp according to the present invention is provided with a semiconductor light-emitting element having one electrode and the other electrode having a superior junction property according to the present invention, the bonding pad electrode is prevented from peeling off from the transparent electrode due to the tensile stress occurring during the bonding of the bonding wire to the bonding pad electrode, and thus the lamp can be manufactured with good yield.

Also, according to a method of manufacturing a semiconductor light-emitting element according to the present invention, both the step of forming the one electrode and the step of forming the other electrode include a pad forming step of forming an ohmic junction layer on the upper surface of the laminated semiconductor layer or the exposed surface of the semiconductor layer, forming a junction layer on the ohmic junction layer, and forming a bonding pad electrode to cover the junction layer; and a heat-treatment step of performing a heat-treatment to improve the adhesion of the ohmic junction layer and the junction layer at a temperature of 80° C. to 700° C., and thus the semiconductor light-emitting element having superior adhesion between the ohmic junction layer and the junction layer is obtained.

Further, according to the method of manufacturing a semiconductor light-emitting element according to the present invention, in the case of simultaneously performing the pad forming step and the heat-treatment step in the step of manufacturing the one electrode and the step of manufacturing the other electrode, the one electrode and the other electrode are simultaneously formed, and thus the one electrode and the other electrode can be efficiently and easily manufactured in comparison to the case where the one electrode and the other electrode are separately formed.

BRIEF DESCRIPTION OF THE DRAWINGS

FIG. 29(a) is a schematic enlarged cross-sectional view of a p-type electrode, and FIG. 29(b) is a schematic enlarged cross-sectional view of an n-type electrode.

DETAILED DESCRIPTION OF THE INVENTION

Figure 1:
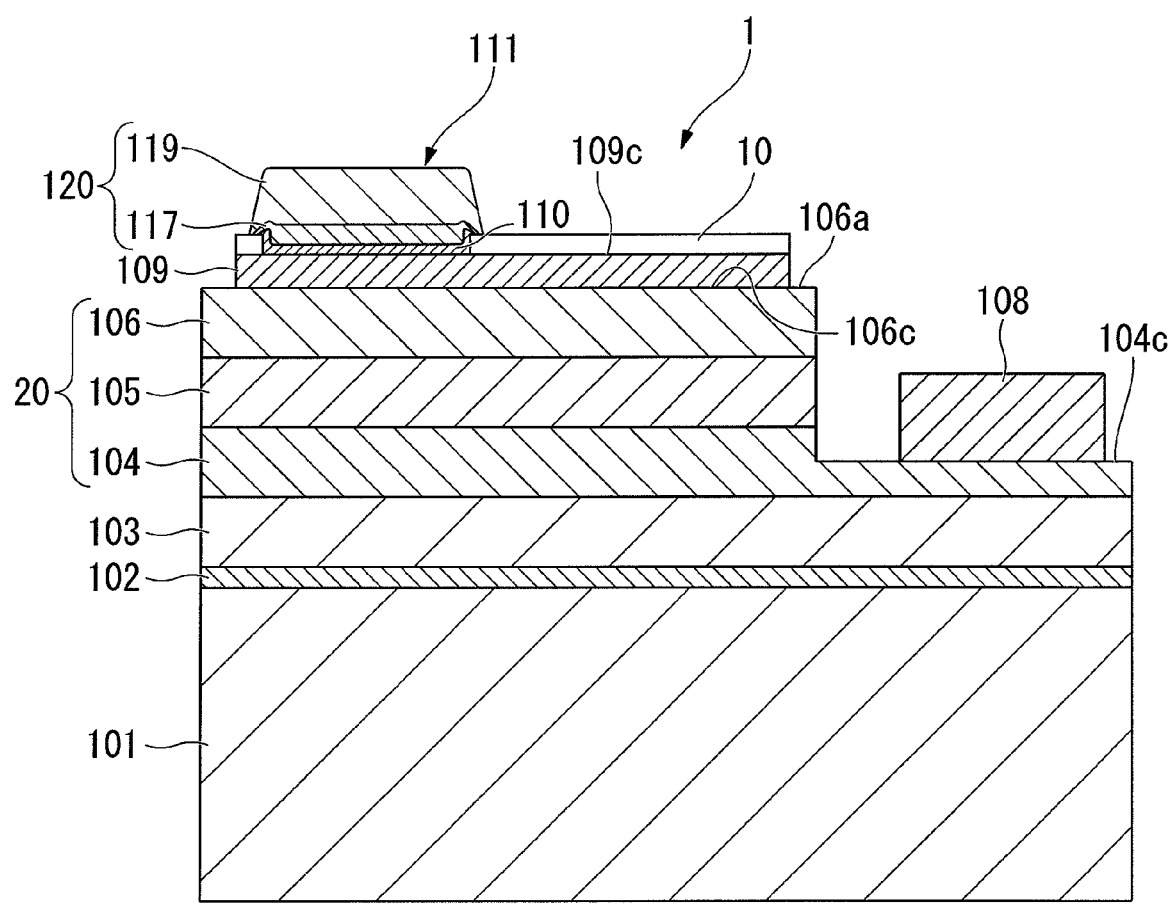
FIG. 1 is a schematic cross-sectional view illustrating an example of a semiconductor light-emitting element according to the present invention.

Hereinafter, embodiments of the present invention will be described in detail using the accompanying drawings. In the following description of the present invention, the size, thickness, and dimensions of each portion as illustrated in the drawings referred to may be different from the actual relationship of the measurements of the semiconductor light-emitting element and the like.

Embodiment 1

Figure 2:
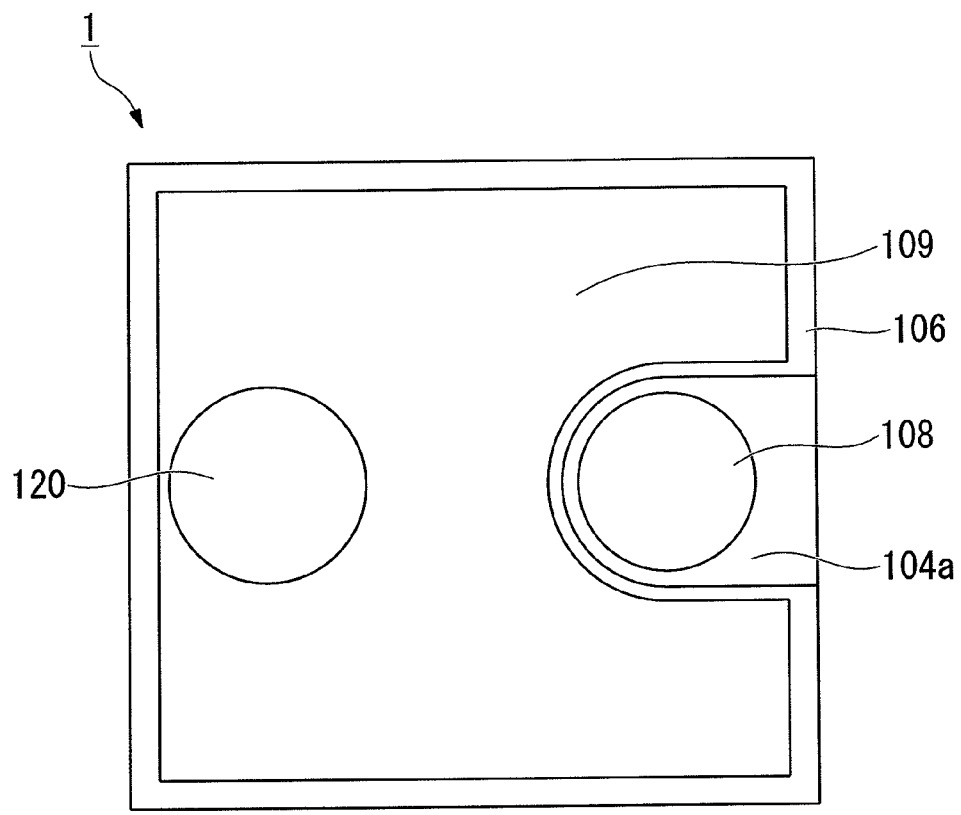
FIG. 2 is a schematic plan view illustrating an example of a semiconductor light-emitting element according to the present invention.
Figure 3:
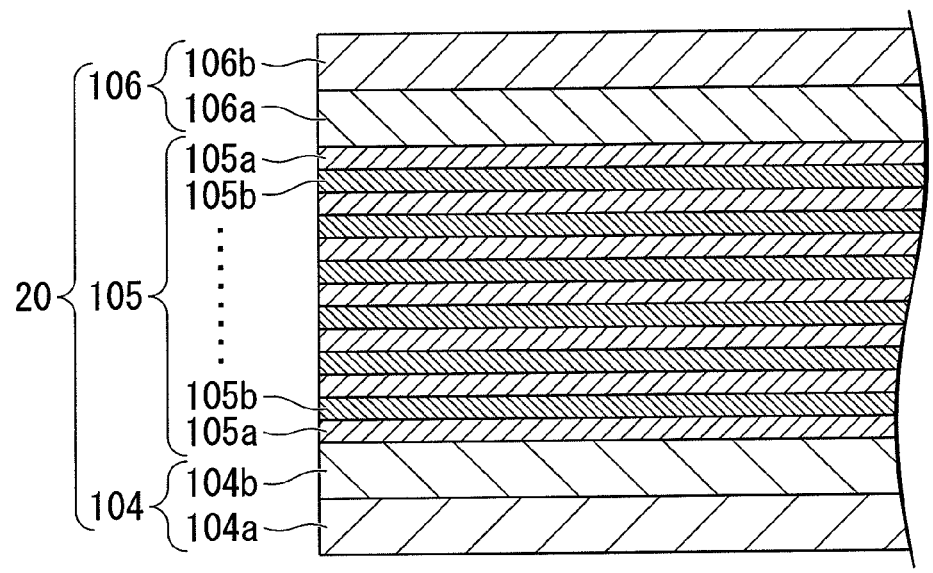
FIG. 3 is a schematic cross-sectional view illustrating an example of a laminated semiconductor layer of a semiconductor light-emitting element according to the present invention.
Figure 4:
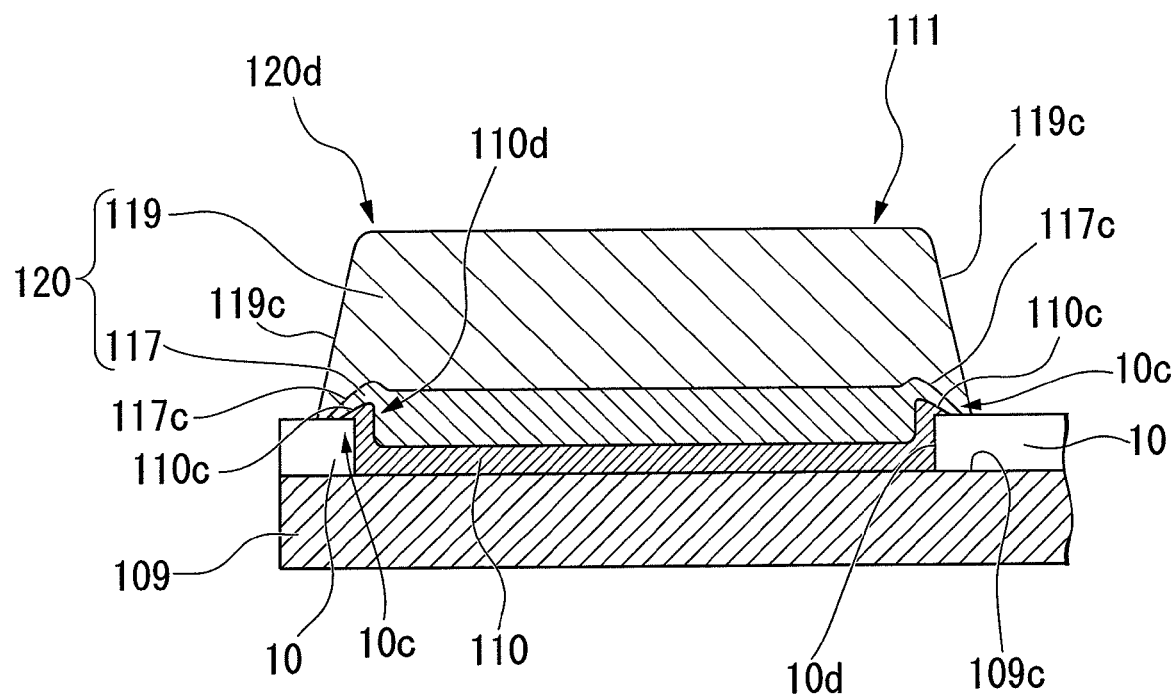
FIG. 4 is an example of an enlarged cross-sectional view of a p-type electrode of a semiconductor light-emitting element according to the present invention.

FIGS. 1 to 4 are views illustrating an example of a semiconductor light-emitting element according to an embodiment of the present invention. FIG. 1 is a schematic cross-sectional view illustrating an example of a semiconductor light-emitting element according to an embodiment of the present invention, and FIG. 2 is a schematic plan view illustrating an example of a semiconductor light-emitting element according to an embodiment of the present invention. FIG. 3 is a schematic cross-sectional view illustrating an example of a laminated semiconductor layer of a semiconductor light-emitting element according to an embodiment of the present invention, and FIG. 4 is an example of an enlarged cross-sectional view of a p-type electrode of a semiconductor light-emitting element according to an embodiment of the present invention.

(Semiconductor Light-Emitting Element)

As illustrated in FIG. 1, a semiconductor light-emitting element 1 according to an embodiment of the present invention is briefly configured in such a manner that a laminated semiconductor layer 20, which includes a buffer layer 102, an under-layer 103, and a light-emitting layer 105, is laminated in order on a substrate 101, a transparent electrode 109 is laminated on an upper surface 106c of the laminated semiconductor layer 20, one electrode 111 (which is one conduction type) is formed on a portion of an upper surface 109c of the transparent electrode 109, and the other electrode 108 (which is the other conduction type) is formed on an exposed surface 104c of the semiconductor layer, from which the laminated semiconductor layer 20 is partially cut off.

The laminated semiconductor layer 20 is formed by laminating in order an n-type semiconductor layer 104, the light-emitting layer 105, and a p-type semiconductor layer 106 on the substrate 101. A portion on which the electrode 111 of the one conduction type is not formed in the upper surface 109c of the transparent electrode 109 is covered by a protection film 10. Also, the electrode 111 of the one conduction type is formed by laminating a junction layer 110 and a bonding pad electrode 120 that is composed of a metal reflection layer 117 and a bonding layer 119.

Hereinafter, the explanation will be given on the assumption that the one electrode 111 is a p-type electrode and the other electrode 108 is an n-type electrode.

The semiconductor light-emitting element 1 according to an embodiment of the present invention is a face up mount type light-emitting element which is configured to obtain light emitted from the light-emitting layer 105 by applying a voltage between the p-type electrode (the electrode of the one conduction type) 111 and the n-type electrode (the electrode of the other conduction type) 108 to make a current pass therethrough, and to extract the light from the light-emitting layer 105 from the side on which the bonding pad electrode (reflective bonding pad electrode) 120 having a function of reflecting the light from the light-emitting layer 105 is formed.

A portion of the light emitted from the light-emitting layer 105 transmits the transparent electrode 109 and the junction layer 110, is reflected by the bonding pad electrode 120 on the interface between the junction layer 110 and the bonding pad electrode 120, and then is introduced again into the inside of the laminated semiconductor layer 20. The light having been introduced again into the laminated semiconductor layer 20 further repeats the transmission and reflection, and then is extracted from a portion rather than an area where the bonding pad electrode 120 is formed to the outside of the semiconductor light-emitting element 1.

<Substrate>

The substrate 101 of the semiconductor light-emitting element 1 according to an embodiment of the present invention may be selected and used from various kinds of substrates, without being specially limited, if the substrate 101 is a substrate on which a group III nitride semiconductor crystal is epitaxially grown onto the surface. For example, a substrate may be used, which is made of sapphire, SiC, silicon, zinc oxide, magnesium oxide, manganese oxide, zirconium oxide, manganese zinc iron oxide, magnesium aluminum oxide, zirconium boride, gallium oxide, indium oxide, lithium gallium oxide, lithium aluminum oxide, neodymium gallium oxide, lanthanum strontium aluminum tantalum oxide, strontium titanium oxide, titanium oxide, hafnium, tungsten, molybdenum, and the like.

Also, particularly, it is preferable to use a sapphire substrate having a c-surface as its main surface among the above-described substrates. In the case of using the sapphire substrate, a buffer layer 102 is formed on the c-surface of the sapphire.

Among the above-described substrates, an oxide substrate or a metal substrate, which is known as a substrate which is chemically modified through contact with ammonia at high temperature, may be used, or the buffer layer 102 may be formed without using ammonia. Also, in the method using ammonia, the under-layer 103 is formed to form an n-type semiconductor layer 104 to be described later, and in this case, the buffer layer 102 also acts as a coat layer, and thus these methods are effective for preventing the chemical modification of the substrate 101.

Also, in the case of forming the buffer layer 102 by a sputtering method, it is possible to suppress the temperature of the substrate 101 at low temperature, and thus even in the case of using the substrate 101 made of a material having a property that is decomposed at high temperature, the respective layers can be formed on the substrate without damaging the substrate 101.

<Laminated Semiconductor Layer>

The laminated semiconductor layer 20 of the semiconductor light-emitting element 1 according to an embodiment of the present invention is, for example, a layer made of a group III nitride semiconductor, and as illustrated in FIG. 1, the n-type semiconductor layer 104, the light-emitting layer 105, and the p-type semiconductor layer 106 are laminated on the substrate 101 in order.

Also, as illustrated in FIG. 3, each layer of the n-type semiconductor layer 104, the light-emitting layer 105, and the p-type semiconductor layer 106 may be formed as a plurality of semiconductor layers. Also, the laminated semiconductor layer 20 may further include the under-layer 103 and the buffer layer 102.

At this time, although the laminated semiconductor layer 20 may be formed by a MOCVD method to have good crystallinity, the semiconductor layer having more superior crystallinity than the MOCVD method can be formed by optimizing the conditions in a sputtering method. Hereinafter, the details thereof will be described in order.

<Buffer Layer>

Preferably, the buffer layer (intermediate layer) 102 is made of polycrystal $Al_xGa_{1-x}N$ ($0 \leq x \leq 1$), and more preferably, it is made of monocrystal $Al_xGa_{1-x}N$ ($0 \leq x \leq 1$).

Although the buffer layer 102 may be formed by a MOCVD method as described above, it may also be formed by a sputtering method. In the case of forming the buffer layer 102 by a sputtering method, it is possible to suppress the temperature of the substrate 101 at low temperature during the forming of the buffer layer 102, and thus even in the case of using the substrate 101 made of a material having a property that is decomposed at high temperature, the respective layers can be formed on the substrate 101 without damaging the substrate 101, so that it is preferable to form the buffer layer 102 accordingly.

As described above, the buffer layer 102, for example, may be made of polycrystal $Al_xGa_{1-x}N$ ($0 \leq x \leq 1$) with a thickness of 0.01 to 0.5 μm. If the thickness of the buffer layer 102 is less than 0.01 μm, an effect of mitigating a difference in lattice constant between the substrate 101 and the under-layer 103 may not be sufficiently obtained by the buffer layer 102. Also, if the thickness of the buffer layer 102 exceeds 0.5 μm, even if functioning as the buffer layer 102 is not changed, the time for the step of forming the buffer layer 102 is lengthened, thus deteriorating the productivity.

The buffer layer 102 functions to make it easy to form the C-axis oriented monocrystal layer on the (0001) C-surface of the substrate 101 by mitigating the difference in lattice constant between the substrate 101 and the under-layer 103. Accordingly, by laminating the monocrystal under-layer 103 on the buffer layer 102, the under-layer 103 can be laminated with much higher crystallinity. In this case, in the present invention, it is preferable to perform a buffer layer forming step, but such a buffer layer forming step may not be performed.

The buffer layer 102 may have a crystal structure of a hexagonal crystal system that is made of a group III nitride semiconductor. Also, the crystal of the group III nitride semiconductor that forms the buffer layer 102 may have a monocrystal structure, and the crystal having the monocrystal structure is preferably used. Since the crystal of the group III nitride semiconductor controls the growth condition, it grows not only in an upward direction but also in an in-plane direction to form the monocrystal structure. Accordingly, by controlling the film-forming condition of the buffer layer 102, the buffer layer 102 is made of the crystal of the group III nitride semiconductor of the monocrystal structure. When the buffer layer 102 having the monocrystal structure as described above is formed on the substrate 101, the buffer function of the buffer layer 102 is effectively performed, and thus the group III nitride semiconductor formed thereon becomes a crystal layer having good orientation and crystallinity.

Also, by controlling the film-forming condition, the crystal of the group III nitride semiconductor that forms the buffer layer 102 may become a column type crystal (polycrystal) composed of a texture based on a hexagonal prism. Here, the column type crystal composed of the texture means a crystal in which grain boundaries are formed between neighboring grains separated from each other and which is itself a column type that has a vertical profile.

<Under-Layer>

Although the under-layer 103 may be $Al_xGa_yIn_zN$ ($0 \leq x \leq 1$, $0 \leq y \leq 1$, $0 \leq z \leq 1$, $x+y+z=1$), the under-layer 103 having a good crystallinity can be preferably formed using $Al_xGa_{1-x}N$ ($0 \leq x < 1$).

The thickness of the under-layer 103 is preferably equal to or more than 0.1 μm, more preferably equal to or more than 0.5 μm, and most preferably equal to or more than 1 μm. By forming the under-layer with a thickness equal to or more than 1 μm, a layer of $Al_xGa_{1-x}N$ having a good crystallinity can be easily obtained.

However, in order to form the under-layer 103 with a good crystallinity, it is preferable that the under-layer 103 is not doped with impurities. However, in the case where the p-type or n-type conductivity is necessary, an acceptor impurity or a donor impurity may be added.

<N-Type Semiconductor Layer>

As illustrated in FIG. 3, it is preferable that the n-type semiconductor layer 104 is typically composed of an n-contact layer 104a and an n-clad layer 104b. In this case, it is also possible that the n-contact layer 104a also serves as the n-clad layer 104b. Also, the above-described under-layer may be included in the n-type semiconductor layer 104.

The n-contact layer 104a is a layer for installing an n-type electrode. It is preferable that the n-contact layer 104a is made of an $Al_xGa_{1-x}N$ layer ($0 \leq x \leq 1$, preferably $0 \leq x \leq 0.5$, and more preferably ($0 \leq x \leq 0.1$).

Also, it is preferable that the n-contact layer 104a is doped with an n-type impurity, and if the n-type impurity is contained at density of $1 \times 10^{17}$ to $1 \times 10^{20}$/cm$^3$, and preferably at density of $1 \times 10^{18}$ to $1 \times 10^{19}$/cm$^3$, it is preferable in maintaining a good ohmic contact with the n-type electrode. The n-type impurity, although not specially limited, for example, may be Si, Ge, Sn, or the like, and preferably may be Si or Ge.

Preferably, the thickness of the n-contact layer 104a is in the range of 0.5 to 5 μm, and more preferably, in the range of 1 to 3 μm. If the thickness of the n-contact layer 104a is in the above-described range, the crystallinity of the semiconductor can be maintained well.

It is preferable to install the n-clad layer 104b between the n-contact layer 104a and the light-emitting layer 105. The n-clad layer 104b is a layer that performs carrier injection and carrier confinement in the light-emitting layer 105. The n-clad layer 104b can be formed of AlGaN, GaN, GAlnN, and the like. Also, the n-clad layer 104b may have a superlattice structure in which the above-described structures are heterojunctioned or laminated plural times. In the case of forming the n-clad layer 104b with GaInN, it is undoubtedly preferable to form the n-clad layer with a size that is larger than a band gap of GaInN of the light-emitting layer 105.

The thickness of the n-clad layer 104b, although not specially limited, may be preferably in the range of 0.005 to 0.5 μm, and more preferably in the range of 0.005 to 0.1 μm. The n-type doping density of the n-clad layer 104b is preferably $1 \times 10^{17}$ to $1 \times 10^{20}$/cm$^3$, and more preferably $1 \times 10^{18}$ to $1 \times 10^{19}$/cm$^3$. If the doping density is in this range, it is preferable in maintaining a good crystallinity and in reducing the operation voltage of the element.

At this time, in the case of making the n-clad layer 104b as a layer including the superlattice structure, although not illustrated in detail, it may include a structure in which an n-side first layer composed of a group III nitride semiconductor having a thickness equal to or less than 100 Å and an n-side second layer composed of a group III nitride semiconductor having a composition different from that of the n-side first layer and having a thickness equal to or less than 100 Å are laminated.

Also, the n-clad layer 104b may include a structure in which the n-side first layer and the n-side second layer are alternately and repeatedly laminated. Also, preferably, any one of the n-side first layer and the n-side second layer may have a construction that is in contact with an active layer (light-emitting layer 105).

As described above, the n-side first layer or the n-side second layer may be a composition of an AlGaN system (which may be simply described as AlGaN) including Al, a GaInN system (which may be simply described as GaInN) including In, and GaN.

Also, the n-side first layer or the n-side second layer may be a GaInN/GaN alternating structure, an AlGaN/GaN alternating structure, a GaInN/AlGaN alternating structure, a GaInN/GaInN alternating structure having different composition (in the present invention, the term "different composition" indicates that the composition ratio of the respective elements is different, and the same may be said hereinafter), or an AlGaN/AlGaN alternating structure having different composition.

In the present invention, it is preferable that the n-side first layer or the n-side second layer is a GaInN/GaN alternating structure or a GaInN/GaInN alternating structure having different composition.

The superlattice layers of the n-side first layer and the n-side second layer are preferably equal to or less than 60 Å, more preferably equal to or less than 40 Å, and most preferably in the range of 10 Å to 40 Å, respectively. If the thickness of the n-side first layer and the n-side second layer that constitute the superlattice layer exceeds 100 Å, the crystal may be defective, and thus it is not preferable.

The n-side first layer and the n-side second layer may be a doped structure or a combination of doped/undoped structures. As doping impurities, known impurities in the related art may be applied to the above-described material composition without any limitation. For example, in the case of using the GaInN/GaN alternating structure or the GaInN/GaInN alternating structure having different composition as the n-clad layer, Si is suitable as an impurity.

Also, the n-side superlattice multi-layer as described above may be manufactured by properly turning on/off the doping even if the same composition represented by the GaInN, AlGaN, or GaN is used.

<Light Emitting Layer>

The light-emitting layer 105 that is laminated on the n-type semiconductor layer 104 has a single quantum well structure or a multiple quantum well structure.

As illustrated in FIG. 3, as a well layer 105$b$ of the quantum well structure, a group III nitride semiconductor layer composed of $Ga_{1-y}In_yN$ (0<y<0.4) is normally used. The well layer 105$b$ may have a thickness enough to obtain the quantum effect, and for example, the thickness of the well layer 105$b$ may be in the range of 1 to 10 nm, and preferably in the range of 2 to 6 nm, which is preferable in view of light emission.

Also, in the case of the light-emitting layer 105 having the multiple quantum well structure, the $Ga_{1-y}In_yN$ becomes the well layer 105$b$, and the $Al_zGa_{1-z}N$ (0≤z≤0.3) having a band gap energy that is larger than that of the well layer 105$b$ becomes a barrier layer 105$a$. The impurities may not be doped into the well layer 105$b$ and the barrier layer 105$a$ according to the design.

<P-Type Semiconductor Layer>

As illustrated in FIG. 3, the p-type semiconductor layer 106 is typically composed of a p-clad layer 106$a$ and a p-contact layer 106$b$. In this case, it is also possible that the p-contact layer 106$b$ also serves as the p-clad layer 106$a$.

The p-clad layer 106$a$ is a layer that performs carrier confinement and carrier injection in the light-emitting layer 105. The p-clad layer 106$a$, although not specially limited, may have a composition that becomes larger than the band gap energy of the light-emitting layer 105 and may confine the carrier of the light-emitting layer 105, and preferably, may be $Al_xGa_{1-x}N$ (0<x≤0.4).

If the p-clad layer 106$a$ is composed of the AlGaN as described above, it is preferable in confining the carrier of the light-emitting layer. The p-clad layer 106$a$, although not specially limited, may have a thickness preferably in the range of 1 to 400 nm, and more preferably in the range of 5 to 100 nm.

The p-type doping density of the p-clad layer 106$a$ is preferably in the range of $1\times10^{18}$ to $1\times10^{21}/cm^3$, and more preferably in the range of $1\times10^{19}$ to $1\times10^{20}/cm^3$. If the p-type doping density is in this range, a good p-type crystal is obtained without deteriorating the crystallinity.

Also, the p-clad layer 106$a$ may have a superlattice structure in which the layers are laminated plural times.

At this time, in the case of making the p-clad layer 106$b$ as a layer including the superlattice structure, although not illustrated in detail, it may include a structure in which a p-side first layer composed of a group III nitride semiconductor having a thickness equal to or less than 100 Å and a p-side second layer composed of a group III nitride semiconductor having a composition different from that of the p-side first layer and having a thickness equal to or less than 100 Å are laminated. Also, it may include a structure in which the p-side first layer and the p-side second layer are alternately and repeatedly laminated.

The p-side first layer or the p-side second layer as described above may be a different composition, and for example, may be any composition of AlGaN, GaInN, or GaN, or may be a GaInN/GaN alternating structure, an AlGaN/GaN alternating structure, or a GaInN/AlGaN alternating structure.

In the present invention, it is preferable that the p-side first layer or the p-side second layer is a AlGaN/AlGaN alternating structure or an AlGaN/GaN alternating structure.

The superlattice layers of the p-side first layer and the p-side second layer are preferably equal to or less than 60 Å, more preferably equal to or less than 40 Å, and most preferably in the range of 10 to 40 Å. If the thickness of the p-side first layer and the p-side second layer that constitute the superlattice layer exceeds 100 Å, the crystal may be greatly defective, and thus it is not preferable.

The p-side first layer and the p-side second layer may be a doped structure or a combination of doped/undoped structures. As doping impurities, known impurities in the related art may be applied to the above-described material composition without any limitation. For example, in the case of using the AlGaN/GaN alternating structure or the AlGaN/AlGaN alternating structure having different composition as the p-clad layer, Mg is suitable as an impurity. Also, the p-side superlattice multi-layer as described above may be manufactured by properly turning on/off the doping even if the same composition represented by GaInN, AlGaN, or GaN is used.

The p-contact layer 106$b$ is a layer for installing a positive electrode. It is preferable that the p-contact layer 106$b$ is made of an $Al_xGa_{1-x}N$ layer (0≤x≤0.4). If the Al composition is in the above-described range, it is preferable in maintaining a good crystallinity and a good ohmic contact with the p-ohmic electrode.

If the p-type impurity (dopant) is contained at density of $1\times10^{18}$ to $1\times10^{21}/cm^3$, and preferably at density of $5\times10^{19}$ to $5\times10^{20}/cm^3$, it is preferable in maintaining a good ohmic contact, preventing crack generation, and maintaining a good crystallinity. The p-type impurity, although not specially limited, for example, may be Mg or the like.

The thickness of the p-contact layer 106$b$, although not specifically limited, is preferably 0.01 to 0.5 μm, and more preferable 0.05 to 0.2 μm, If the thickness of the p-contact layer 106$b$ is in this range, it is preferable in view of the light emission output.

<N-Type Electrode>

As illustrated in FIG. 1, the n-type electrode 108 is formed on the exposed surface 104$c$ of the n-type semiconductor layer 104. In the case of forming the n-type electrode 108 as described above, the n-contact layer of the n-type semiconductor layer 104 is exposed by partially cutting off and removing the light-emitting layer 105 and the p-type semiconductor layer 106 by a means such as etching, and the n-type electrode 108 is formed on the exposed surface 104$c$.

As illustrated in FIG. 2, as seen from a plane, the n-type electrode 108 is in a circular shape. However, the shape of the n-type electrode 108 is not limited thereto, and may be an arbitrary shape such as a multi-angle shape. Also, the n-type electrode 108 also serves as a bonding pad, and thus is configured to connect a bonding wire. In this case, as the n-type electrode 108, various kinds of known compositions or structures may be installed by a common means well known in the technical field.

Also, the n-type electrode 108, in the same manner as the p-type electrode 111, may be formed by forming a junction layer having slopes, which are made gradually thinner toward the outer circumference, and a bonding pad electrode to cover the junction layer. Also, a transparent electrode or a protection film may be formed at this time. Accordingly, penetration of the external air or moisture into the junction layer of the n-type electrode 108 can be prevented to improve the anticorrosion property of the junction layer, and thus the life span of the semiconductor light-emitting element can be lengthened.

<Transparent Electrode>

As illustrated in FIG. 1, the transparent electrode 109 is laminated on the p-type semiconductor layer 106.

As illustrated in FIG. 2, as seen from the plane, the transparent electrode 109 is formed to cover the almost whole surface of the upper surface 106c of the p-type semiconductor layer 106, a portion of which has been removed by a means such as etching to form the n-type electrode 108. However, the transparent electrode 109 is not limited to such a shape, and may be formed in a lattice shape or in a tree shape at predetermined intervals. In this case, any structure including the known structure in the related art may be used as the structure of the transparent electrode 109 without any limitation.

It is preferable that the transparent electrode 109 has a small contact resistance with the p-type semiconductor layer 106. Also, considering that the light from the light-emitting layer 105 is extracted to the side on which the bonding pad electrode 107 is formed, it is preferable that the transparent electrode 109 has a superior light permeability. Also, in order to uniformly diffuse current over the whole surface of the p-type semiconductor layer 106, it is preferable that the transparent electrode 109 has a superior conductivity.

From the above-described contents, it is preferable that the transparent electrode 109 is made of a transparent conductive material selected from the group consisting of any one kind of a conductive oxide including any one kind of In, Zn, Al, Ga, Ti, Bi, Mg, W, Ce, Sn, and Ni, zinc sulfide, and chromium sulfide.

Also, it is preferable that the conductive oxide may be ITO (Indium Tin Oxide ($In_2O_3$—$SnP_2$)), IZO (Indium Zinc Oxide ($In_2O_3$—ZnO)), AZO (Aluminum Zinc Oxide (ZnO—$Al_2O_3$)), GZO (Gallium Zinc Oxide (ZnO—$Ga_2O_3$)), fluorine doped tin oxide, titanium oxide, or the like.

By installing these materials using a common means well known in the technical field, the transparent electrode 109 can be formed. Also, after forming the transparent electrode 109, heat annealing for alloy or transparency may be performed. However, the heat annealing may not be performed.

The transparent electrode 109 may have a crystallized structure, and particularly it is preferable that the transparent electrode includes an $In_2O_3$ crystal having a hexagonal crystal structure or a bixbyite structure (for example ITO or IZO).

For example, in the case of using IZO that includes an $In_2O_3$ crystal having a hexagonal crystal structure as the transparent electrode 109, it can be processed to have a specified shape using an amorphous IZO film having a superior etching property, and then can be processed as an electrode having more superior transparency to that of the amorphous IZO film by changing the amorphous structure to a structure that includes the corresponding crystal through heat-treatment or the like.

Also, as the IZO film, it is preferable to use a composition that has the lowest resistivity.

For example, the ZnO density of the IZO is preferably in the range of 1 to 20% by mass, and more preferably in the range of 5 to 15% by mass. Particularly, it is preferable that the ZnO density is 10% by mass. Also, the thickness of the IZO film is preferably in the range of 35 nm to 10000 nm (10 μm) in which low resistivity and high light permeability can be obtained. Further, from a view point of production cost, the thickness of the IZO film is preferably equal to or less than 1000 nm (1 μm).

The patterning of the IZO film is performed preferably before a heat-treatment step to be described later is performed. Since the IZO film in an amorphous state becomes a crystallized IZO film by the heat-treatment, it is difficult to perform the etching in comparison to the IZO film in the amorphous state. By contrast, since the IZO film before the heat-treatment is in an amorphous state, it is possible to easily perform the etching with good accuracy using a known etchant (ITO-07N etchant (product of KANTO CHEMICAL CO., INC.).

The etching of the IZO film in an amorphous state may be performed using a dry etching device. In this case, $Cl_2$, $SiCl_4$, $BCl_3$, and the like, may be used as an etching gas. The IZO film in an amorphous state may be, for example, an IZO film including $In_2O_3$ crystal of a hexagonal crystal structure which is obtained by performing a heat-treatment at 500° C. to 1000° C. and controlling the conditions, or an IZO film including $In_2O_3$ crystal of a bixbyite structure. Since it is difficult to perform the etching of the IZO film including $In_2O_3$ crystal of a hexagonal crystal structure as described above, it is preferable to perform the heat-treatment after the above-described etching process.

The heat-treatment of the IZO film is performed preferably in the atmosphere that does not include $O_2$. The atmosphere that does not include $O_2$ may be an inert gas atmosphere such as $N_2$ atmosphere, a mixed gas atmosphere including an inert gas such as $N_2$ and $H_2$, or the like, and preferably an $N_2$ atmosphere or a mixed gas atmosphere including $N_2$ and $H_2$. In this case, if the heat-treatment of the IZO film is performed in an N atmosphere or a mixed gas atmosphere including $N_2$ and $H_z$, for example, it is possible to crystallize the IZO film on a film that includes $In_2O_3$ crystal of a hexagonal crystal structure and to effectively reduce sheet resistance of the IZO film.

Also, the heat-treatment temperature of the IZO film is preferably 500° C. to 1000° C. In the case of performing the heat-treatment at a temperature less than 500° C., the IZO film may not be sufficiently crystallized, and thus the light permeability of the IZO film may not be sufficiently high. In the case of performing the heat-treatment at a temperature exceeding 1000° C., the IZO film may be crystallized, but the light permeability of the IZO film may not be sufficiently high. Also, In the case of performing the heat-treatment at a temperature exceeding 1000° C., the semiconductor layer located below the IZO film may deteriorate.

In the case of crystallizing the IZO film in an amorphous state, if the film-forming condition, heat-treatment condition, or the like, is different, the crystal structure in the IZO film becomes different. However, in the embodiment of the present invention, as to the adhesivity with an adhesive layer, the transparent electrode is not limited in material, but crystalline material is preferable. Particularly, in the case of the crystalline IZO, it may be the IZO including $In_2O_3$ crystal of a bixbyite structure or the IZO including $In_2O_3$ crystal of a hexagonal crystal structure. In particular, the IZO including $In_2O_3$ crystal of a hexagonal crystal structure may be preferable.

In particular, as described above, the IZO film crystallized by the heat-treatment has good adhesion with the junction layer 110 or the p-type semiconductor layer 106, in comparison to the IZO film in an amorphous state, and thus it is very effective in an embodiment of the present invention.

<P-Type Electrode>

FIG. 4 is an example of an enlarged cross-sectional view of a p-type electrode 111 of a semiconductor light-emitting element 1 according to an embodiment of the present invention in FIG. 1.

As illustrated in FIG. 4, the p-type electrode (electrode of one conduction type) 111 is composed of a transparent electrode 109, a junction layer 110, and a bonding pad electrode 120, and is briefly configured to be formed on the p-type semiconductor layer 106.

The upper surface 109c of the transparent electrode 109 is covered by a protection film 10 made of $SiO_2$, and a portion of the protection film 10 is open to form an opening 10d. A portion of the upper surface 109c of the transparent electrode 109 is exposed from the opening 10d.

The junction layer 110 covers the upper surface 109c of the transparent electrode 109 exposed from the opening 10d with almost a uniform thickness, and on the outer circumference side of the opening 10d, the thickness of the junction layer 110 becomes thicker. In addition, the junction layer 110 is formed to cover the end portion 10c of the protection film 10. Also, on the outer circumference portion 110d of the junction layer 110 that covers the end portion 10c of the protection film 10, an slope 110c, which is made gradually thinner toward the outer circumference, is formed.

The bonding pad electrode 120 is composed of a metal reflection layer 117 and a bonding layer 119 which are formed with thicknesses greater than the maximum thickness of the junction layer 110. Also, on the outer circumference portion 120d of the bonding pad electrode 120, an slope 119c, which is made gradually thinner toward the outer circumference, is formed.

On the outer circumference portion of the metal reflection layer 117, an slope 117c, which is made gradually thinner toward the outer circumference, is formed. Also, the metal reflection layer 117 is formed to cover the junction layer 110. That is, the metal reflection layer 117 is formed to completely cover the forefront end portion of the slope 110c of the junction layer 110, that is, a boundary portion of the junction layer 110 that makes a contour-line as seen from a plane. That is, as seen from a plane, the metal reflection layer 117 is formed to cover the junction layer 110 and further to project up to the outer circumference side of the junction layer 110, and thus no portion of the junction layer 110 is exposed from the lower part of the metal reflection layer 117.

Further on the outer circumference portion of the bonding layer 119, the slope 119c, which is made gradually thinner toward the outer circumference, is formed. Also, the bonding layer 119 is formed to cover the metal reflection layer 117. That is, the bonding layer 119 is formed to completely cover the forefront end portion of an slope 117c of the metal reflection layer 117, that is, a boundary portion of the metal reflection layer 117 that makes a contour-line as seen from a plane. That is, as seen from a plane, the bonding layer 119 is formed to cover the metal reflection layer 117 and to project up to the outer circumference side of the metal projection layer 117, and thus no portion of the metal reflection layer 117 is exposed from the lower part of the bonding layer 119.

With the above-described configuration, the slope 110c, which is made gradually thinner toward the outer circumference, is formed on the outer circumference portion of the junction layer 110, and is doubly shielded from the outside by the metal reflection layer 117 and the bonding layer 119. Accordingly, external air or moisture is unable to invade the junction layer 110 without passing through the junction surface between the protection film 10 and the bonding layer 119 and the junction surface between the protection film 10 and the metal reflection layer 117, and thus the anxiety in which the external air or moisture of the semiconductor light-emitting element invades the junction layer 110 can be greatly reduced.

Accordingly, the junction layer 110 is not easily dissolved, and anticorrosion property of the junction layer 110 is improved to lengthen the life span of the semiconductor light-emitting element.

Also, it is preferable that, before the forming the junction layer 110, the upper surface 109c, from which the transparent electrode 109 is exposed, be wet-etched to form a fresh surface from which impurities or defects are removed. Accordingly, the adhesion between the upper surface 109c of the transparent electrode 109 and the junction layer 110 can be improved.

<Junction Layer>

The junction layer 110 as illustrated in FIG. 1 is laminated between the transparent electrode 109 and the bonding pad electrode 120 in order to improve the junction strength of the bonding pad electrode 120 against the transparent electrode 109. Also, it is preferable that the junction layer 110 have transparency in order to transmit light radiated from the light-emitting layer 105 onto the bonding pad electrode 120 through the transparent electrode 109 without loss.

It is preferable that the junction layer 110 be made of at least one kind of element selected from the group consisting of Al, Ti, V, Cr, Mn, Co, Zn, Ge, Zr, Nb, Mo, Ru, Hf, Ta, W, Re, Rh, Ir, and Ni. Accordingly, both junction strength and transparency can be achieved. The junction layer 110 is made of preferably at least one kind of element selected from the group consisting of Cr, Ti, W, Mo, Zr, Hf, Co, Rh, Ir, and Ni, and more preferably at least one kind of element selected from the group consisting of Cr, Ti, W, Mo, Rh, Co, and Ni. In particular, by using a metal such as Cr, Ti, Mo, Ni, Co, the junction strength of the bonding pad electrode 120 against the transparent electrode 109 can be especially increased.

Also, it is preferable that the junction layer 110 be a thin film of which the maximum thickness is equal to or more than 10 Å and equal to or less than 400 Å. Accordingly, the light from the light-emitting layer 105 can be effectively transmitted without shielding. In this case, if the maximum thickness becomes less than 10 Å, the strength of the junction layer 110 is lowered, and thus the junction strength of the bonding pad electrode 120 against the transparent electrode 109 is lowered to cause a non-preferable result.

<Bonding Pad Electrode>

As illustrated in FIG. 1, the bonding pad electrode 120 is composed of a laminated body in which the metal reflection layer 117 and the bonding layer 119 are laminated in order from the side of the transparent electrode 109.

In this case, the bond pad electrode 120 may be a single-layer structure composed of only the metal reflection layer 117 or a three-layer structure that is obtained by inserting a barrier layer for reinforcing the strength of the entire bonding pad electrode 120 between the metal reflection electrode 117 and the bonding layer 119.

<Metal Reflection Layer>

The metal reflection layer 117 illustrated in FIG. 1 is made of preferably a metal having a high reflection ratio, and more preferably a platinum group metal, such as Ru, Rh, Pd, Os, Ir, Pt, Al, Ag, Ti, or an alloy including at least one kind of these metals. Accordingly, the light from light-emitting layer 105 can be effectively reflected.

Among them, Al, Ag, Pt, or an alloy including at least one kind of these metals is general as a material for the electrode, and is superior on the point that it is easy to obtain and easy to handle.

Also, in the case of forming the metal reflection layer 117 with a metal having a high reflection ratio, the maximum thickness of the metal reflection layer 117 is preferably 20 to 3000 nm. If the metal reflection layer 117 is too thin, a sufficient reflection effect may not be obtained. If the metal reflection layer 117 is too thick, any special advantage is not obtained, but only the processing time is lengthened with the waste of materials. The maximum thickness of the metal reflection layer 117 is more preferably 50 to 1000 nm, and most preferably 100 to 500 nm.

Also, it is preferable that the metal reflection layer 117 be in close contact with the junction layer 110 from the viewpoint that the light from the light-emitting layer 105 can be efficiently reflected and the junction strength of the bonding pad electrode 120 can be heightened. Accordingly, in order for the bonding pad electrode 120 to obtain sufficient strength, it is necessary that the metal reflection layer 117 be firmly bonded to the transparent electrode 109 via the junction layer 110. At the lowest, the strength to the extent that the bonding pad electrode does not peel off during the step of connecting a gold wire onto the bonding pad is preferable. In particular, Rh, Pd, Ir, Pt, or an alloy including at least one kind of these metals is appropriately used as the metal reflection layer 117 in view of its light reflection, or the like.

Although the reflection ratio of the bonding pad electrode 120 is greatly changed according to the constituent materials of the metal reflection layer 117, it is preferably equal to or more than 60%. Further, the reflection ratio of the bonding pad electrode 120 is preferably equal to or more than 80%, and more preferably equal to or more than 90%. The reflection ratio can be relatively easily measured by a spectrophotometer and so on. However, since the bonding pad electrode 120 itself has a small area, it is difficult to measure the reflection ratio. Accordingly, a "dummy substrate" having a larger area, for example, glass substrate, may be put into a chamber during forming the bonding pad electrode, and the same bonding pad electrode may be formed on the dummy substrate at the same time to measure the reflection ratio.

The bonding pad electrode 120 may be made of only metals having a high reflection ratio as described above. That is, the bonding pad electrode 120 may be formed of only the metal reflection layer 117. However, as the bonding pad electrode 120, various kinds of structures using various kinds of materials are known. Accordingly, the above-described metal reflection layer may be newly formed on the semiconductor layer side (transparent electrode side) of the known structure, or the lowermost layer on the semiconductor layer side of the known structure may be replaced by the above-described metal reflection layer.

<Bonding Layer>

It is preferable that the bonding layer 119 in FIG. 1 be made of Au, Al, or an alloy including at least one kind of these metals. Au and Al are metals having good adhesion with gold balls, which are often used as bonding balls, and by using Au, Al, or an alloy including at least one kind of these metals, the adhesion with the bonding wires becomes superior. In particular, it is preferable to use Au as the bonding layer material among them.

Also, the maximum thickness of the bonding layer 119 is preferably equal to or more than 50 nm and equal to or less than 2000 nm, and more preferably equal to or more than 100 nm and equal to or less than 1500 nm.

If the bonding layer is too thin, the adhesion with the bonding balls deteriorates, while if the bonding layer is too thick, any special advantage is not obtained, but only the cost is increased.

The light toward the bonding pad electrode 120 is reflected from the metal reflection layer 117 of the lowermost surface of the bonding pad electrode 120 (the surface on the transparent electrode side), and a portion thereof is scattered to travel in the horizontal direction or in the inclination direction while another portion thereof directly travels just below the bonding pad electrode 120. The light, which has been scattered and traveled in the horizontal direction or the inclination direction, is extracted from the side surface of the semiconductor light-emitting element 1 to the outside. On the other hand, the light, which has traveled just below the bonding pad electrode 120, is further scattered or reflected from the lower surface of the semiconductor light-emitting element 1, and is extracted to the outside through the side surface or the transparent electrode 109 (a portion on which no bonding pad electrode exists).

The bonding pad electrode 120 can be formed anywhere on the transparent electrode 109. For example, it may be formed on a position that is farthest from the n-type electrode 108, or may be formed in the center of the semiconductor light-emitting element 1. However, if the bonding pad electrode 120 is formed on a position that is too close to the n-type electrode 108, short circuiting may occur between the wires or balls when the bonding is completed, and thus it is not preferable.

Also, as for the electrode area of the bonding pad electrode 120, the bonding pad electrode 120 having an area as large as possible facilitates the bonding work, but interferes with the extraction of the emitted light. For example, if the electrode covers an area that exceeds a half of the chip surface area, it interferes with the extraction of the emitted light, and thus the output deteriorates remarkably. By contrast, if the electrode area of the bonding pad electrode 120 is too small, it becomes difficult to perform the bonding work, and thus the yield of the product deteriorates.

Specifically, the electrode area is preferably somewhat larger than the diameter of the bonding ball, and generally a circular shape having a diameter of about 100 μm.

The metal element of the junction layer, the metal reflection layer, the bonding layer, or the like, may be constituted by the same metal element or a combination of other metal elements.

<Barrier Layer>

The bonding pad electrode 120 may have a three-layer structure that is obtained by inserting a barrier layer between the metal reflection layer 117 and the bonding layer 119.

The barrier layer serves to reinforce the strength of the entire bonding pad electrode 120, and for example, is formed on the metal reflection layer of the bonding pad electrode 120. Due to this, it is necessary that the barrier layer is made of a relatively strong metal material or is sufficiently thick. A preferable material is Ti, Cr, or Al. Among them, Ti is preferable in view of the material strength.

The metal reflection layer 17 may also serve as the barrier layer. In the case where the metal reflection layer 117 has a good reflection ratio and is made of a mechanically strong metal material with a large thickness, it is not necessary to form the barrier layer. For example, in the where Al or Pt is used as the metal reflection layer 117, the barrier layer is not surely necessary. The maximum thickness of the barrier layer is preferably 20 to 3000 nm. If the barrier layer is too thin, a sufficient strength reinforcement effect is not obtained, while if the barrier layer is too thick, any special advantage is not obtained, but only the cost is increased. The maximum thickness of the barrier layer may be preferably 50 to 1000 nm, and more preferably 100 to 500 nm.

Embodiments 2 to 6 which are related to the above-described Embodiment 1 will be described later.

Embodiment 7

Figure 14:
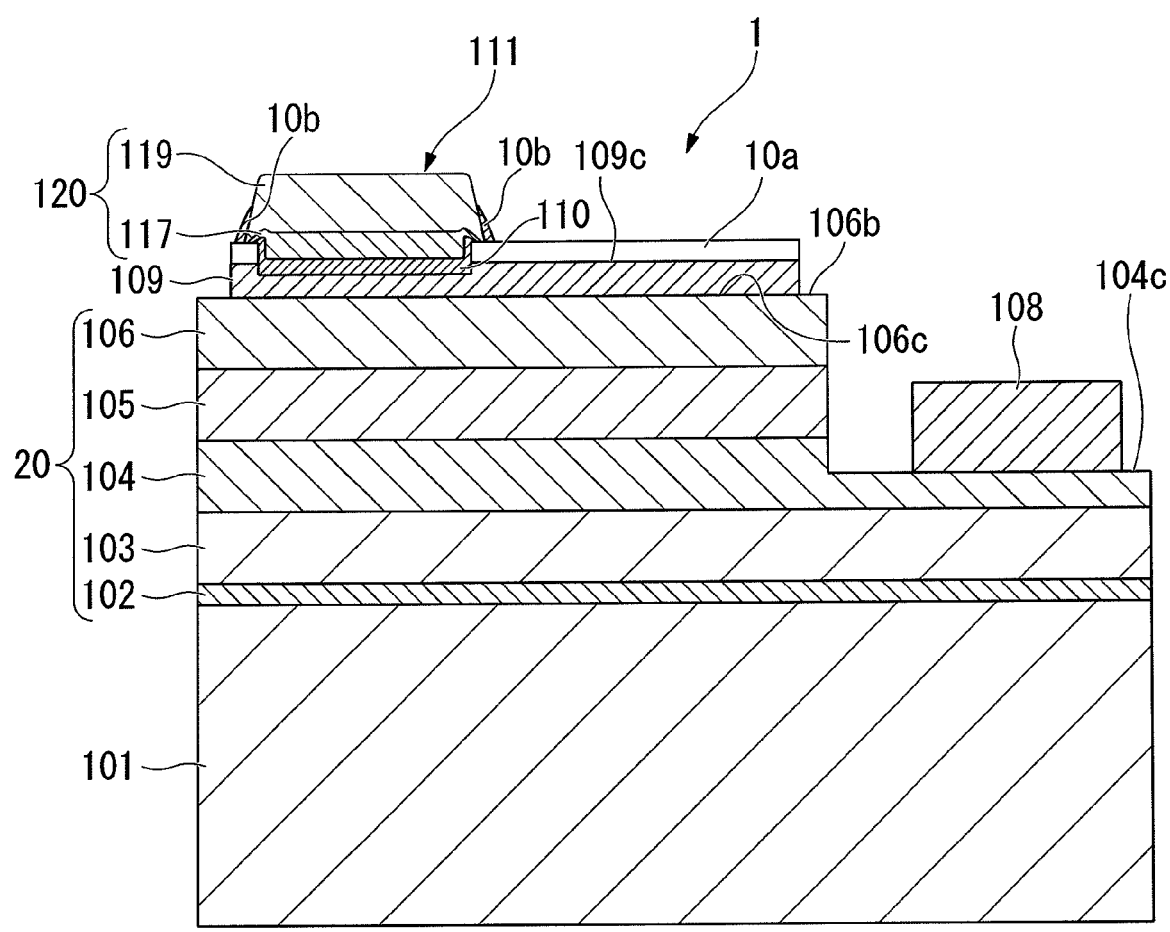
FIG. 14 is a view illustrating an example of a semiconductor light-emitting element according to the present invention, and a schematic cross-sectional view of the semiconductor light-emitting element.
Figure 15:
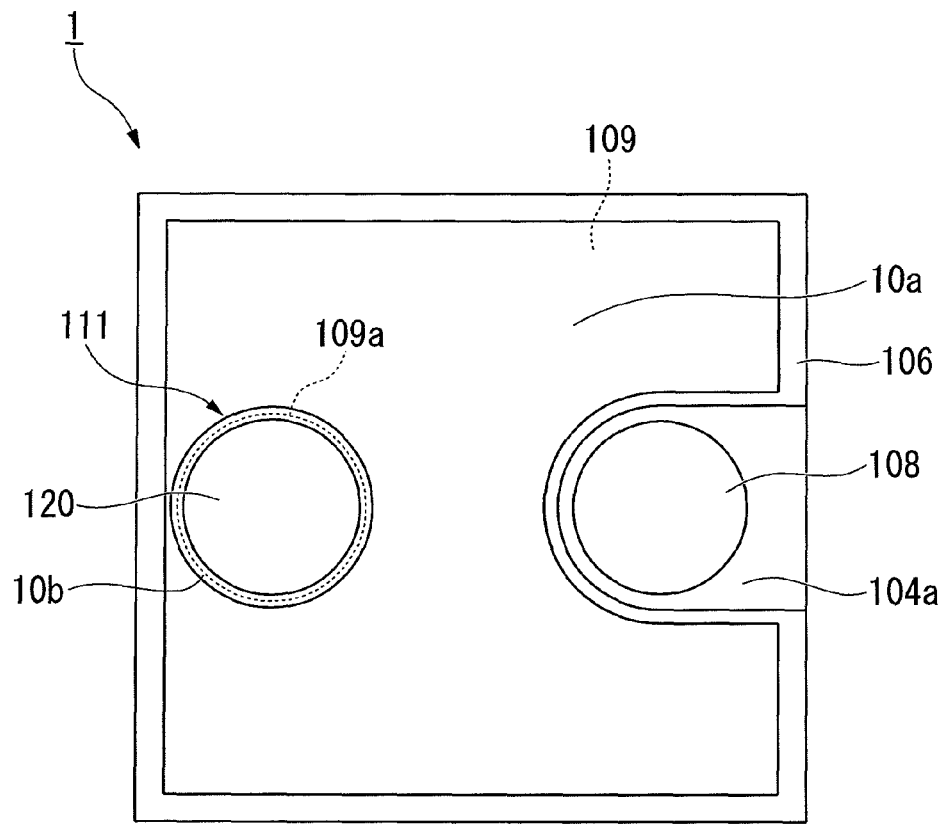
FIG. 15 is a schematic plan view of a semiconductor light-emitting element illustrated in FIG. 14.
Figure 16:
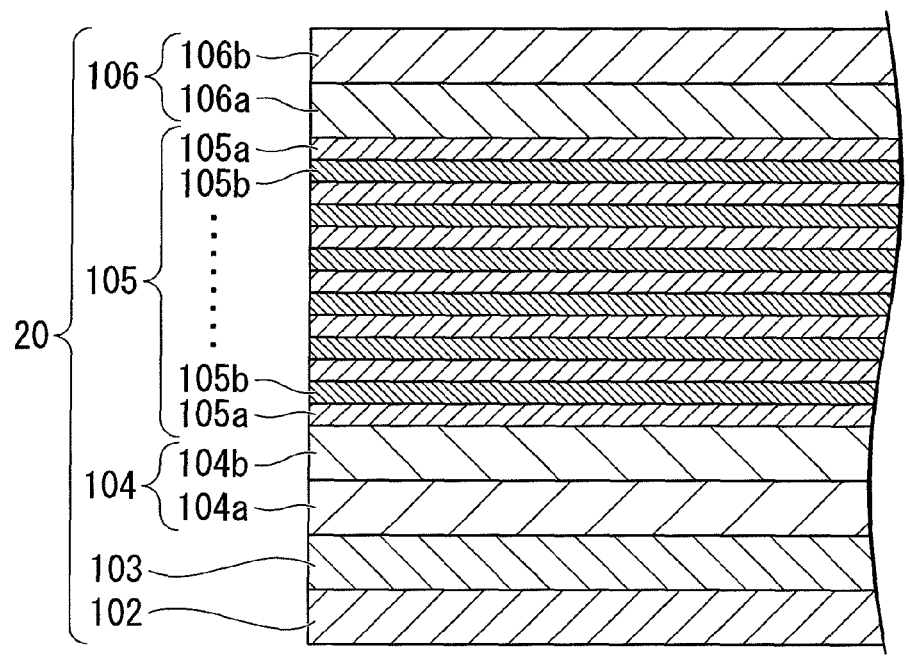
FIG. 16 is an enlarged schematic cross-sectional view of a laminated semiconductor layer constituting a semiconductor light-emitting element illustrated in FIG. 14.
Figure 17:
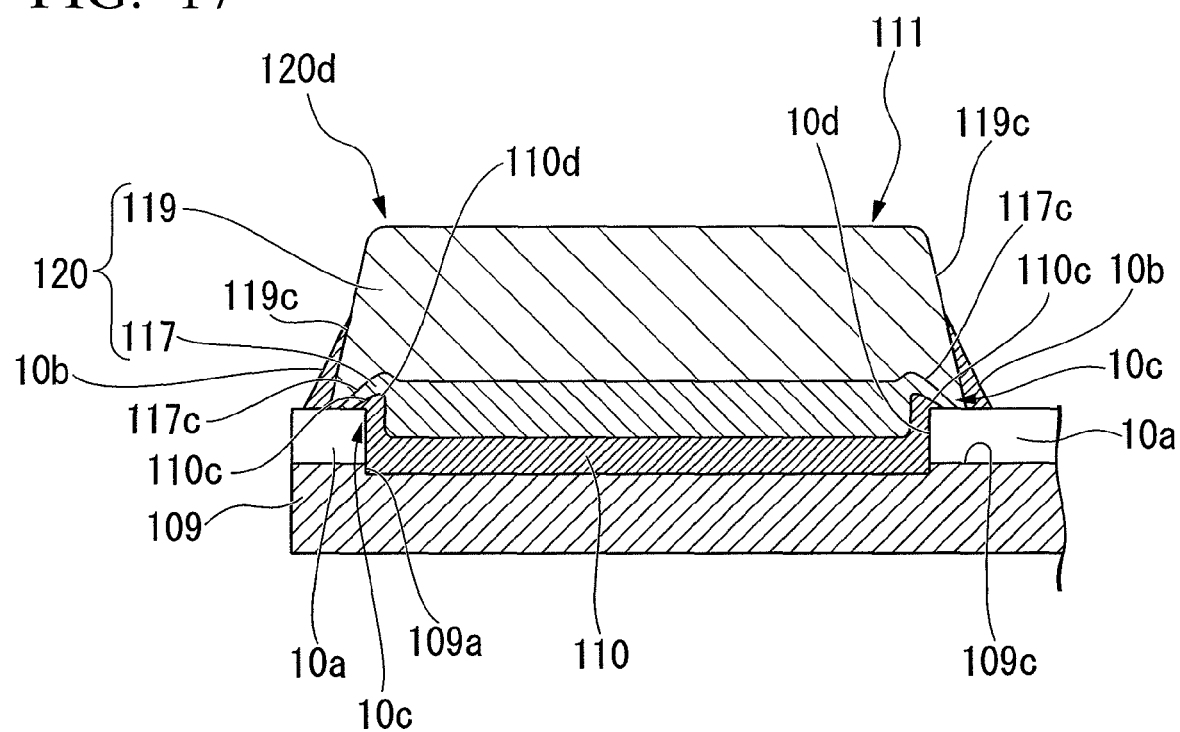
FIG. 17 is a schematic enlarged cross-sectional view of a p-type electrode constituting a semiconductor light-emitting element illustrated in FIG. 14.

FIGS. 14 to 17 are views illustrating an example of a semiconductor light-emitting element according to an embodiment of the present invention. FIG. 14 is a schematic cross-sectional view of a semiconductor light-emitting element according to an embodiment of the present invention, and FIG. 15 is a schematic plan view of a semiconductor light-emitting element according to an embodiment of the present invention. FIG. 16 is a schematic cross-sectional view illustrating a laminated semiconductor of a semiconductor light-emitting element according to an embodiment of the present invention, and FIG. 17 is a schematically enlarged cross-sectional view of a p-type electrode of a semiconductor light-emitting element illustrated in FIG. 14 according to an embodiment of the present invention.

As illustrated in FIG. 14, a semiconductor light-emitting element 1 according to this embodiment includes a substrate 101, a laminated semiconductor layer 20 formed on the substrate 101, a p-type electrode 111 (one electrode) formed on an upper surface 106c of the laminated semiconductor layer 20, and an n-type electrode 108 (the other electrode) formed on an exposed surface 104c of the semiconductor layer, from which the laminated semiconductor layer 20 is partially cut off.

As illustrated in FIG. 14, the laminated semiconductor layer 20 is formed by laminating in order an n-type semiconductor layer 104, a light-emitting layer 105, and a p-type semiconductor layer 106 on the substrate 101. The semiconductor light-emitting element 1 according to this embodiment is configured to obtain light emitted from the light-emitting layer 105 by applying a voltage between the p-type electrode 111 and the n-type electrode 108 to make current pass therethrough. Also, the semiconductor light-emitting element 1 according to this embodiment is a face up mount type light-emitting element which extracts the light from the side on which the p-type electrode 111 is formed.

The semiconductor light-emitting element according to Embodiment 7 basically has a different configuration in that the electrode is installed on the upper surface of the laminated semiconductor layer 20 in comparison to the semiconductor light-emitting element according to Embodiment 1.

That is, Embodiment 7 provides a structure of a semiconductor light-emitting element which is so configured that at least any one of the one electrode and the other electrode includes a transparent electrode having a junction recess portion on its upper surface, a junction layer formed to cover the junction recess portion, and a bonding pad electrode formed to cover the junction layer and having slopes which are made gradually thinner toward the outer circumference and formed in outer circumference portions of the bonding pad electrode.

Accordingly, in the semiconductor light-emitting element according to Embodiment 7, the substrate that constitutes the semiconductor light-emitting element and the laminated semiconductor layer having the light-emitting layer can be configured basically in a range equal to that in Embodiment 1.

Hereafter, the features that are different from the semiconductor light-emitting element according to Embodiment 1 will be described in detail.

<P-Type Electrode>

The p-type electrode 111, as illustrated in FIG. 17, includes a transparent electrode 109, a junction layer 110, and a bonding pad electrode 120. As illustrated in FIG. 17, on an upper surface 109c of the transparent electrode 109, a junction recess portion 109a is installed. Also, as illustrated in FIG. 14, in an area where the junction recess portion 109a is not formed on the upper surface 109c of the transparent electrode 109, a transparent protection film 10a is formed to cover the transparent electrode 109. In other words, an area where the junction recess portion 109a is formed is an opening 10d in which a portion of the transparent protection film 10a is open. On the junction recess portion 109a that is exposed from the opening 10d, the junction layer 110 is formed to cover the junction recess portion 109a, and on the junction layer 110, the bonding pad electrode 120 is formed to cover the junction layer 110. Also, as illustrated in FIG. 17, an outer edge portion of the junction layer 110 and an outer edge portion of the bonding pad electrode 120 (a metal reflection layer 117 and a bonding layer 119) are arranged on the transparent protection film 10a. Also, the bonding pad electrode 120 is provided with an slope 119c, which is made gradually thinner toward the outside and is formed on an outer circumference portion 120d of the bonding pad electrode 120. In the semiconductor light-emitting element 1 according to this embodiment, as illustrated in FIG. 17, the outer edge portion of the bonding pad electrode 120 is covered by an edge portion protection film 10b.

[Transparent Electrode]

The transparent electrode 109, as illustrated in FIG. 14, is installed on the upper surface 106c of the p-type semiconductor layer 106, and as illustrated in FIG. 17, is provided with the junction recess portion 109a on the upper surface 109c. The depth of the junction recess portion 109a of the transparent electrode 109, although not specifically limited, is preferably about $1/10$ of the thickness of the transparent electrode 109. Also, the planar shape of the junction recess portion 109a may be an arbitrary shape such as circular shape or polygonal shape, and, although not specifically limited, is preferably a circular shape to make the bonding work easy as illustrated in FIG. 15.

Also, the transparent electrode 109, as illustrated in FIG. 15, as seen from the plane, is formed to cover the almost entire upper surface 106c of the p-type semiconductor layer 106. However, the transparent electrode 109 is not limited to such a shape, and may be formed in a lattice shape or in a tree shape at predetermined intervals.

Also, the junction recess portion 109a of the transparent electrode 109 may be formed anywhere on the transparent electrode 109. For example, it may be formed on a position that is farthest from the n-type electrode 108, or may be formed in the center of the semiconductor light-emitting element 1. However, if the bonding pad electrode 120 is formed on a position that is too close to the n-type electrode 108, short circuiting may occur between the wires or balls when the wire is bonded to the bonding pad electrode 120 that is formed on the junction recess portion 109a, and thus it is not preferable.

With respect to the feature of the materials of the transparent electrode 109, the range equal to that in the explanation of the semiconductor light-emitting element according to Embodiment 1 can be applied, and thus the detailed explanation thereof will be omitted.

[Junction Layer]

The junction layer 110 is laminated between the transparent electrode 109 and the bonding pad electrode 120 in order to improve the junction strength of the bonding pad electrode 120 against the transparent electrode 109. As illustrated in FIG. 17, the junction layer 110 is successively formed to cover the inside of the junction recess portion 109a and the end portion 10c of the transparent protection film 10a. Also, in this embodiment, by forming the junction layer 110 to bury the inside of the junction recess portion 109a of the transparent electrode 109 and the inside of the opening 10d of the transparent protection film 10a, high junction strength is obtained between the transparent electrode 109 and the junction layer 110.

Also, the thickness of the junction layer 110 is roughly uniform on the inner wall surface of the junction recess portion 109a of the transparent electrode 109 and the inner wall surface of the opening 10d of the transparent protection film 10a. Also, on the outside of the opening 10d, the junction layer 110 is gradually thinner toward the outside, and thus an slope 110c is formed on the outer circumference portion 110d of the junction layer 110.

It is preferable that the junction layer 110 have transparency. In the case where the junction layer 110 has transparency, the light radiated from the light-emitting layer 105 onto the bonding pad electrode 120 can be transmitted through the junction layer 110 without loss. More specifically, in the case where the junction layer 110 has transparency, a portion of the light from the light-emitting layer 105 is transmitted through the transparent electrode 109 and the junction layer 110, and then is reflected by the bonding pad electrode 120 (in this embodiment, the metal reflection layer 117) in the interface of the junction layer 110 and the bonding pad electrode 120. The light reflected by the bonding pad electrode 120 is introduced into the inside of the laminated semiconductor layer 20 again, repeats transmission and reflection, and then is extracted from a place except for the area where the bonding pad electrode 120 is formed to the outside of the semiconductor light-emitting element 1. Accordingly, in the case where the junction layer 110 has transparency, the light from the light-emitting layer 105 can be efficiently extracted to the outside of the semiconductor light-emitting element 1.

It is preferable that the junction layer 110 be made of at least one kind of element selected from the group consisting of Al, Ti, V, Cr, Mn, Co, Zn, Ge, Zr, Nb, Mo, Ru, Hf, Ta, W, Re, Rh, Ir, and Ni. Accordingly, by making the junction layer 110 with the above-described materials, junction strength of the bonding pad electrode 120 against the transparent electrode 109 can be improved, and transparency can be achieved. The junction layer 110 is made of preferably at least one kind of element selected from the group consisting of Cr, Ti, W, Mo, Zr, Hf, Co, Rh, Ir, and Ni, and more preferably at least one kind of element selected from the group consisting of Cr, Ti, W, Mo, Rh, Co, and Ni. In particular, by using a metal such as Cr, Ti, Mo, Ni, Co as the material of the junction layer 110, the junction strength of the bonding pad electrode 120 against the transparent electrode 109 can be especially increased.

Also, in the case where, for example, the transparent electrode 109 is made of a metal oxide, such as IZO, ITO, and the bonding pad electrode 120 is made of Ag, Al, or the like, as materials of the junction layer 110, it is especially preferable to use Cr, from which a superior junction property is obtained, with respect to both the metal oxide and the Ag and Al.

Also, it is preferable that the junction layer 110 be a thin film of which the maximum thickness is equal to or more than 10 Å and equal to or less than 400 Å. By making the maximum thickness of the junction layer 110 in the above-described range, superior transparency is obtained and thus the light from the light-emitting layer 105 can be effectively transmitted without shielding. In this case, if the maximum thickness becomes less than 10 Å, the strength of the junction layer 110 is lowered, and thus the junction strength of the bonding pad electrode 120 against the transparent electrode 109 is lowered to cause a non-preferable result.

[Bonding Pad Electrode]

The bonding pad electrode 120 is composed of a laminated body in which the metal reflection layer 117 and the bonding layer 119 are laminated in order from the side of the transparent electrode 109. In this case, the bond pad electrode 120 may be a single-layer structure composed of only the bonding layer 119, a single-layer structure composed of only the metal reflection layer 117, or a three-layer structure that is obtained by inserting a barrier layer between the metal reflection electrode 117 and the bonding layer 119. In this case, metal elements, which form the junction layer 110, the metal reflection layer 117, the bonding layer 119, and the barrier layer, may include the same metal element or a combination of different metal elements.

In this embodiment, although the reflection ratio of the bonding pad electrode 120 is greatly changed according to the constituent materials of the metal reflection layer 117, the reflection ratio is preferably equal to or more than 60%. Further, the reflection ratio of the bonding pad electrode 120 is more preferably equal to or more than 80%, and further more preferably equal to or more than 90%. The reflection ratio can be relatively easily measured by a spectrophotometer and so on. However, since the bonding pad electrode 120 itself has a small area, it is difficult to measure the reflection ratio. Accordingly, for example, a "dummy substrate" which is made of transparent glass and has a larger area may be put into a chamber for forming the bonding pad electrode, and the same bonding pad electrode may be formed on the dummy substrate while the bonding pad electrode is formed, so that the reflection ratio of the bonding pad electrode formed on the dummy substrate may be measured.

As for the area of the bonding pad electrode 120, it is preferable that the bonding pad electrode 120 have a larger area to facilitate the bonding work, but this interferes with the extraction of the light as the area of the bonding pad electrode 120 becomes larger. Specifically, for example, if the area of the bonding pad electrode 120 exceeds a half of the area on the transparent electrode 109, it interferes with the extraction of the light, and thus the output deteriorates remarkably. By contrast, if the area of the bonding pad electrode 120 is too small, it becomes difficult to perform the bonding work, and thus the yield of the product deteriorates. Accordingly, the area of the bonding pad electrode 120 is preferably somewhat larger than the diameter of a bonding ball, and specifically in a roughly circular shape of which the upper surface's diameter is about 100 μm and of which the diameter becomes larger toward the side of the transparent protection film 10a.

<Metal Reflection Layer>

The metal reflection layer 117 is formed to cover the junction layer 110. Also, on the outer circumference portion of the metal reflection layer 117, an slope 117c, which is made gradually thinner toward the outside, is formed. Accordingly, the metal reflection layer 117 is formed to completely cover the forefront end portion of the transparent protection film 10a of the slope 110c of the junction layer 110, that is, a boundary portion of the junction layer 110 that makes a contour-line as seen from a plane. That is, as seen from a plane, the metal reflection layer 117 is formed to cover the junction layer 110 and further to project up to the outside of the junction layer 110, and thus no portion of the junction layer 110 is exposed from the lower part of the metal reflection layer 117.

The metal reflection layer 117 illustrated in FIG. 14 is made of preferably a metal having a high reflection ratio, and more preferably a platinum group metal, such as Ru, Rh, Pd, Os, Ir, Pt, Al, Ag, Ti, or an alloy including at least one kind of these metals. By forming the metal reflection layer 117 with one of the above-described materials, the light from light-emitting layer 105 can be effectively reflected. Among them, Al, Ag, Pt, or an alloy including at least one kind of these metals is superior on the point that it is easy to obtain and easy to handle. Also, Rh, Pd, Ir, Pt, or an alloy including at least one kind of these metals is appropriately used as the metal reflection layer 117 in view of its light reflection.

Also, it is preferable that the metal reflection layer 117 have a maximum thickness that is larger than the maximum thickness of the junction layer 110. By making the maximum thickness of the metal reflection layer 117 larger than the maximum thickness of the junction layer 110, the junction layer 110 is covered by the metal reflection layer 117 more reliably and completely.

Also, the maximum thickness of the metal reflection layer 117 is preferably 20 to 3000 nm. If the metal reflection layer 117 is thinner than this thickness range, a sufficient reflection effect may not be obtained. If the metal reflection layer 117 is thicker than the thickness range, any special advantage is not obtained, but only the processing time is lengthened with the waste of materials. The thickness of the metal reflection layer 117 is more preferably 50 to 1000 nm, and most preferably 100 to 500 nm.

<Bonding Layer>

The bonding layer 119 is formed to cover the metal reflection layer 117. Also, on the outer circumference portion of the bonding layer 119 (the outer circumference portion 120*d* of the bonding pad electrode 120), an slope 119*c*, which is made gradually thinner toward the outside, is formed. Accordingly, the bonding layer 119 is formed to completely cover the forefront end portion of the transparent protection film 10*a* of the slope 117*c* of the metal reflection layer 117, that is, a boundary portion of the metal reflection layer 117 that makes a contour-line as seen from a plane. That is, as seen from a plane, the bonding layer 119 is formed to cover the metal reflection layer 117 and further to project up to the outside of the metal projection layer 117, and thus no portion of the metal reflection layer 117 is exposed from the lower part of the bonding layer 119.

It is preferable that the bonding layer 119 as illustrated in FIG. 14 be made of Au, Al, or an alloy including at least one kind of these metals. Au and Al are metals having good adhesion with gold balls, which are often used as bonding balls, and by using Au, Al, or an alloy including at least one kind of these metals as the bonding layer 119, the bonding layer 119 has superior adhesion with the bonding wires. Among them, Au is particularly preferable.

Also, it is preferable that the bonding layer 119 be formed so that the maximum thickness of the bonding layer 119 is larger than that of the junction layer 110 and the metal reflection layer 117. By making the maximum thickness of the bonding layer 119 larger than that of the junction layer 110 and the metal reflection layer 117, the metal reflection layer 117 is covered by the bonding layer 119 more certainly and completely.

Also, the maximum thickness of the bonding layer 119 is preferably equal to or more than 50 nm and equal to or less than 2000 nm, and more preferably equal to or more than 100 nm and equal to or less than 1500 nm. If the maximum thickness of the bonding layer 119 is too thin, the adhesion with the bonding balls becomes insufficient, while if the maximum thickness of the bonding layer 119 is too thick, any special advantage is not obtained, but only the cost is increased.

<Barrier Layer>

The barrier layer is arranged between the metal reflection layer 117 and the bonding layer 119, and reinforces the strength of the entire bonding pad electrode 120. The barrier layer is made of a relatively strong metal material or is sufficiently thick. As a material of the barrier layer, Ti, Cr, Al, or the like, may be used, but it is preferable to use Ti having superior strength. Also, the maximum thickness of the barrier layer is preferably 20 to 3000 nm. If the barrier layer is too thin, a sufficient strength reinforcement effect is not obtained, while if the barrier layer is too thick, no special advantage is obtained, but only the cost is increased. The thickness of the barrier layer is more preferably 50 to 1000 nm, and most preferable 100 to 500 nm.

In this case, if the metal reflection layer 117 is mechanically strong, it is not surely necessary to form the barrier layer. For example, in the case where the metal reflection layer 117 is made of Al or Pt, the barrier layer is not surely necessary.

[Transparent Protection Film]

The transparent protection film 10*a* is to protect the transparent electrode 109 and the junction layer 110. The transparent protection film 10*a*, as illustrated in FIGS. 14 and 15, is formed to cover an area where the junction recess portion 109*a* is not formed on the upper surface 109*c* of the transparent electrode 109, and an area where the junction recess portion 109*a* is formed becomes the opening 10*d*. In this embodiment, as illustrated in FIG. 17, the junction layer 110 is formed to be in contact with the inner wall surface of the opening 10*d*, and an outer edge portion of the junction layer 110 is arranged to be in contact with the transparent protection film 10*a*. By the transparent protection film 10*a*, the portion that is in contact with the transparent protection film 10*a* of the junction layer 110 is prevented from being in contact with air or moisture. Also, in this embodiment, as illustrated in FIG. 17, outer edge portions of the metal reflection layer 117 and the boding layer 119 which constitute the bonding pad electrode 120 are arranged to be in contact with the transparent protection film 10*a*, and the entire outer surface of the junction layer 110 that is not in contact with the transparent electrode 109 is surrounded by the transparent protection film 10*a* and the bonding pad electrode 120, so that the junction layer 110 is effectively prevented from being in contact with air or moisture.

The transparent protection film 10*a* is made of preferably a material which is transparent and has superior adhesion with the respective layers of the transparent electrode 109, the junction layer 110, and the boding pad electrode 120, and more particularly $SiO_2$.

The thickness of the transparent protection film 10*a* is preferably 20 to 500 nm, and more preferably 50 to 300 nm. If the thickness of the transparent protection film 10*a* is less than this thickness range, a sufficient effect of protecting the transparent electrode 109 and the junction layer 110 may not be obtained. Also, if the thickness of the transparent protective film 10*a* exceeds the thickness range, transparency deteriorates, and a trouble may occur in extracting the light. Also, if the thickness of the transparent protective film 10*a* exceeds the thickness range, the depth that is obtained by adding the depth of the opening 10*d* and the depth of the junction recess portion 109*a* is increased, and this may cause a trouble in adhesion between the inner wall surface of the opening 10*d* and the junction layer 110.

[Edge Portion Protection Film]

The edge portion protection film 10*b* prevents the junction layer 110 from being in contact with air or moisture and prevents the bonding pad electrode 120 from peeling off from the semiconductor light-emitting element 1 to improve the junction strength of the bonding pad electrode 120. The edge portion protection film 10*b*, as illustrated in FIG. 15, is roughly in the form of a donut that exposes the center portion of the bonding pad electrode 120 as seen from the plane. Also, the edge portion protection film 10*b*, as illustrated in FIGS. 15 and 17, is arranged over a juncture portion of the outer edge portion (contour-line) of the bonding pad electrode 120 and the transparent protective film 10a, and covers the outer edge portion of the bonding pad electrode 120 as seen from the plane. Accordingly, in this embodiment, as illustrated in FIG. 17, the outer edge portion of the bonding pad electrode 120 is inserted between the transparent protective film 10a and the edge portion protection film 10b.

As the area of the edge portion protection film 10b becomes wider around the boundary portion of the bonding pad electrode 120 and the transparent protective film 10a, the effect obtained by installing the edge portion protection film 10b becomes greater. However, if the area of the edge portion protection film 10b is widened, the area of the bonding pad electrode 120 that is exposed from the edge portion protection film 10b becomes smaller, and this may cause trouble in workability of the bonding work. Also, the edge portion protection film 10b may deteriorate transparency of the area where the bonding pad electrode 120 is not formed to cause trouble in extracting the light. Accordingly, it is preferable that the edge portion protection film 10b completely cover the boundary portions of the bonding pad electrode 120 and the transparent protective film 10a, and completely exposes the top head portion of the bonding pad electrode 120. Specifically, it is preferable that the edge portion protection film 10b have a width of 5 to 10 μm around the boundary portion of the bonding pad electrode 120 and the edge portion protection film 10b.

The edge portion protection film 10b is transparent, and is made of preferably a material having superior adhesion between the transparent protective film 10a and the bonding pad electrode 120, and more preferably the same material as the transparent protective film 10a. Specifically, the transparent protective film 10a and the edge portion protection film 10b may be made of $SiO_2$. In the case where the edge portion protection film 10b and the transparent protective film 10a are formed of the same material, the adhesion between the edge portion protection film 10b and the transparent protective film 10a becomes remarkably good, and thus the effect obtained by installing the edge portion protection film 10b can be much more improved.

Embodiment 12

Figure 26:
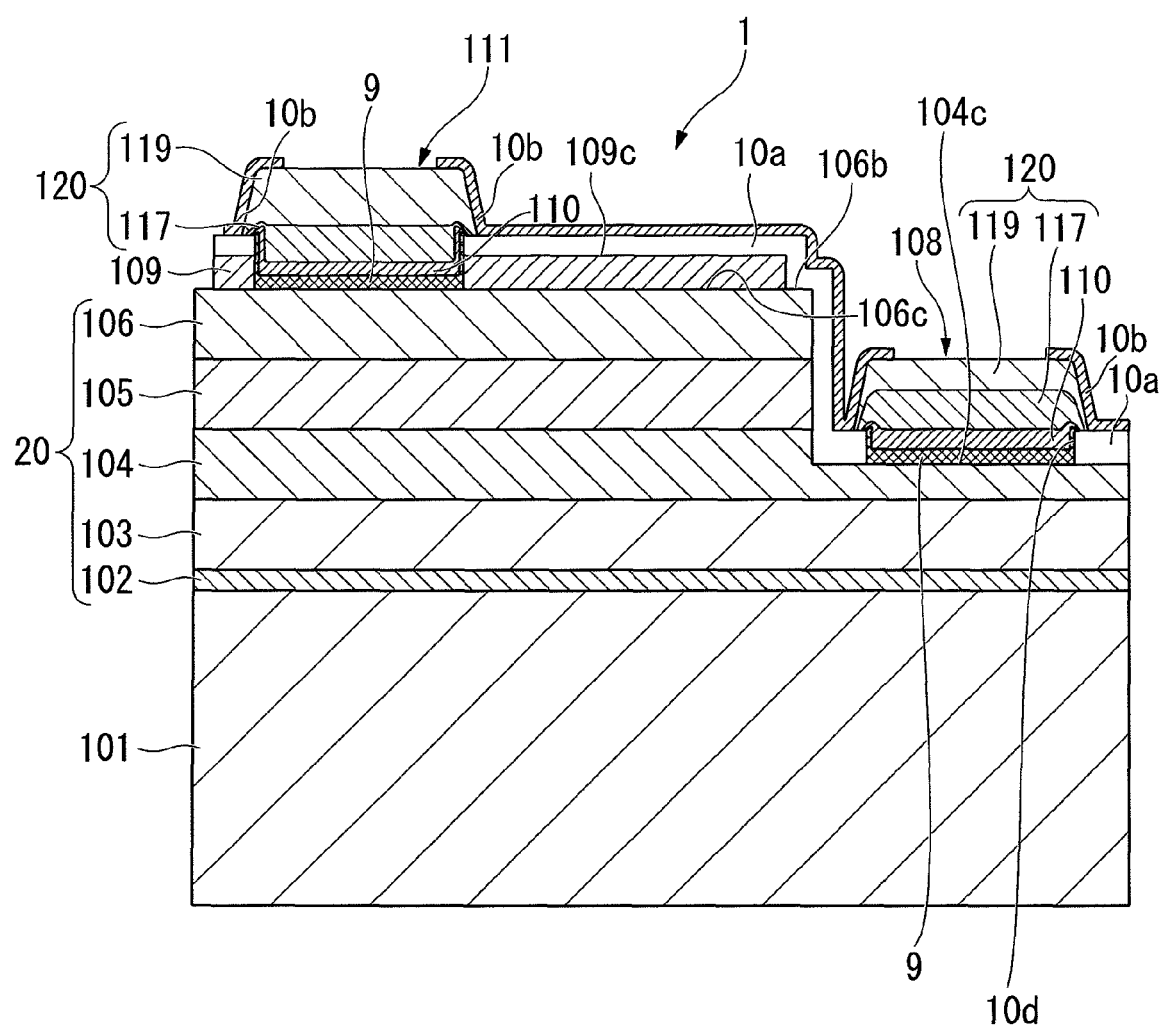
FIG. 26 is a view illustrating an example of a semiconductor light-emitting element according to the present invention, and a schematic cross-sectional view of the semiconductor light-emitting element.
Figure 27:
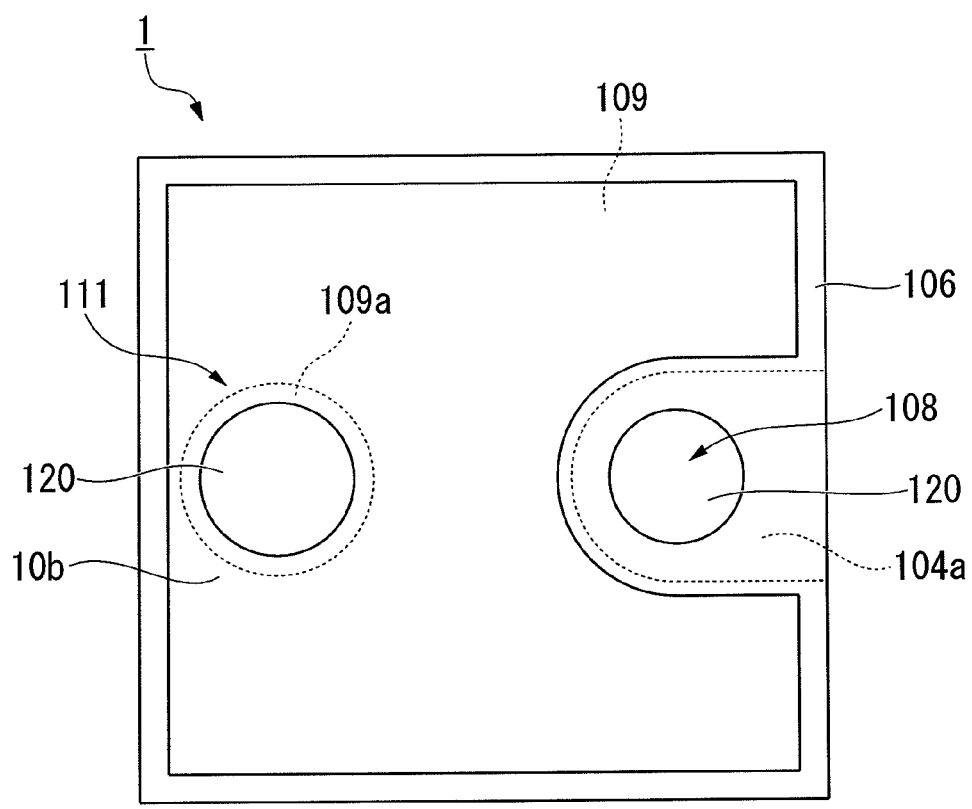
FIG. 27 is a schematic plan view of a semiconductor light-emitting element illustrated in FIG. 26.
Figure 28:
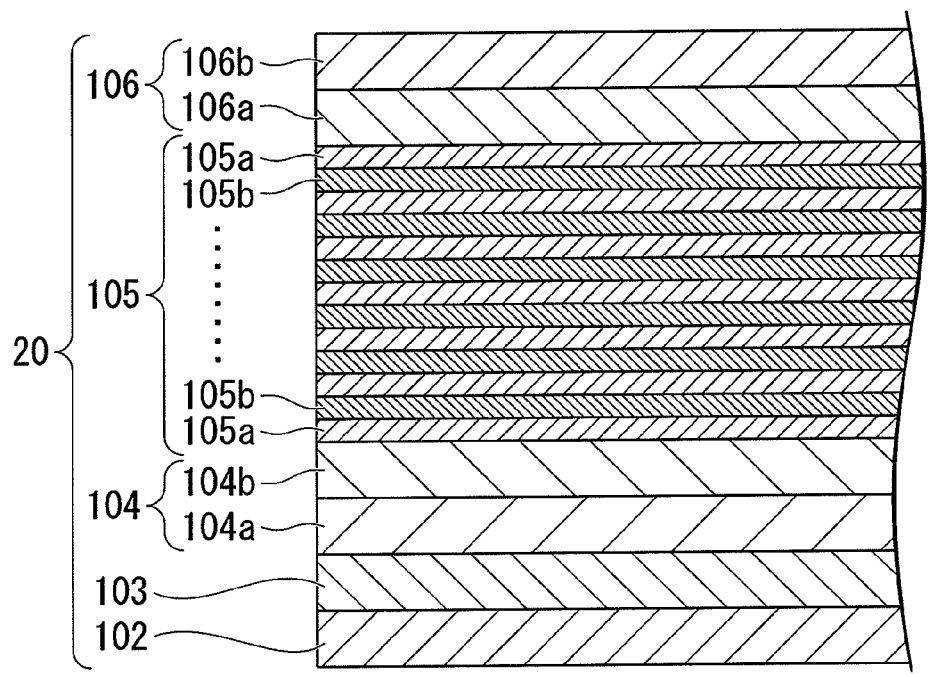
FIG. 28 is a schematic enlarged cross-sectional view of a laminated semiconductor layer constituting a semiconductor light-emitting element illustrated in FIG. 26.
Figure 29:
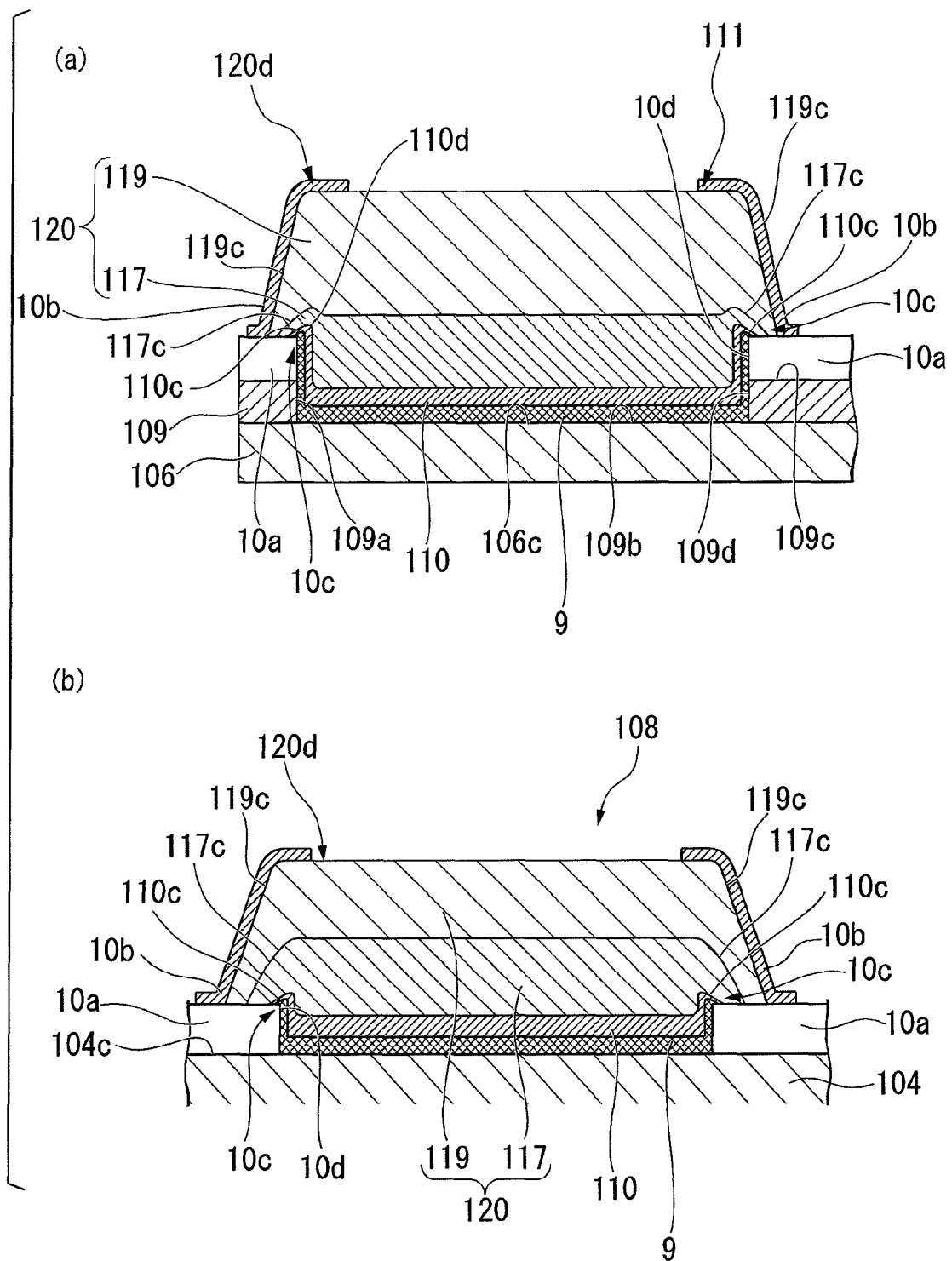
FIG. 29 is a view illustrating an electrode constituting a semiconductor light-emitting element illustrated in FIG. 26.

FIGS. 26 to 29 are views illustrating an example of a semiconductor light-emitting element according to an embodiment of the present invention. FIG. 26 is a schematic cross-sectional view of the semiconductor light-emitting element, and FIG. 27 is a schematic plan view of a semiconductor light-emitting element illustrated in FIG. 26. FIG. 28 is a schematic enlarged cross-sectional view of a laminated semiconductor layer constituting a semiconductor light-emitting element illustrated in FIG. 26. FIG. 29 is a view illustrating an electrode constituting a semiconductor light-emitting element illustrated in FIG. 26, and FIG. 29(a) is a schematic enlarged cross-sectional view of a p-type electrode, and FIG. 29(b) is a schematic enlarged cross-sectional view of an n-type electrode.

As illustrated in FIG. 26, a semiconductor light-emitting element 1 according to this embodiment includes a substrate 101, a laminated semiconductor layer 20 formed on the substrate 101, a p-type electrode 111 (one electrode) formed on an upper surface 106c of the laminated semiconductor layer 20, and an n-type electrode 108 (the other electrode) formed on an exposed surface 104c (the exposed surface of the semiconductor layer), from which the laminated semiconductor layer 20 is partially cut off.

As illustrated in FIG. 26, the laminated semiconductor layer 20 is formed by laminating in order an n-type semiconductor layer 104, a light-emitting layer 105, and a p-type semiconductor layer 106 on the substrate 101. The semiconductor light-emitting element 1 according to this embodiment is configured to obtain light emitted from the light-emitting layer 105 by applying a voltage between the p-type electrode 111 and the n-type electrode 108 to make current pass therethrough. Also, the semiconductor light-emitting element 1 according to this embodiment is a face up mount type light-emitting element which extracts the light from the side on which the p-type electrode 111 is formed.

The semiconductor light-emitting element according to Embodiment 12 basically has a different configuration in that the electrode is installed on the upper surface of the laminated semiconductor layer 20 in comparison to the semiconductor light-emitting element according to Embodiment 1.

That is, Embodiment 12 provides a structure of a semiconductor light-emitting element which is so configured that any one or both of the one electrode and the other electrode include an ohmic junction layer formed in contact with the upper surface of the laminated semiconductor layer or the exposed surface of the semiconductor layer, a junction layer formed on the ohmic junction layer, and a bonding pad electrode formed to cover the junction layer.

Accordingly, in the semiconductor light-emitting element according to Embodiment 12, the substrate that constitutes the semiconductor light-emitting element and the laminated semiconductor layer having the light-emitting layer can be configured in a range equal to that in Embodiment 1 or Embodiment 7.

Hereafter, the feature that is different from the configuration of the semiconductor light-emitting element according to Embodiment 1 or Embodiment 7 will be described in detail.

<P-Type Electrode>

The p-type electrode 111, as illustrated in FIG. 29(a), includes a transparent electrode 109, an ohmic junction layer 9, a junction layer 110, and a bonding pad electrode 120. As illustrated in FIG. 29(a), on the bottom surface 109b of the transparent electrode 109, a hole portion 109a that exposes the upper surface 106c of the laminated semiconductor layer 20 is installed. Also, as illustrated in FIGS. 26 and 29(a), on an area where the hole portion 109a is not formed on the upper surface 109c of the transparent electrode 109, a protection film 10a is formed to cover the transparent electrode 109. In other words, the area where the hole portion 109a is formed corresponds to the opening 10d formed by opening a portion of the protection film 10a. Also, on the upper surface 106c of the laminated semiconductor layer 20 that is exposed from the opening 10d (the bottom surface 109b of the hole portion 109a), the ohmic junction layer 9 is formed, and an ohmic junction is formed between the ohmic junction layer 9 and the upper surface 106c of the laminated semiconductor layer 20. Also, as illustrated in FIG. 29(a), on the ohmic junction layer 9, the junction layer 110 is formed to cover the ohmic junction layer 9, and on the junction layer 110, the bonding pad electrode 120 is formed to cover the junction layer 110.

<N-Type Electrode>

As illustrated in FIG. 26, the n-type electrode 108 is formed on the exposed surface 104c of the n-type semiconductor layer 104. The exposed surface 104c of the n-type semiconductor layer 104 is formed by partially cutting off and removing the light-emitting layer 105 and the p-type semiconductor layer 106 by a means such as etching. As illustrated in FIGS. 26 and 29(b), on the exposed surface 104c of the n-type semiconductor layer 104, the protection film 10a having the opening 10d is formed. Also, on the exposed surface 104c of the n-type semiconductor layer 104 that is exposed from the opening 10*d*, the ohmic junction layer 9 is formed, and an ohmic junction is formed between the ohmic junction layer 9 and the n-type semiconductor layer 104. Also, as illustrated in FIG. 29(*b*), on the ohmic junction layer 9, the junction layer 110 is formed to cover the ohmic junction layer 9, and on the junction layer 110, the bonding pad electrode 120 is formed to cover the junction layer 110. Accordingly, the n-type electrode 108 is equal to the p-type electrode 111 except that the transparent electrode 109 is not installed.

Also, in this embodiment, as illustrated in FIG. 29, the ohmic junction layer 9 constituting the p-type electrode 111 and the n-type electrode 108, the outer edge portion of the junction layer 110, and the outer edge portion of the bonding pad electrode 120 (the metal reflection layer 117 and the bonding layer 119) are arranged on the protection film 10*a*. Also, the bonding pad electrode 120 has an slope 119*c*, which is made gradually thinner toward the outside and is provided on the outer circumference portion 120*d* of the bonding pad electrode 120. In the semiconductor light-emitting element 1 according to this embodiment, as illustrated in FIG. 29, the outer edge portion of the bonding pad electrode 120 is covered by the edge portion protection film 10*b*.

[Transparent Electrode]

The transparent electrode 109, as illustrated in FIG. 26, is installed on the upper surface 106*c* of the p-type semiconductor layer 106, and as illustrated in FIG. 29(*a*), is provided with the hole portion 109*a* that is formed on the bottom surface 109*b* of the transparent electrode 109 to expose the upper surface 106*c* of the laminated semiconductor layer 20. The planar shape of the hole portion 109*a* of the transparent electrode 109 may be an arbitrary shape such as circular shape, or polygonal shape, and, although not specifically limited, is preferably a circular shape to make the bonding work easy as illustrated in FIG. 27.

Also, the hole portion 109*a* of the transparent electrode 109 may be formed anywhere on the upper surface 106*c* of the p-type semiconductor layer 106, and is installed corresponding to a position where the ohmic junction layer 9, the junction layer 110, and the bonding pad electrode 120 are formed. For example, it may be formed on a position that is farthest from the n-type electrode 108, or may be formed in the center of the semiconductor light-emitting element 1. However, if the hole portion 109*a* is formed on a position that is too close to the n-type electrode 108, short circuiting may occur between the wires or balls when the wire is bonded to the bonding pad electrode 120 that is formed on the hole portion 109*a*, and thus it is not preferable.

Also, as illustrated in FIGS. 26 and 27, as seen from the plane, the transparent electrode 109 is formed to cover the almost whole surface of the upper surface 106*c* of the p-type semiconductor layer 106. However, the transparent electrode 109 is not limited to such a shape, and may be formed in a lattice shape or in a tree shape at predetermined intervals.

Also, it is preferable that the transparent electrode 109 have a small contact resistance with the p-type semiconductor layer 106, the ohmic junction layer 9, and the junction layer 110. Further, it is preferable that the transparent electrode 109 have a superior light permeability in order to efficiently extract the light from the light-emitting layer 105 toward a side on which the p-type electrode 111 is formed. Also, in order to uniformly diffuse current over the whole surface of the p-type semiconductor layer 106, it is preferable that the transparent electrode 109 have a superior conductivity.

From the above-described contents, it is preferable that the transparent electrode 109 be made of a transparent conductive material selected from the group consisting of any one kind of a conductive oxide including any one kind of In, Zn, Al, Ga, Ti, Bi, Mg, W, Ce, Sn, and Ni, zinc sulfide, and chromium sulfide.

Also, it is preferable that the conductive oxide be ITO (Indium Tin Oxide ($In_2O_3$—$SnO_2$)), IZO (Indium Zinc Oxide ($In_2O_3$—ZnO)), AZO (Aluminum Zinc Oxide (ZnO—$Al_2O_3$)), GZO (Gallium Zinc Oxide (ZnO—$Ga_2O_3$)), fluorine doped tin oxide, titanium oxide, or the like.

Also, it is preferable that the transparent electrode 109 have a crystallized structure from the viewpoint of transparency. In particular, it is preferable that the transparent electrode 109 include a transparent electrode (for example, ITO or IZO) including $In_2O_3$ crystal having a hexagonal crystal structure or a bixbyite structure.

In the case where the transparent electrode 109 is made of a crystallized IZO, it may be the IZO that includes an $In_2O_3$ crystal having a bixbyite crystal structure or the IZO that includes an $In_2O_3$ crystal having a hexagonal crystal structure. In particular, the IZO that includes the $In_2O_3$ crystal having the hexagonal crystal structure is preferable. The crystallized IZO film has good adhesion with the p-type semiconductor layer 106 in comparison to the IZO film in an amorphous state, and thus it is very preferable.

Also, as the IZO film, it is preferable to use a composition that has the lowest resistivity. For example, the ZnO density inside the IZO is preferably in the range of 1 to 20% by mass, and more preferably in the range of 5 to 15% by mass. Particularly, it is preferable that the ZnO density be 10% by mass.

Also, the thickness of the IZO film is preferably in the range of 35 nm to 10000 nm (10 μm) in which low resistivity and high light permeability can be obtained. Further, from a view point of production cost, the thickness of the IZO film is preferably equal to or less than 1000 nm (1 μm).

[Ohmic Junction Layer]

As illustrated in FIG. 29(*a*), the ohmic junction layer 9 constituting the p-type electrode 111 is installed on the upper surface 106*c* of the laminated semiconductor layer 20, and an ohmic junction is formed between the ohmic junction layer 9 and the p-type semiconductor layer 106. Also as illustrated in FIG. 29(*b*), the ohmic junction layer 9 constituting the n-type electrode 108 is installed on the exposed surface 104*c* of the n-type semiconductor layer 104, and an ohmic junction is formed between the ohmic junction layer 9 and the n-type semiconductor layer 104.

Also, as illustrated in FIG. 29(*a*), the ohmic junction layer 9 constituting the p-type electrode 111 is successively formed to cover the upper surface 106*c* of the laminated semiconductor layer 20, the inside of the hole portion 109*a* of the transparent electrode 109, and the end portion 10*c* of the opening 10*d* of the protection film 10*a*. Also, as illustrated in FIG. 29(*b*), the ohmic junction layer 9 constituting the n-type electrode 108 is successively formed to cover the exposed surface 104*c* of the n-type semiconductor layer 104 and the end portion 10*c* of the opening 10*d* of the protection film 10*a*.

Also, the thickness of the ohmic junction layer 9 is roughly uniform on the inside of the opening 10*d* of the protection film 10*a* and the inner wall surface of the opening 10*d*. Also, on the outside of the opening 10*d*, the thickness of the ohmic junction layer 9 is gradually thinner toward the outside, and thus an slope is formed on the outer circumference portion of the ohmic junction layer 9.

It is preferable that the ohmic junction layer 9 have a small contact resistance with the p-type semiconductor layer 106, the n-type semiconductor layer 104, or the junction layer 110. Also, it is preferable that the ohmic junction layer 9 have a superior light permeability in order to efficiently extract the light from the light-emitting layer 105 to the side on which the p-type electrode 111 is formed. From the above-described contents, as the material of the ohmic junction layer 9, the same material as the transparent electrode 109 can be preferably used.

Also, it is preferable to use the ohmic junction layer 9 that has a crystallized structure in view of the adhesion or transparency with the junction layer 110. In particular, it is preferable to use the transparent electrode (for example, ITO or IZO) that includes the $In_2O_3$ crystal having a hexagonal crystal structure or a bixbyite structure.

In the case where the ohmic junction layer 9 is made of a crystallized IZO, in the same manner as the transparent electrode 109, it may be the IZO that includes the $In_2O_3$ crystal having a hexagonal crystal structure or the IZO that includes the $In_2O_3$ crystal having a bixbyite structure. In particular, the IZO that includes the $In_2O_3$ crystal having a hexagonal crystal structure is preferable. Since the crystallized IZO film has good adhesion with the junction layer 110 or the p-type semiconductor layer 106 in comparison to the IZO film in an amorphous state, it is greatly preferable.

Also, it is preferable that the thickness of the ohmic junction layer 9 be in the range of 2 nm to 300 nm, a range within which it is difficult to break, sufficient strength is obtained, and low resistivity and high light permeability can be obtained, and more preferably in the range of 50 nm to 250 nm.

[Junction Layer]

The junction layer 110 is laminated between the ohmic junction layer 9 and the bonding pad electrode 120 in order to improve the junction strength of the bonding pad electrode 120 against the ohmic junction layer 9.

As illustrated in FIG. 29(*a*), the junction layer 110 constituting the p-type electrode 111 is successively formed in the form of a concave portion to cover the ohmic junction layer 9 and the end portion 10*c* of the opening 10*d* of the protection film 10*a*. By this, high adhesion with the ohmic junction layer 9, the protection film 10*a*, and the junction layer 110 is obtained. Also, as illustrated in FIG. 29(*b*), the junction layer 110 constituting the n-type electrode 108 is successively formed in the form of a concave portion to cover the ohmic junction layer 9 and the end portion 10*c* of the opening 10*d* of the protection film 10*a*. By this, high adhesion with the ohmic junction layer 9, the protection film 10*a*, and the junction layer 110 is obtained.

Also, the thickness of the junction layer 110 is roughly uniform on the inside of the opening 10*d* of the protection film 10*a* and the inner wall surface of the opening 10*d*. Also, on the outside of the opening 10*d*, the junction layer is made gradually thinner toward the outside, and thus an slope 110*c* is formed on the outer circumference 110*d* of the junction layer 110.

It is preferable that the junction layer 110 have transparency. In the case where the junction layer 110 has transparency, the light emitted from the light-emitting layer 105 to the bonding pad electrode 120 in the p-type electrode 111 can be transmitted through the junction layer 110 without loss. More specifically, in the case where the junction layer 110 has transparency, a portion of the light from the light-emitting layer 105 is transmitted through the ohmic junction layer 9 and the junction layer 110 constituting the p-type electrode 111, and then is reflected by the bonding pad electrode 120 (in this embodiment, the metal reflection layer 117) in the interface of the junction layer 110 and the bonding pad electrode 120. The light reflected by the bonding pad electrode 120 of the p-type electrode 111 is introduced into the inside of the laminated semiconductor layer 20 again, repeats transmission and reflection, and then is extracted from a place except for the area where the bonding pad electrode 120 of the p-type electrode 111 is formed to the outside of the semiconductor light-emitting element 1. Accordingly, in the case where the junction layer 110 constituting the p-type electrode 111 has transparency, the light from the light-emitting layer 105 can be more efficiently extracted to the outside of the semiconductor light-emitting element 1.

It is preferable that the junction layer 110 be made of at least one kind of element selected from the group consisting of Al, Ti, V, Cr, Mn, Co, Zn, Ge, Zr, Nb, Mo, Ru, Hf, Ta, W, Re, Rh, Ir, and Ni. Accordingly, by making the junction layer 110 with the above-described materials, junction strength of the bonding pad electrode 120 against the ohmic junction layer 9 can be improved, and transparency can be achieved. The junction layer 110 is made of preferably at least one kind of element selected from the group consisting of Cr, Ti, W, Mo, Zr, Hf, Co, Rh, Ir, and Ni, and more preferably at least one kind of element selected from the group consisting of Cr, Ti, W, Mo, Rh, Co, and Ni. In particular, by using a metal such as Cr, Ti, Mo, Ni, Co, or the like, as the material of the junction layer 110, junction strength of the bonding pad electrode 120 against the ohmic junction layer 9 can be especially increased.

Also, in the case where, for example, the ohmic junction layer 9 is made of a metal oxide, such as IZO, ITO, or the like, and the bonding pad electrode 120 is made of Ag, Al, or the like, as materials of the junction layer 110, it is especially preferable to use Cr, from which a superior junction property is obtained, with respect to both the metal oxide and the Ag and Al.

Also, it is preferable that the junction layer 110 be a thin film of which the maximum thickness is equal to or more than 10 Å and equal to or less than 400 Å. By making the maximum thickness of the junction layer 110 within the above-described range, superior transparency is obtained and thus the light from the light-emitting layer 105 can be effectively transmitted without shielding. In this case, if the maximum thickness becomes less than 10 Å, the strength of the junction layer 110 is lowered, and thus the junction strength of the bonding pad electrode 120 against the ohmic junction layer 9 is lowered to cause a non-preferable result.

[Bonding Pad Electrode]

As illustrated in FIG. 29, the bonding pad electrode 120 is composed of a laminated body in which the metal reflection layer 117 and the bonding layer 119 are laminated in order from the side of the transparent electrode 109. In this case, the bonding pad electrode 120 may be a single-layer structure composed of only the bonding layer 119, a single-layer structure composed of only the metal reflection layer 117, or a three-layer structure that is obtained by inserting a barrier layer between the metal reflection layer 117 and the bonding layer 119. In this case, metal elements, which form the junction layer 110, the metal reflection layer 117, the bonding layer 119, and the barrier layer, may include the same metal element or a combination of different metal elements.

In this embodiment, although the reflection ratio of the bonding pad electrode 120 is greatly changed according to the constituent materials of the metal reflection layer 117, it is preferably equal to or more than 60%. Further, the reflection ratio of the bonding pad electrode 120 is more preferably equal to or more than 80%, and further more preferably equal to or more than 90%. The reflection ratio can be relatively easily measured by a spectrophotometer and so on. However, since the bonding pad electrode 120 itself has a small area, it is difficult to measure the reflection ratio. Accordingly, a "dummy substrate" which is made of glass and has a larger area may be put into a chamber for forming the bonding pad electrode, and the same bonding pad electrode may be formed on the dummy substrate while the bonding pad electrode is formed, so that the reflection ratio of the bonding pad electrode formed on the dummy substrate may be measured.

As the area of the bonding pad electrode 120 becomes larger, the bonding work can be done more easily, and thus it is preferable to do so. However, as the area of the bonding pad electrode 120 of the n-type electrode 108 becomes larger, it is necessary to enlarge the area of the exposed surface 104c of the n-type semiconductor layer 104, and in this case, the area of the light-emitting layer 105 becomes smaller to cause a non-preferable result. Also, if the area of the bonding pad electrode 120 of the p-type electrode 111 becomes larger, the bonding pad electrode 120 interferes with the extraction of the light. Specifically, for example, if the area of the bonding pad electrode 120 exceeds a half of the area on the transparent electrode 109, it interferes with the extraction of the light, and thus the output deteriorates remarkably. By contrast, if the area of the bonding pad electrode 120 is too small, it becomes difficult to perform the bonding work, and thus the yield of the product deteriorates. Accordingly, the area of the bonding pad electrode 120 constituting the p-type electrode 111 and the n-type electrode 108 is preferably somewhat larger than the diameter of a bonding ball, and specifically in a circular shape of which the upper surface's diameter is about 100 μm and of which the diameter becomes larger as it becomes closer to the side of the protection film 10a.

<Metal Reflection Layer>

As illustrated in FIG. 29, the metal reflection layer 117 is formed to cover the junction layer 110. Also, on the outer circumference portion of the metal reflection layer 117, an slope 117c, which is made gradually thinner toward the outside, is formed. Accordingly, the metal reflection layer 117 is formed to completely cover the forefront end portion of the protection film 10a of the slope 110c of the junction layer 110, that is, a boundary portion of the junction layer 110 that makes a contour-line as seen from a plane. That is, as seen from a plane, the metal reflection layer 117 is formed to cover the junction layer 110 and to project up to the outside of the junction layer 110, and thus no portion of the junction layer 110 is exposed from the lower part of the metal reflection layer 117.

The metal reflection layer 117 is made of preferably a metal having a high reflection ratio, and a platinum group metal, such as Ru, Rh, Pd, Os, Ir, Pt, or the like, Al, Ag, Ti, and an alloy including at least one kind of these metals. By forming the metal reflection layer 117 with one of the above-described materials, the light from light-emitting layer 105 in the p-type electrode 111 can be effectively reflected. Among them, Al, Ag, Pt, and an alloy including at least one kind of these metals are superior on the point that it is easy to obtain and easy to handle. Also, Rh, Pd, Ir, Pt, and an alloy including at least one kind of these metals are appropriately used as the metal reflection layer 117 in view of its light reflection.

Also, it is preferable that the metal reflection layer 117 have a maximum thickness that is larger than the maximum thickness of the junction layer 110. By making the maximum thickness of the metal reflection layer 117 larger than the maximum thickness of the junction layer 110, the junction layer 110 is covered by the metal reflection layer 117 more accurately and completely.

Also, the maximum thickness of the metal reflection layer 117 is preferably 20 to 3000 nm. If the metal reflection layer 117 is thinner than this thickness range, a sufficient reflection effect may not be obtained. If the metal reflection layer 117 is thicker than the thickness range, no special advantage is obtained, but only the processing time is lengthened with the waste of materials. The thickness of the metal reflection layer 117 is more preferably 50 to 1000 nm, and most preferably 100 to 500 nm.

<Bonding Layer>

As illustrated in FIG. 29, the bonding layer 119 is formed to cover the metal reflection layer 117. Also, on the outer circumference portion of the bonding layer 119 (that is, the outer circumference portion 120d of the bonding pad electrode 120), an slope 117c, which is made gradually thinner toward the outside, is formed. Accordingly, the bonding layer 119 is formed to completely cover the forefront end portion of the protection film 10a of the slope 117c of the metal reflection layer 117, that is, a boundary portion of the metal reflection layer 117 that makes a contour-line as seen from a plane. That is, as seen from a plane, the bonding layer 119 is formed to cover the metal reflection layer 117 and to project up to the outside of the metal reflection layer 117, and thus no portion of the metal reflection layer 117 is exposed from the lower part of the bonding layer 119.

It is preferable that the bonding layer 119 as illustrated in FIG. 26 be made of Au, Al, or an alloy including at least one kind of these metals. Au and Al are metals having good adhesion with gold balls, which are often used as bonding balls, and by using Au, Al, or an alloy including at least one kind of these metals, the bonding layer 119 has superior adhesion with the bonding wires. Among them, Au is particularly preferable.

Also, it is preferable that the bonding layer 119 be formed so that the maximum thickness of the bonding layer 119 is larger than that of the junction layer 110 and the metal reflection layer 117. By making the maximum thickness of the bonding layer 119 larger than that of the junction layer 110 and the metal reflection layer 117, the junction layer 110 and the metal reflection layer 117 are covered by the bonding layer 119 more accurately and completely.

Also, the maximum thickness of the bonding layer 119 is preferably equal to or more than 50 nm and equal to or less than 2000 nm, and more preferably equal to or more than 100 nm and equal to or less than 1500 nm. If the maximum thickness of the bonding layer 119 is too thin, the adhesion with the bonding balls becomes insufficient, while if the maximum thickness of the bonding layer 119 is thicker than the above-described range, no special advantage is obtained, but only the cost is increased.

[Barrier Layer]

The barrier layer is arranged between the metal reflection layer 117 and the bonding layer 119, and reinforces the strength of the entire bonding pad electrode 120. The barrier layer is made of a relatively strong metal material or is sufficiently thick. As a material of the barrier layer, Ti, Cr, or Al may be used, but it is preferable to use Ti having superior strength. Also, the maximum thickness of the barrier layer is preferably 20 to 3000 nm. If the barrier layer is too thin, a sufficient strength reinforcement effect is not obtained, while if the barrier layer is too thick, no special advantage is not obtained, but only the cost is increased. The thickness of the barrier layer is more preferably 50 to 1000 nm, and most preferably 100 to 500 nm.

In this case, if the metal reflection layer 117 is mechanically strong, it is not necessary to form the barrier layer. For example, in the case where the metal reflection layer 117 is made of Al or Pt, the barrier layer is not surely necessary.

[Protection Film]

The protection film 10a is to protect the transparent electrode 109 and the junction layer 110. The protection film 10a, as illustrated in FIGS. 26 and 27, is formed to cover an area where the hole portion 109a is not formed on the upper surface 109c of the transparent electrode 109 and the exposed surface 104c of the n-type semiconductor layer 104, and an area where the ohmic junction layer 9 of the p-type electrode 111 is formed (area where the hole portion 109a is formed) and an area where the ohmic junction layer 9 of the n-type electrode 108 become the opening 10d.

In this embodiment, as illustrated in FIG. 29, the ohmic junction layer 9 is formed to be in contact with the inner wall surface of the opening 10d, and an outer edge portion of the ohmic junction layer 9 is arranged to be in contact with the protection film 10a. By the protection film 10a, the portion that is in contact with the protection film 10a of the ohmic junction layer 9 is prevented from being in contact with air or moisture.

Also, in this embodiment, as illustrated in FIG. 29, the outer edge portion of the junction layer 110 and the outer edge portions of the metal reflection layer 117 and the boding layer 119 which constitute the bonding pad electrode 120 are arranged to be in contact with the protection film 10a, and the entire outer surface of the junction layer 110 that is not in contact with the ohmic junction layer 9 is surrounded by the protection film 10a and the bonding pad electrode 120, so that the junction layer 110 is effectively prevented from being in contact with air or moisture.

Further, the protection film 10a, as illustrated in FIG. 26, is successively formed on a side surface formed by partially cutting off and removing the light-emitting layer 105 and the p-type semiconductor layer 106 and on a side surface of the transparent electrode 109.

The protection film 10a is made of preferably a material which is transparent and has superior adhesion with the respective layers of the n-type semiconductor layer 104, the transparent electrode 109, the ohmic junction layer 9, the junction layer 110, and the boding pad electrode 120, and more particularly $SiO_2$.

The thickness of the protection film 10a is preferably 20 to 500 nm, and more preferably 50 to 300 nm. If the thickness of the protection film 10a is less than this thickness range, a sufficient effect of protecting the transparent electrode 109, the n-type semiconductor layer 104, the ohmic junction layer 9, and the junction layer 110 may not be obtained. Also, if the thickness of the protection film 10a exceeds the thickness range, transparency deteriorates, and a trouble may occur in extracting the light. Also, if the thickness of the protection film 10a exceeds the thickness range, the depth of the opening 10d is increased, and this may cause a trouble in adhesion between the inner wall surface of the opening 10d and the ohmic junction layer 9.

[Edge Portion Protection Film]

The edge portion protection film 10b prevents the junction layer 110 from being in contact with air or moisture and prevents the bonding pad electrode 120 from peeling off from the semiconductor light-emitting element 1 to improve the junction strength of the bonding pad electrode 120. The edge portion protection film 10b, as illustrated in FIGS. 26 and 27, is formed on the entire area except for the area that exposes the center portion of the bonding pad electrode 120 as seen from the plane. Also, the edge portion protection film 10b, as illustrated in FIGS. 27 and 29, is arranged over a juncture portion of the outer circumference portion (contour-line) of the bonding pad electrode 120 and the protection film 10a, and covers the outer edge portion of the bonding pad electrode 120. Accordingly, in this embodiment, as illustrated in FIG. 29, the outer edge portion of the bonding pad electrode 120 is inserted between the protection film 10a and the edge portion protection film 10b. Further, the edge portion protection film 10b, as illustrated in FIG. 26, is successively formed on the side surface that is formed by partially cutting off and removing a portion of the light-emitting layer 105 and the p-type semiconductor layer 106 and the side surface of the transparent electrode 109 via the protection film 10a.

As the area of the edge portion protection film 10b becomes wider around the boundary portion of the bonding pad electrode 120 and the protection film 10a, the effect obtained by installing the edge portion protection film 10b becomes greater. However, if the area of the edge portion protection film 10b is widened, the area of the bonding pad electrode 120 that is exposed from the edge portion protection film 10b becomes smaller, and this may cause trouble in doing the bonding work. Also, the edge portion protection film 10b may deteriorate transparency of the area where the bonding pad electrode 120 is not formed, causing problems in extracting light. Accordingly, it is preferable that the edge portion protection film 10b completely cover the boundary portions of the bonding pad electrode 120 and the protection film 10a, and exposes the top head portion of the bonding pad electrode 120. Specifically, it is preferable that the edge portion protection film 10b have a width of 2 μm or more around the boundary portion of the bonding pad electrode 120 and the edge portion protection film 10b.

The edge portion protection film 10b is transparent, and is made of preferably a material having superior adhesion between the protection film 10a and the bonding pad electrode 120, and more preferably the same material as the protection film 10a. Specifically, the protection film 10a and the edge portion protection film 10b may be made of $SiO_2$. In the case where the edge portion protection film 10b and the protection film 10a are formed of the same material, the adhesion between the edge portion protection film 10b and the protection film 10a becomes great, and thus the effect obtained by installing the edge portion protection film 10b can be much more improved.

(Method of manufacturing a semiconductor light-emitting element according to Embodiment 1)

Next, an example of a method of manufacturing a semiconductor light-emitting element according to Embodiment 1 of the present invention will be described.

The method of manufacturing a semiconductor light-emitting element according to Embodiment 1 of the present invention includes the steps of forming a laminated semiconductor layer including a light-emitting layer on a substrate, forming an exposed surface of the semiconductor layer by partially cutting off the laminated semiconductor layer, and forming one electrode (one conduction type) and the other electrode (the other conduction type) on an upper surface of the laminated semiconductor layer and the exposed surface of the semiconductor layer, respectively.

The step of forming a laminated semiconductor layer including a light-emitting layer includes a buffer layer forming step, a under-layer forming step, an n-type semiconductor layer forming step, a light-emitting layer forming step, and a p-type semiconductor layer forming step. Further, in an n-type electrode forming step, an n-type electrode is formed. Further, in a p-type electrode forming step, a p-type electrode is formed using a mask forming step and a bonding electrode forming step. In this case, in this Embodiment 1, a transparent electrode forming step is performed in the p-type electrode forming step after the p-type semiconductor forming step.

<Buffer Layer Forming Step>

First, a substrate 101 such as a sapphire substrate or the like is prepared, and a preprocessing of the substrate is performed. The preprocessing may be performed by a method or the like that puts the substrate 101 in a chamber of a sputter device and performs sputtering before forming a buffer layer 102. Specifically, in the chamber, a preprocessing for cleaning an upper surface of the substrate 101 through exposure of the substrate 101 in Ar or $N_2$ plasma may be performed. By applying plasma of Ar gas or $N_2$ gas on the substrate 101, an organic material or oxide attached to the upper surface of the substrate 101 can be removed.

Next, on the upper surface of the substrate 101, a buffer layer 102 is laminated by a sputtering method.

In the case of forming the buffer layer 102 having a monocrystal structure by a sputtering method, it is preferable that the ratio of nitrogen raw material flow rate to the inert gas flow rate in the chamber be 50% to 100%, and preferably 75%.

Also, in the case of forming the buffer layer 102 having a column type crystal (polycrystal) by the sputtering method, it is preferable that the ratio of nitrogen raw material flow rate to the inert gas flow rate in the chamber be 1% to 50%, and preferably 25%. In this case, the buffer layer 102 may also be formed by a MOCVD method in addition to the above-described sputtering method.

<Under-Layer Forming Step>

Next, after the buffer layer is formed, a monocrystal under-layer 103 is formed on the upper surface of the substrate 101 on which the buffer layer 102 is formed. It is preferable that the under-layer 103 be formed using the sputtering method or MOCVD method. In the case of using the sputtering method, it is possible to use the device with a simple construction in comparison to the MOCVD method or MBE method. In the case of forming the under-layer 103 by the sputtering method, it is preferable to form the under-layer using a film-forming method by a reactive sputtering method that circulates a group V raw material such as nitrogen or the like in a reactor.

Generally, in the sputtering method, as a target material has a higher purity, the film quality such as crystallinity of the thin film after the thin film is formed becomes better. In the case of forming the under-layer 103 using the sputtering method, it is possible to use a group III nitride semiconductor as a target material which is a raw material and to perform sputtering by plasma of an inert gas such as an Ar gas. However, in the case of the reactive sputtering method, a III group metal stand-alone that is used as a target material and its mixture can be highly purified in comparison to a group III nitride semiconductor. Accordingly, in the reactive sputtering method, it becomes possible to improve the crystallinity of the under-layer 103.

The temperature of the substrate 101 when the under-layer 103 is formed, that is, the growth temperature of the under-layer 103 is preferably equal to or more than 800° C., more preferably equal to or more than 900° C., and most preferable equal to or more than 1000° C. This is because by heightening the temperature of the substrate 101 when the under-layer 103 is formed, the migration of atoms occurs easily to facilitate the dislocation loop. Also, since it is necessary that the temperature of the substrate 101 when the under-layer 103 is formed is lower than the temperature at which the crystal is dissolved, the temperature of the substrate 101 is preferably less than 1200° C. If the temperature of the substrate 101 when the under-layer 103 is formed is within the above-described temperature range, the under-layer 103 having a good crystallinity is obtained.

<N-Type Semiconductor Layer Forming Step>

After the under-layer 103 is formed, the n-type semiconductor layer 104 is formed by laminating an n-contact layer 104a and an n-clad layer 104b. The n-contact layer 104a and the n-clad layer 104b may be formed by a sputtering method or by a MOCVD method.

<Light Emitting Layer Forming Step>

The light-emitting layer 105 can be formed by any one of the sputtering method and the MOCVD method, and particularly, the MOCVD method is preferable. Specifically, the lamination of a barrier layer 105a and a well layer 105b is alternately repeated, and the barrier layer 105a is arranged in order on the side of the n-type semiconductor layer 104 and on the side of the p-type semiconductor layer 105b.

<P-Type Semiconductor Layer Forming Step>

Also, the p-type semiconductor layer 106 may be formed by any one of the sputtering method and the MOCVD method. Specifically, the p-type semiconductor layer 106 may be formed by sequentially laminating the p-clad layer 106a and the p-contact layer 106b.

<N-Type Electrode Forming Step>

Patterning is performed by a known photolithography method, and a portion of the n-contact layer 104a is exposed by etching a portion of the laminated semiconductor layer 20 in a specified area. Next, the n-type electrode 108 is formed on the exposed surface 104c of the n-contact layer 104a by the sputtering method or the like.

<P-Type Electrode Forming Step>

The p-type electrode forming step includes a transparent electrode forming step and an electrode forming step.

<Transparent Electrode Forming Step>

The n-type electrode is covered by a mask, and the transparent electrode 109 is formed on the p-type semiconductor layer 106, which has not been removed by etching, using a known method such as the sputtering method or the like.

In this case, before the n-type electrode is formed, the transparent electrode may be formed, the n-contact layer 104a may be formed by etching a portion of the laminated semiconductor layer 20 in the specified area in a state where the transparent electrode has been formed, and then n-type electrode 108 may be formed.

<Electrode Forming Step>

Figure 5:
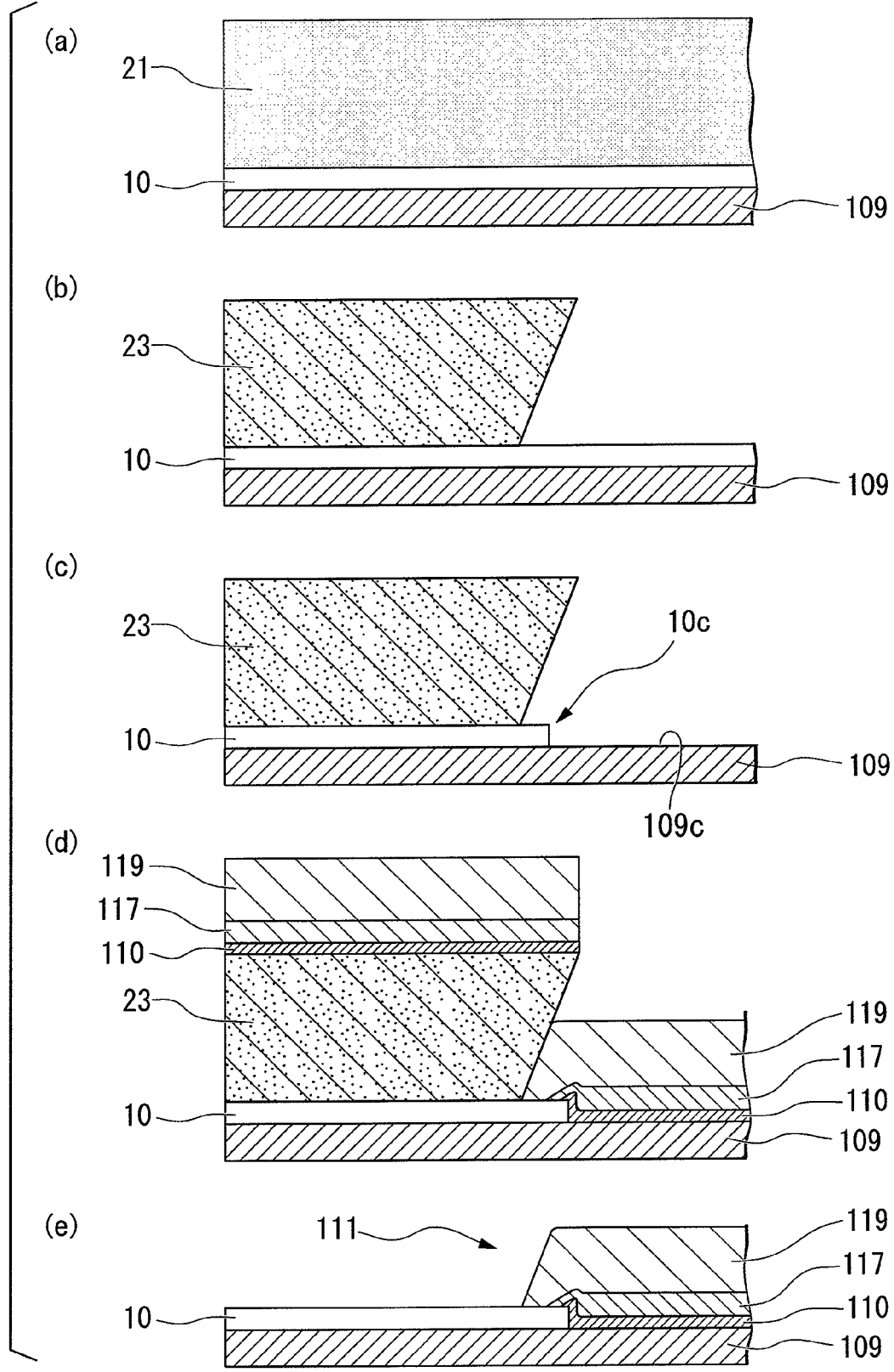
FIG. 5 is an example of a cross-sectional view illustrating a step for a p-type electrode of a semiconductor light-emitting element according to the present invention.

FIG. 5 is a cross-sectional view illustrating an electrode forming step.

The electrode forming step is a step of forming a metal reflection layer to cover a junction layer after forming the junction layer, further forming a bonding layer to cover the metal reflection layer, and making the outer circumference side surfaces of the junction layer, the metal reflection layer, and the bonding layer gradually thinner than the center side thereof to form an slope.

First, a protection film 10 made of $SiO_2$ is formed on the upper surface 109c of the transparent electrode 109, and then, as illustrated in FIG. 5(a), a resist 21 is coated on the protection film 10.

Next, as illustrated in FIG. 5(b), a hardened portion (reverse-tapered mask) 23 composed of reverse-tapered crosslinked polymer is formed by removing the resist 21 on a portion that corresponds to the portion where the bonding pad electrode is formed. As a method of forming a reverse-tapered mask 23, a known method, such as a method using n-type photoresist or a method using image reversion type photoresist, may be used. In this Embodiment 1, a method using image reversion type photoresist will be described.

Figure 6:
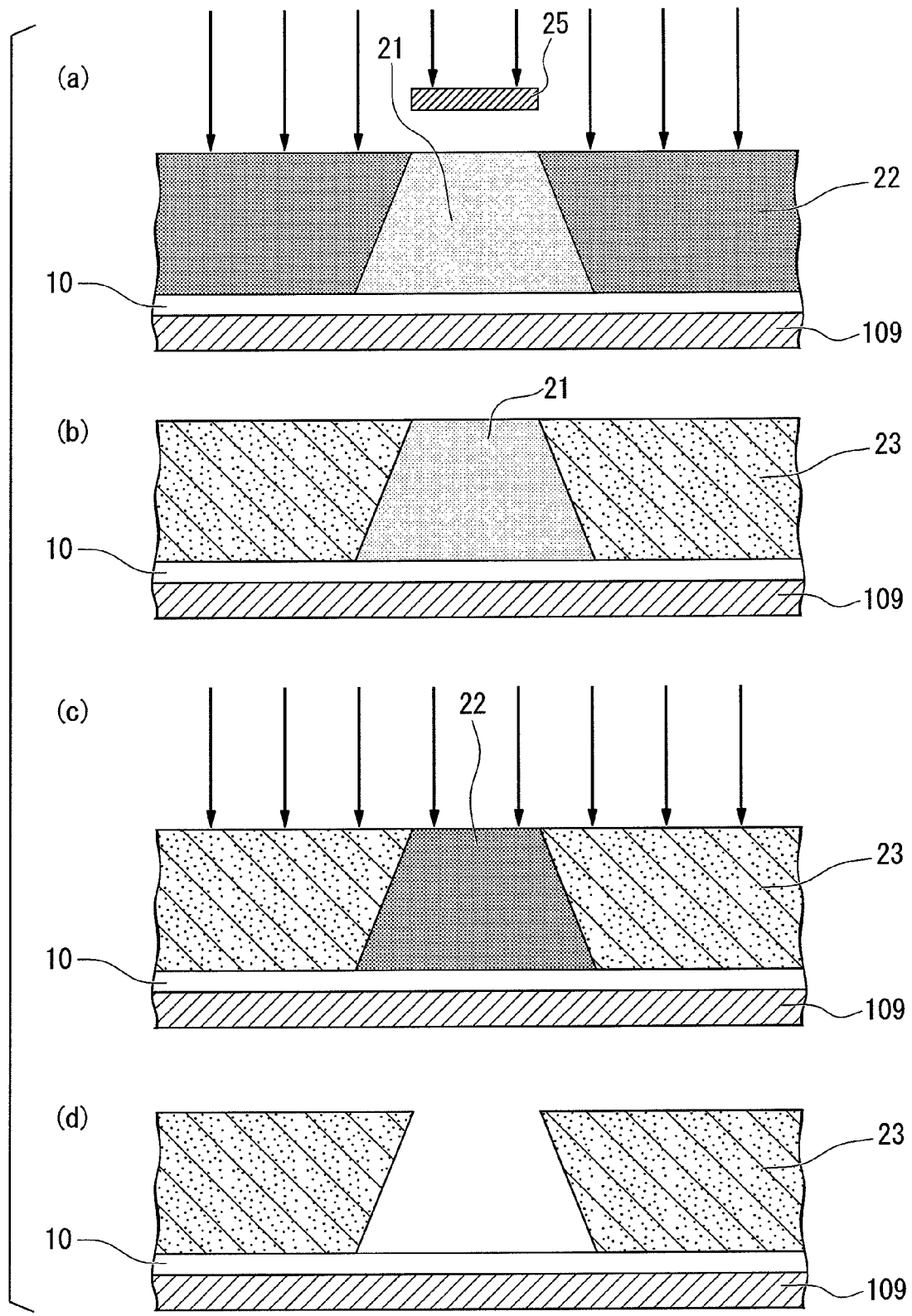
FIG. 6 is an example of a cross-sectional view illustrating a step of forming a mask of a p-type electrode of a semiconductor light-emitting element according to the present invention.

FIG. 6 is a cross-sectional view illustrating a step of forming a reverse-tapered mask illustrated in FIG. 5(b).

<Mask Forming Step>

The mask forming step includes a resist coating step for coating insoluble resist on the transparent electrode and forming a resist, a partial exposing step for forming a soluble portion formed by the exposing and an insoluble portion that remains without being exposed by masking and exposing a portion of the resist, a hardening step for making the soluble portion into a hardened portion by heating, an entire surface exposing step for making the insoluble portion into the soluble portion by exposing the entire surface of the resist, and a peel-off step for peeling off the soluble portion by soaking the resist in a resist peel-off solution.

<Resist Coating Step>

First, a resist 21 is formed by coating insoluble resist on the protection film 10 on the transparent electrode 109 and drying the coated resist. As the image reversion type photoresist, for example, AZ5200NJ (product name: product of AZ Electronic Materials) may be used.

<Partial Exposing Step>

Next, as seen from the cross-section, as illustrated in FIG. 6(a), a mask 25 is arranged to cover the position where an electrode is formed on the upper surface of the resist 21, and light of a predetermined intensity and wavelength is radiated from the side of the mask 25 to the side of the substrate 1 as indicated by arrows, so that an optical reaction of the resist 21 on a portion, to which the light is radiated, occurs to form a soluble resist (soluble portion) 22.

Since this optical reaction progresses in accordance with the intensity of light, the light reaction progresses fast on the light irradiation surface side, and the light reaction progresses slowly on the side of the transparent electrode 109. Due to this, the soluble resist (soluble portion) 22, as seen from the cross-section, as illustrated in FIG. 6(a), is formed to be in a reverse-tapered shape (reversely inclined shape), in which the side surface of the portion covered by the mask 25 (position in which the electrode is formed) is inwardly receded toward the lower side of the portion.

In this case, the resist 21 of the masked portion remains as the insoluble resist (insoluble portion) 21, and as seen from the cross-section, is formed to be in a tapered shape (inclined shape), in which the side surface of the resist 21 is inwardly receded toward the upper side of the resist 21.

<Hardening Step>

Next, for example, using a hot plate or an oven, the substrate 1 is heated, and as illustrated in FIG. 6(b), the soluble resist 22 is crosslinked by the thermal reaction to form the hardened portion 23 composed of crosslinked polymer.

<Entire Surface Exposing Step>

Next, as illustrated in FIG. 6(c), as the light is radiated onto the insoluble resist (insoluble portion) 21 and the surface side of the hardened portion 23 composed of the crosslinked polymer without using a mask, an optical reaction of the insoluble resist (insoluble portion) 21, which has not been transformed into the soluble resist 22, occurs to form the soluble resist (soluble portion) 22.

<Pill-Off Step>

Lastly, by dissolving and removing the soluble resist (soluble portion) 22 using a predetermined developing solution, as illustrated in FIG. 6(d), a reverse-tapered shape (reversely inclined shape), in which the side surface of the hardened portion 23 is inwardly receded toward the lower side of the portion, that is, the reverse-tapered hardened portion (reverse-tapered mask) 23 composed of crosslinked polymer, can be formed.

Referring again to FIG. 5, as illustrated in FIG. 5(c), by performing RIE (Reactive Ion Etching) of the protection film 10, which includes $SiO_2$ on the upper surface 109c of the transparent electrode 109, in the vertical direction, the protection film 10 on the portion that corresponds to the portion, in which the bonding pad electrode is formed, is removed to expose the upper surface 109c of the transparent electrode 109.

Since the RIE (Reactive Ion Etching) is an etching method which has high directivity and low curvature, the protection film 10 that becomes a shadow from the etching direction is hardly etched and removed, and as illustrated in FIG. 5(c), the end portion 10c of the protection film 10 remains.

Thereafter, it is preferable that the upper surface 109c, from which the transparent electrode 109 is exposed, be wet-etched to form a fresh surface from which impurities or defects can be removed. Accordingly, the adhesion between the upper surface 109c and the junction layer 110 can be improved.

Then, by the sputtering method, the junction layer 110 is formed on the upper surface 109c of the transparent electrode 109 and the hardened portion (reverse-tapered mask) 23 composed of crosslinked polymer. In this case, by using the sputtering method that controls the sputter conditions, the junction layer 110 can be formed with high coverage regardless of the sputter material. Accordingly, the junction layer 110 is almost uniformly formed on the entire surface of the upper surface 109c of the transparent electrode 109 and to cover somewhat a portion of the end portions 10c of the protection film 10.

Next, the metal reflection layer 117 is formed. In this case, in the same manner as the case of forming the junction layer 110, the sputtering method that controls the sputter conditions is used, and thus metal reflection layer 117 can be formed with high coverage regardless of the sputter material. Also, since the metal reflection layer 117 is formed to have a thickness that is larger than the thickness of the junction layer 110, the metal reflection layer 117 is formed to completely cover the junction layer 110.

Next, the bonding layer 119 is formed. In this case, by using the sputtering method that controls the sputter conditions, the bonding layer 119 can be formed with high coverage regardless of the sputter material. Also, since the bonding layer 119 is formed to have a great thickness in comparison to the junction layer 110 and the metal reflection layer 117, as illustrated in FIG. 5(d), the bonding layer 119 is formed to completely cover the metal reflection layer 117.

Lastly, by soaking in a resist peel-off solution, the hardened portion (reverse-tapered mask) 23 composed of crosslinked polymer is peeled off. Accordingly, as illustrated in FIG. 5(e), the p-type electrode 111 having the bonding pad electrode 120 composed of the metal reflection layer 117 and the bonding layer 119 is formed.

As described above, in the bonding electrode forming step, since the junction layer 110, the metal reflection layer 117, and the bonding layer 119 are formed by the sputtering method, layers having different inclination angles can be formed according to the thickness thereof in a portion that becomes a shadow from the sputter direction of the reverse-tapered mask 23. Accordingly, on the outer circumference portions of the junction layer 110 and the bonding pad electrode 120, slopes 110c, 117c, and 119c, which are made gradually thinner toward the outer circumference, can be formed.

In this case, before the junction layer 110 is formed, pre-processing for cleaning the surface of the transparent electrode 109 in the area where the junction layer 110 is formed may be performed. The cleaning method may be a dry process that exposes the transparent electrode to plasma or the like and a wet process that makes the transparent electrode in contact with a chemical solution, and from the viewpoint of convenience in the process, the dry process is preferable.

By performing the above-described processes, the semiconductor light-emitting element 1 as illustrated in FIGS. 1 to 3 is manufactured.

According to a semiconductor light-emitting element 1 according to the present invention, one electrode 111 includes a junction layer 110 and a bonding pad electrode 120 formed to cover the junction layer 110, the bonding pad electrode 120 has a maximum thickness that is thicker than the maximum thickness of the junction layer 110 and includes one or two or more layers, and slopes 110c, 117c, and 119c, which are made gradually thinner toward the outer circumference, are formed in outer circumference portions 110d and 120d of the junction layer 110 and the bonding pad electrode 120. Accordingly, penetration of external air or moisture into the junction layer 110 can be prevented, and thus anticorrosion of the junction layer 110 can be improved to lengthen the life span of the semiconductor light-emitting element.

According to the semiconductor light-emitting element 1 according to the present invention, the junction layer 110 is made of at least one kind of element selected from the group consisting of Al, Ti, V, Cr, Mn, Co, Zn, Ge, Zr, Nb, Mo, Ru, Hf, Ta, W, Re, Rh, Ir, and Ni, and is a thin film of which the maximum thickness is equal to or more than 10 Å and equal to or less than 1000 Å. Accordingly, the junction between the transparent electrode 109 and the bonding pad electrode 120 is improved, and thus the electrode is prevented from peeling off even by the tensile stress occurring during the bonding of the bonding wire.

According to the semiconductor light-emitting element 1 according to the present invention, the bonding pad electrode includes a bonding layer made of Au, Al, or an alloy including any one of these metals, and is a thin film of which the maximum thickness of the bonding layer is equal to or more than 50 nm and equal to or less than 2000 nm. Accordingly, the junction of the wire bonding to the bonding pad electrode 120 is improved, and thus the electrode is prevented from peeling off even by the tensile stress occurring during the bonding of the bonding wire.

According to the semiconductor light-emitting element 1 according to the present invention, the bonding pad electrode 120 includes a metal reflection layer 117 formed to cover the junction layer 110 and a bonding layer 120 formed to cover the metal reflection layer 117, and the metal reflection layer 117 is made of any one of Ag, Al, Ru, Rh, Pd, Os, Ir, Pt, and Ti or an alloy including any one of these metals, and is a thin film of which the maximum thickness is equal to or more than 20 nm and equal to or less than 3000 nm. Accordingly, the junction and anticorrosion properties of the electrode are improved, and thus the light-emitting characteristics of the semiconductor light-emitting element can be improved.

According to the semiconductor light-emitting element 1 according to the present invention, a transparent electrode 109 is formed between the electrode 111 of one conduction type and the upper surface 106c of the laminated semiconductor layer 20, and the transparent electrode 109 is made of a transparent conductive material selected from the group consisting of any one kind of a conductive oxide including any one kind of In, Zn, Al, Ga, Ti, Bi, Mg, W, Ce, Sn, and Ni, zinc sulfide, and chromium sulfide. Accordingly, the junction and anticorrosion properties of the electrode are improved, and thus the light-emitting characteristics of the semiconductor light-emitting element can be improved.

According to the semiconductor light-emitting element 1 according to the present invention, the laminated semiconductor layer 20 is formed by laminating in the order of an n-type semiconductor layer 104, the light-emitting layer 105, and a p-type semiconductor layer 106 from the substrate 101, and the light-emitting layer 105 has a multiple quantum well structure. Accordingly, the junction and anticorrosion properties of the electrode are improved, and thus the light-emitting characteristics of the semiconductor light-emitting element can be improved.

According to the semiconductor light-emitting element 1 according to the present invention, the laminated semiconductor layer 20 includes gallium nitride-based semiconductor as the main body. Accordingly, the junction and anticorrosion properties of the electrode are improved, and thus the light-emitting characteristics of the semiconductor light-emitting element can be improved.

According to an electrode for a semiconductor light-emitting element 1 according to the present invention, at least one of the one electrode 111 or the other electrode 108 includes a junction layer 110 and a bonding pad electrode 120 formed to cover the junction layer 110, the bonding pad electrode 120 has a maximum thickness that is larger than the maximum thickness of the junction layer 110 and includes one or two or more layers, and slopes 110c, 117c, and 119c, which are made gradually thinner toward the outer circumference, are formed in outer circumference portions 110d and 120d of the junction layer 110 and the bonding pad electrode 120. Accordingly, the junction and anticorrosion properties of the electrode are improved.

According to the electrode for a semiconductor light-emitting element 1 according to the present invention, the junction layer 110 is made of at least one kind of element selected from the group consisting of Al, Ti, V, Cr, Mn, Co, Zn, Ge, Zr, Nb, Mo, Ru, Hf, Ta, W, Re, Rh, Ir, and Ni, and is a thin film of which the maximum thickness is equal to or more than 10 Å and equal to or less than 1000 Å. Accordingly, the junction and anticorrosion properties of the electrode are improved.

According to the electrode for a semiconductor light-emitting element 1 according to the present invention, the bonding pad electrode 120 includes a bonding layer 119 made of Au, Al, or an alloy including any one of these metals, and is a thin film of which the maximum thickness of the bonding layer 119 is equal to or more than 50 nm and equal to or less than 2000 nm. Accordingly, the electrode has improved bonding with gold wires and anticorrosion property.

According to the electrode for a semiconductor light-emitting element 1 according to the present invention, the bonding pad electrode 120 includes a metal reflection layer 117 formed to cover the junction layer 110, and a bonding layer 119 formed to cover the metal reflection layer 117, and the metal reflection layer 117 is made of any one of Ag, Al, Ru, Rh, Pd, Os, Ir, Pt, and Ti or an alloy including any one of these metals, and is a thin film of which the maximum thickness is equal to or more than 20 nm and equal to or less than 3000 nm. Accordingly, the light extraction efficiency of the electrode is improved.

According to the electrode for a semiconductor light-emitting element 1 according to an embodiment of the present invention, a transparent electrode 109 is formed between the one electrode 111 and the upper surface 106c of the laminated semiconductor layer 20 or between the other electrode 108 and the exposed surface 104c of the semiconductor layer, and the transparent electrode 109 is made of a transparent conductive material selected from the group consisting of any one kind of a conductive oxide including any one kind of In, Zn, Al, Ga, Ti, Bi, Mg, W, Ce, Sn, and Ni, zinc sulfide, and chromium sulfide. Accordingly, the junction and anticorrosion properties of the electrode are improved.

According to a method of manufacturing a semiconductor light-emitting element according to an embodiment of the present invention, the step of forming the electrodes includes the steps of forming a junction layer 110 on the upper surface 106c of the laminated semiconductor layer 20 after forming a reverse-tapered mask 23 on the upper surface 106c of the laminated semiconductor layer 20, and then forming the one electrode 111 by forming a bonding pad electrode 120, which has a maximum thickness that is larger than the maximum thickness of the junction layer 110, to cover the junction layer 110. Thus, slopes 110c, 117c, and 119c, which are made gradually thinner toward the outer circumference, can be formed in outer circumference portions 110d and 120d of the junction layer 110 and the bonding pad electrode 120. Accordingly, penetration of external air or moisture into the junction layer 110 can be prevented, and thus anticorrosion of the junction layer 110 can be improved to lengthen the life span of the semiconductor light-emitting element.

The method of manufacturing a semiconductor light-emitting element according to an embodiment of the present invention further includes the step of forming a transparent electrode 109 on the upper surface 106c of the laminated semiconductor layer 20 or the exposed surface 104c of the semiconductor layer before the step of forming the electrode. Accordingly, the junction and anticorrosion properties of the electrode are improved, and thus the light-emitting characteristics of the semiconductor light-emitting element can be improved.

According to the method of manufacturing a semiconductor light-emitting element according to an embodiment of the present invention, the step of forming the electrode includes the steps of forming a metal reflection layer 117, which has a maximum thickness that is larger than the maximum thickness of the junction layer 110, to cover the junction layer 110 after forming the reverse-tapered mask 23 and the junction layer 110, and then forming the one electrode 111 by forming a bonding layer 120, which has a maximum thickness that is larger than the maximum thickness of the metal reflection layer 117, to cover the metal reflection layer 117. Thus, slopes 110c, 117c, and 119c, which are made gradually thinner toward the outer circumference, can be formed in outer circumference portions 110d and 120d of the junction layer 110 and the bonding pad electrode 120. Accordingly, penetration of external air or moisture into the junction layer 110 can be prevented, and thus anticorrosion property of the junction layer 110 can be improved to lengthen the life span of the semiconductor light-emitting element.

According to the method of manufacturing a semiconductor light-emitting element according to an embodiment of the present invention, in the bonding electrode forming step, since the junction layer 110, the metal reflection layer 117, and the bonding layer 119 are formed by the sputtering method, layers having different inclination angles can be formed according to the thickness thereof in a portion that becomes a shadow from the sputter direction of the reverse-tapered mask 23. Accordingly, on the outer circumference portions 110d and 120d of the junction layer 110 and the bonding pad electrode 120, slopes 110c, 117c, and 119c, which are made gradually thinner toward the outer circumference, can be formed. Accordingly, penetration of external air or moisture into the junction layer 110 can be prevented, and thus the anticorrosion property of the junction layer 110 can be improved to lengthen the life span of the semiconductor light-emitting element.

According to the method of manufacturing a semiconductor light-emitting element according to an embodiment of the present invention, the protection film 10 is formed on the upper surface 109c of the transparent electrode 109 before the mask forming step, and thus the upper surface of the transparent electrode 109 can be protected.

Embodiment 2

Figure 7:
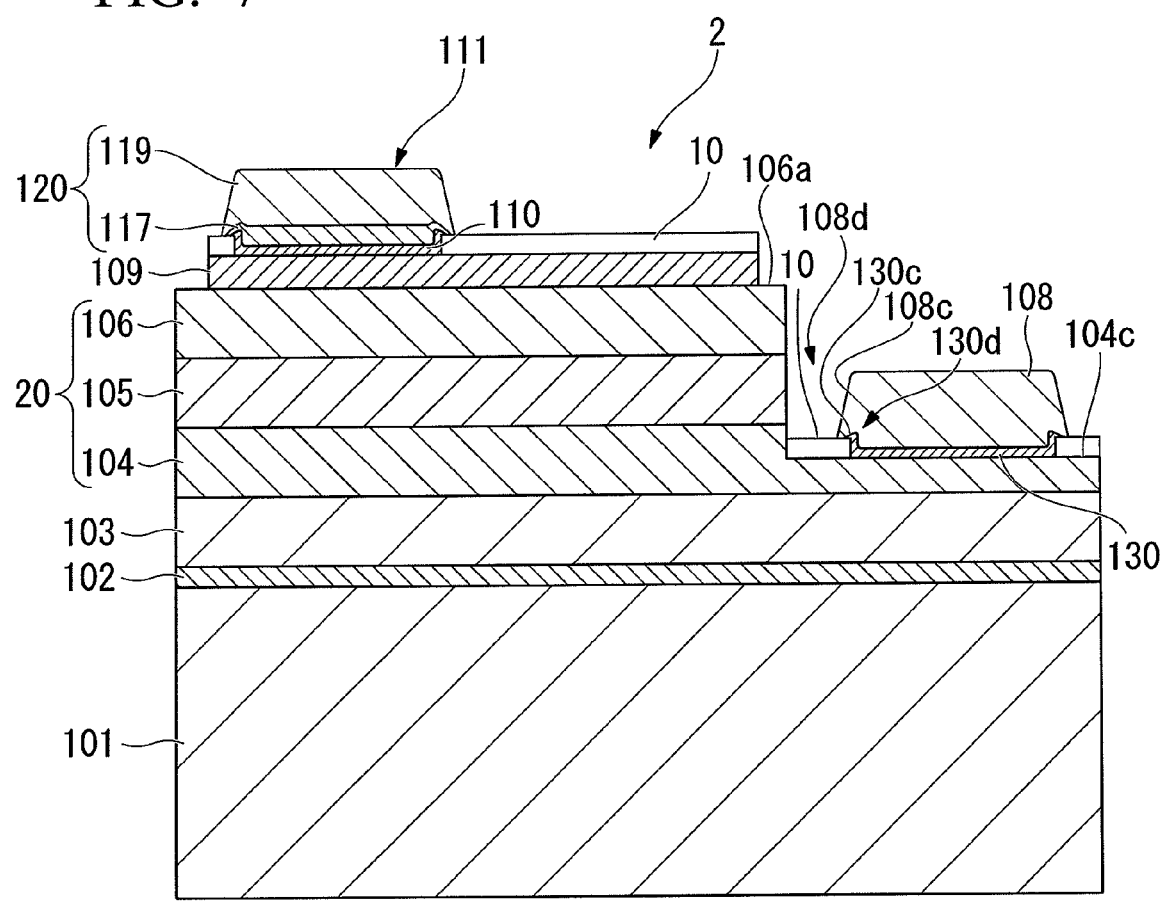
FIG. 7 is an example of a schematic cross-sectional view illustrating a semiconductor light-emitting element according to the present invention.

FIG. 7 is another example of a schematic cross-sectional view illustrating a semiconductor light-emitting element according to another embodiment of the present invention.

As illustrated in FIG. 7, the semiconductor light-emitting element 2 according to this embodiment of the present invention has the same configuration as that in Embodiment 1 except that another junction layer 130 is formed on an open exposed surface 104c of a protection film 10 formed on an n-type semiconductor layer 104, and an n-type electrode 108 is formed to cover the another junction layer 130 in this embodiment. The same reference numerals are given to the same members as those in Embodiment 1.

On the outer circumference portion 130d of the junction layer 130, an slope 130c, which is made gradually thinner toward the outer circumference, is formed.

The maximum thickness of the n-type electrode 109, which also serves as a bonding pad electrode, is larger than the maximum thickness of the junction layer 130, and the n-type electrode 108 is formed as one layer. On the outer circumference portion 108d of the n-type electrode 108 which also serves as the bonding pad electrode, an slope 108c, which is made gradually thinner toward the outer circumference, is formed. Accordingly, penetration of external air or moisture into the junction layer 130 can be prevented, and thus the anticorrosion property of the junction layer 130 can be improved to lengthen the life span of the semiconductor light-emitting element.

As described above, the junction layer 130 for the n-type electrode may be formed between the n-type electrode 108 and the n-type semiconductor layer 104.

Preferably, the junction layer 130 is made of the same material as the junction layer 110 of the p-type electrode 111, and also it is preferable that the maximum thickness thereof be in the same range, that is, in the range that is equal to or more than 10 Å and equal to or less than 1000 Å. Accordingly, the junction strength of the n-type electrode 108 against the n-type semiconductor layer 104 can be especially heightened.

Further, the junction layer 130 may adopt a laminated structure of layers made of the above-described transparent conductive materials and metal layers made of at least one kind of element selected from the group consisting of Al, Ti, V, Cr, Mn, Co, Zn, Ge, Zr, Nb, Mo, Ru, Hf, Ta, W, Re, Rh, Ir, and Ni. In this case, on the n-type semiconductor layer 104, a layer made of a transparent conductive material and a metal layer of Cr or the like may be laminated in order.

In the case of forming the junction layer 130, it is more preferable to use an electrode having the same construction as the bonding pad electrode 120 as the n-type electrode 108. That is, in the case where the bonding pad electrode 120 has a two-layer structure of a metal reflection layer 117 and a bonding layer 119, it is preferable that the n-type electrode 108 be a laminated structure that includes at least a metal reflection layer made of any one of Ag, Al, and Pt group elements, or an alloy including any one of these metals, and a bonding layer.

At this time, in the case of forming the junction layer 130 between the n-type electrode 108 and the n-type semiconductor layer 104, after the transparent electrode 109 of the p-type electrode 111 is formed, the junction layer 110 of the p-type electrode 111 is formed simultaneously with forming the junction layer 130 for the n-type electrode 108, and then the bonding pad electrode 120 of the p-type electrode 111 is formed simultaneously with forming of the n-type electrode 108.

In this case, the n-type electrode 108 may be a three-layer structure which includes a laminated body that is obtained by laminating in order a metal reflection layer, a barrier layer, and a bonding layer on the side of the n-type semiconductor layer 104.

Also, the n-type electrode 108 may be a signal-layer structure which includes only a bonding layer that also serves as the metal reflection layer.

According to the semiconductor light-emitting element according to an embodiment of the present invention, the other electrode 108 includes the junction layer 130 and the bonding pad electrode 108 that also serves as the other electrode formed to cover the junction layer 130, the bonding pad electrode 108 has a maximum thickness that is larger than the maximum thickness of the junction layer 110 and includes one layer, and slopes 130c and 108c, which are made gradually thinner toward the outer circumference, are formed in outer circumference portions 130d and 108d of the junction layer 130 and the bonding pad electrode 108. Accordingly, penetration of external air or moisture into the junction layer 130 can be prevented, and thus the anticorrosion property of the junction layer 130 can be improved to lengthen the life span of the semiconductor light-emitting element.

Embodiment 3

Figure 8:
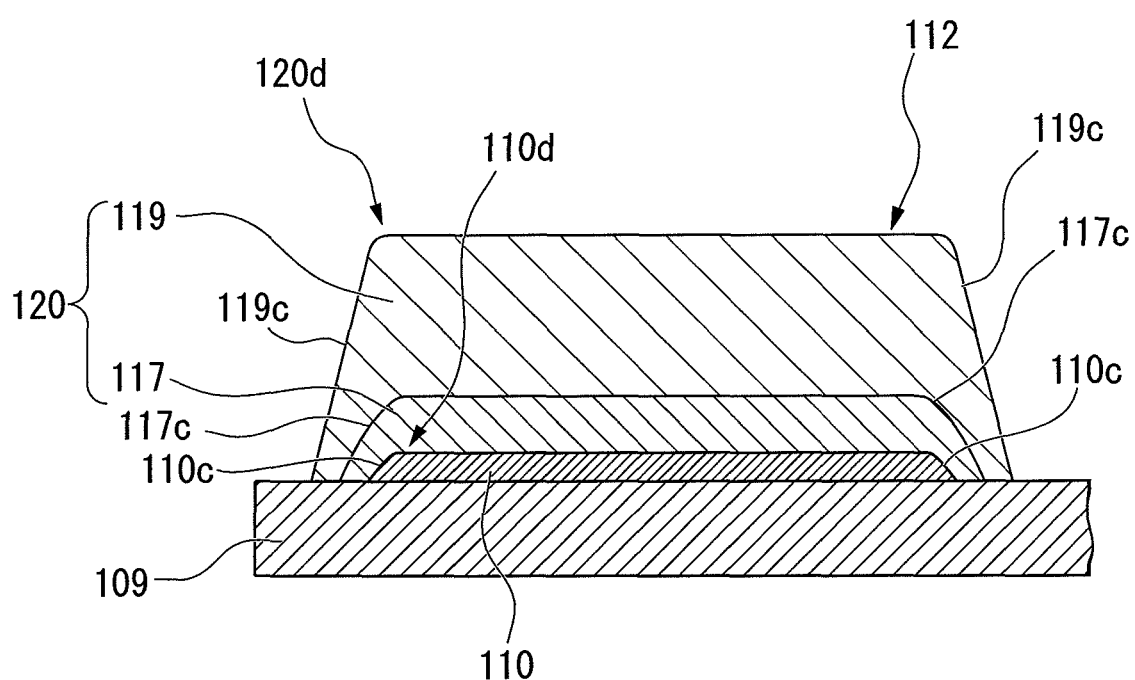
FIG. 8 is an example of an enlarged cross-sectional view of a p-type electrode of a semiconductor light-emitting element according to the present invention.

FIG. 8 is a schematic cross-section view illustrating another example of a semiconductor light-emitting element according to an embodiment of the present invention, and is an enlarged cross-sectional view of a p-type electrode.

As illustrated in FIG. 8, the semiconductor light-emitting element according to this embodiment of the present invention, although omitted in the drawings, has the same configuration as that in Embodiment 1 except that a protection film is not formed on the transparent electrode 109 of the p-type electrode 112 in this embodiment. The same reference numerals are given to the same members as those in Embodiment 1.

As described above, even in the case where no protection film is installed, the metal reflection layer 117 is formed to cover the junction layer 110, and the bonding layer 119 is formed to cover the metal reflection layer 117. Also, the outer circumference portions 110d and 120d of the junction layer 110, the metal reflection layer 117 and the bonding layer 119 form the slopes 110c, 117c, and 119c, which are formed to be gradually thinner toward the outer circumference. Accordingly, external air or moisture is unable to invade the junction layer 110 without passing through the junction surface between the transparent electrode 109 and the bonding layer 119 and the junction surface between the transparent electrode 109 and the metal reflection layer 117, and thus penetration of the external air or moisture into the junction layer 110 becomes difficult. Accordingly, the junction layer 110 is not easily dissolved, and thus the life span of the semiconductor light-emitting element can be lengthened.

According to the semiconductor light-emitting element 1 according to an embodiment of the present invention, since the bonding pad electrode 120 includes the metal reflection layer 117 that is formed to cover the junction layer 110 and the bonding layer 119 that is formed to cover the metal reflection layer 117, and the outer circumference portions 110d and 120d of the junction layer 110, the metal reflection layer 117, and the bonding layer 119 form the slopes 110c, 117c, and 119c, which are formed to be gradually thinner toward the outer circumference. Accordingly, penetration of external air or moisture into the junction layer 110 can be prevented, and thus the anticorrosion property of the semiconductor light-emitting element can be improved to lengthen the life span of the semiconductor light-emitting element.

Embodiment 4

Lamp

Figure 9:
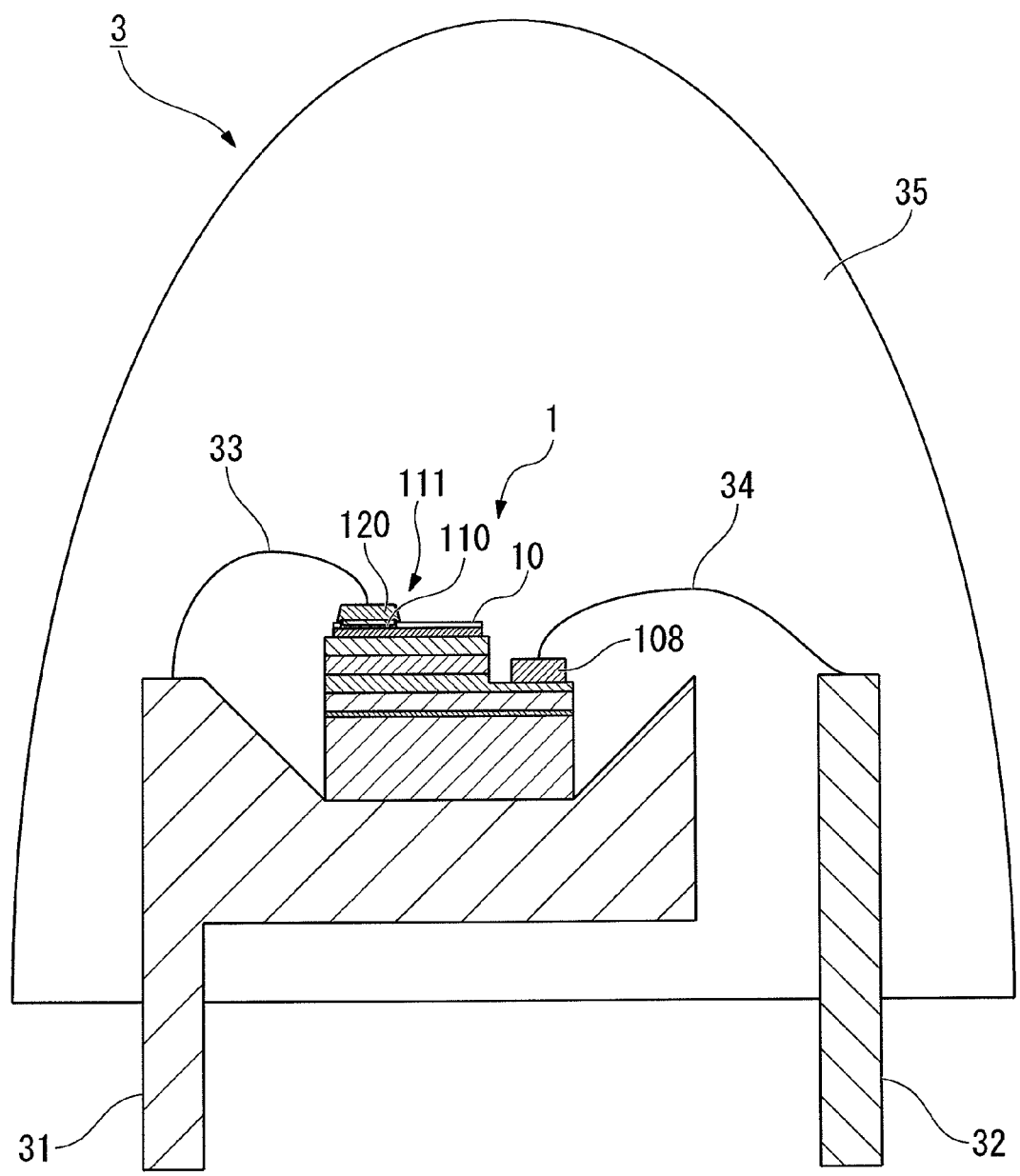
FIG. 9 is an example of a schematic cross-sectional view illustrating a lamp according to the present invention.

FIG. 9 is an example of a schematic cross-sectional view illustrating a lamp according to an embodiment of the present invention. In the drawing that is referred to in the following description, the size, thickness, and dimensions of respective portions are different from the dimension relationship of the actual semiconductor light-emitting element or the like.

As illustrated in FIG. 9, the lamp 3 according to an embodiment of the present invention is in the form of a shell, and the semiconductor light-emitting element 1 according to an embodiment of the present invention is used therein.

The lamp 3 according to an embodiment of the present invention is configured by combining the semiconductor light-emitting element 1 and phosphors, and has a configuration that is known to those of ordinary skill in the art which is configured by a means that is known to those of ordinary skill in the art. Also, by combining the semiconductor light-emitting element 1 with phosphors, it is known that the light-emitting color can be changed, and it is possible to adopt such technology even in the lamp according to an embodiment of the present invention without any limitation.

As illustrated in FIG. 9, the semiconductor light-emitting element 1 is packaged so that junction is made between the bonding pad electrode 120 of the p-type electrode 111 of the semiconductor light-emitting element 1 and a frame 31 through a wire 33, and junction is made between the n-type electrode 108 (bonding pad) of the semiconductor light-emitting element 1 and the other frame 32 through a wire 34. Also, the neighborhood of the semiconductor light-emitting element 1 is sealed by a mold 35 made of transparent resin.

The lamp 3 according to an embodiment of the present invention includes a semiconductor light-emitting element 1 as described above, a first frame 31 on which the semiconductor light-emitting element 1 is arranged and which is wire-bonded with a bonding pad electrode 120 of one conduction type electrode (p-type electrode) 111 of the semiconductor light-emitting element 1, a second frame 32 which is wire-bonded with the other conduction type electrode (n-type electrode) 108 of the semiconductor light-emitting element 1, and a mold 35 formed around the semiconductor light-emitting element 1. Accordingly, the lamp 3 has superior light-emitting characteristics. Also, penetration of external air or moisture into the junction layer 110 can be prevented, and thus the anticorrosion property of the junction layer 110 can be improved to lengthen the life span of the semiconductor light-emitting element.

The lamp 3 according to an embodiment of the present invention may be used in any type for any purpose, such as a shell type for general use, a side view type for a portable backlight, a top view type for use in a displayer.

Embodiment 5

Figure 10:
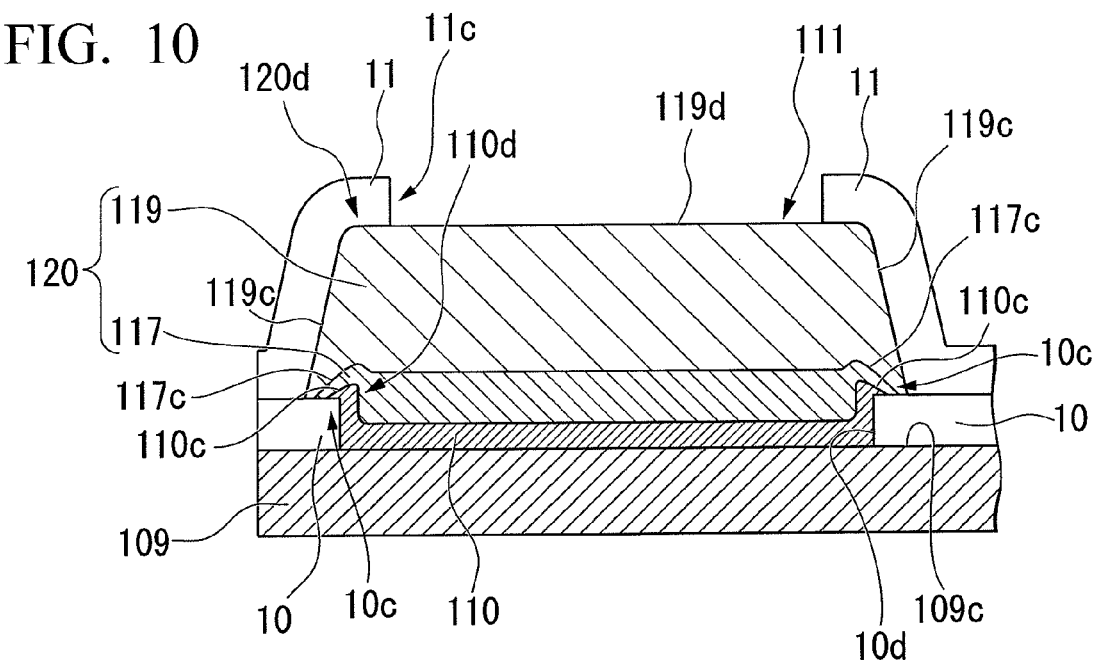
FIG. 10 is an example of an enlarged cross-sectional view of a p-type electrode of a semiconductor light-emitting element according to the present invention.

FIG. 10 is a schematic cross-sectional view illustrating still another example of a semiconductor light-emitting element according to an embodiment of the present invention, and an enlarged cross-sectional view of a p-type electrode.

As illustrated in FIG. 10, the semiconductor light-emitting element according to an embodiment of the present invention has the same configuration as that in Embodiment 1 except that another protection film 11 is formed to completely cover the outer circumference portion of the p-type electrode 111, that is, a boundary portion that makes a contour-line as the p-type electrode 111 is seen from the plane in this embodiment. The same reference numerals are given to the same members as those in Embodiment 1.

As illustrated in FIG. 10, the p-type electrode 111 includes a transparent electrode 109, a junction layer 110, and a bonding pad electrode 120, and is briefly configured to be formed on the p-type semiconductor layer 106.

The upper surface 109c of the transparent electrode 109 is covered by a protection film 10 made of $SiO_2$, and a portion of the protection film 10 is open to form an opening 10d. A portion of the upper surface 109c of the transparent electrode 109 is exposed from the opening 10d.

The junction layer 110 covers the upper surface 109c of the transparent electrode 109 exposed from the opening 10d with almost a uniform thickness, and on the outer circumference side of the opening 10d, the thickness of the junction layer 110 becomes thicker. In addition, the junction layer 110 is formed to cover the end portion 10c of the protection film 10. Also, on the outer circumference portion 110d of the junction layer 110 that covers the end portion 10c of the protection film 10, an slope 110c, which is made gradually thinner toward the outer circumference, is formed.

The bonding pad electrode 120 includes a metal reflection layer 117 and a bonding layer 119 which are formed with thicknesses greater than the maximum thickness of the junction layer 110. Also, on the outer circumference portion 120d of the bonding pad electrode 120, an slope 119c, which is made gradually thinner toward the outer circumference, is formed.

On the outer circumference portion of the metal reflection layer 117, an slope 117c, which is made gradually thinner toward the outer circumference, is formed. Also, the metal reflection layer 117 is formed to cover the junction layer 110. That is, the metal reflection layer 117 is formed to completely cover the forefront end portion of the slope 110c of the junction layer 110, that is, a boundary portion of the junction layer 110 that makes a contour-line as seen from a plane. That is, as seen from a plane, the metal reflection layer 117 is formed to cover the junction layer 110 and further to project up to the outer circumference side of the junction layer 110, and thus no portion of the junction layer 110 is exposed from the lower part of the metal reflection layer 117.

Further on the outer circumference portion of the bonding layer 119, the slope 119c, which is made gradually thinner toward the outer circumference, is formed. Also, the bonding layer 119 is formed to cover the metal reflection layer 117. That is, the bonding layer 119 is formed to completely cover the forefront end portion of an slope 117c of the metal reflection layer 117, that is, a boundary portion of the metal reflection layer 117 that makes a contour-line as seen from a plane. That is, as seen from a plane, the bonding layer 119 is formed to cover the metal reflection layer 117 and to project up to the outer circumference side of the metal projection layer 117, and thus no portion of the metal reflection layer 117 is exposed from the lower part of the bonding layer 119.

Another protection film 11 is formed to cover the boundary portion that makes a contour-line as the p-type electrode 111 of the bonding pad electrode 120 is seen from the plane. That is, another protection film 11 is laminated on the protection film 10, and its end portion 11c is put on the slope (tapered surface) 119c of the bonding layer 119 so as to completely cover the slope 119c. Further, another protection film 11 is formed to cover a portion of the upper surface 119d of the bonding layer 119.

Since the boundary between the bonding layer 119 and the protection film 10 is covered by another protection film 11, penetration of moisture on the boundary between the bonding layer 119 and the protection film 10 can be prevented, and thus it is not easy that external air or moisture invades the junction layer 110. Accordingly, the junction layer 110 is not easily dissolved, and thus the life span of the semiconductor light-emitting element can be lengthened.

In this case, it is sufficient if another protection film 11 is formed to completely cover the boundary portion that makes a contour-line as the bonding pad electrode 120 is seen from the plane, to cover almost the p-type electrode 111, and to install the exposed area that can acquire contact in a portion thereof.

It is sufficient if the material of another protection film 11 is a material that can protect the junction layer 110 from external air or moisture. For example, it is preferable to use $SiO_2$ as the material of another protection film 11. Accordingly, the adhesion of another protection film 11 can be heightened, and thus another protection film 11 can be prevented from easily peeling off to firmly fix the p-type electrode 111.

It is preferable that the protection film 11 be made of the same kind of material as the protection film 10. For example, in the case of using $SiO_2$ as the material of the protection film 10, it is preferable that the protection film 11 also be made of $SiO_2$. Accordingly, the adhesion between another protection film 11 and the protection film 10 can be heightened, and thus another protection film 11 and the protection film 10 can be prevented from easily peeling off to firmly fix the p-type electrode 111.

Embodiment 6

Figure 11:
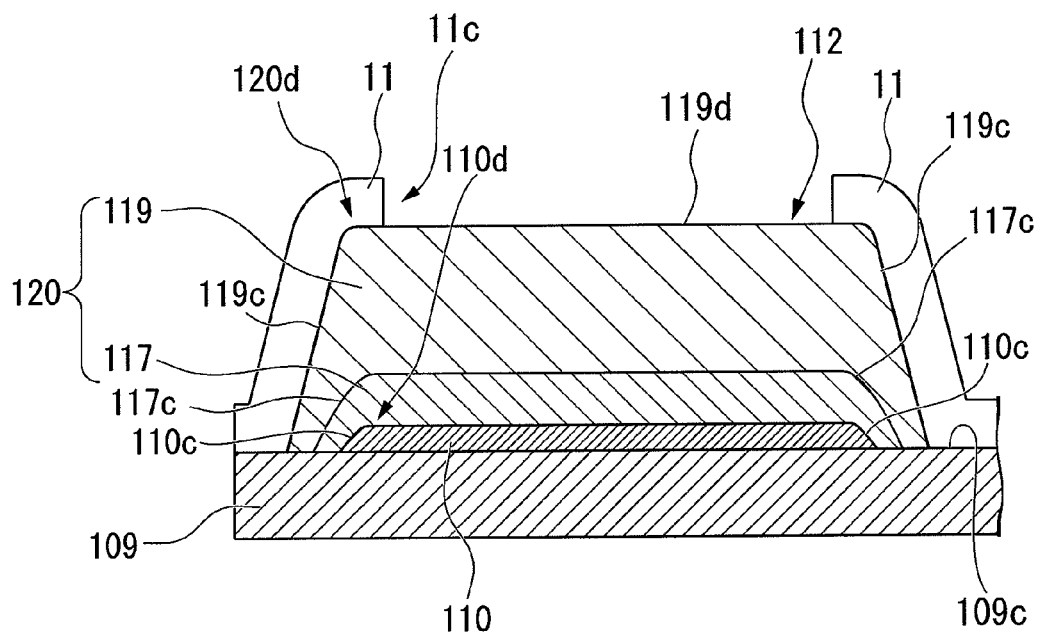
FIG. 11 is an example of an enlarged cross-sectional view of a p-type electrode of a semiconductor light-emitting element according to the present invention.

FIG. 11 is a schematic cross-sectional view illustrating still another example of the semiconductor light-emitting element according to an embodiment of the present invention, and is an enlarged cross-sectional view of a p-type electrode.

As illustrated in FIG. 11, the semiconductor light-emitting element according to an embodiment of the present invention has the same configuration as that in Embodiment 3 except that another protection film 11 is formed to completely cover a boundary portion that makes a contour-line as the bonding pad electrode 120 is seen from the plane in this embodiment. The same reference numerals are given to the same members as those in Embodiment 3.

As illustrated in FIG. 11, the p-type electrode 112 includes a transparent electrode 109, a junction layer 110, and a bonding pad electrode 120, and is briefly configured to be formed on the p-type semiconductor layer 106.

The junction layer 110 that is formed with a position and size that correspond to the p-type electrode 112 covers the upper surface 109c of the transparent electrode 109 with an almost uniform thickness, and on the outer circumference portion 110d of the junction layer 110, an slope 110c, which is made gradually thinner toward the outer circumference, is formed.

The bonding pad electrode 120 includes a metal reflection layer 117 and a bonding layer 119 which are formed with thicknesses greater than the maximum thickness of the junction layer 110. Also, on the outer circumference portion 120d of the bonding pad electrode 120, an slope 119c, which is made gradually thinner toward the outer circumference, is formed.

On the outer circumference portion of the metal reflection layer 117, an slope 117c, which is made gradually thinner toward the outer circumference, is formed. Also, the metal reflection layer 117 is formed to cover the junction layer 110. That is, the metal reflection layer 117 is formed to completely cover the forefront end portion of the slope 110c of the junction layer 110, that is, a boundary portion of the junction layer 110 that makes a contour-line as seen from a plane. That is, as seen from a plane, the metal reflection layer 117 is formed to cover the junction layer 110 and further to project up to the outer circumference side of the junction layer 110, and thus no portion of the junction layer 110 is exposed from the lower part of the metal reflection layer 117.

Further on the outer circumference portion of the bonding layer 119, the slope 119c, which is made gradually thinner toward the outer circumference, is formed. Also, the bonding layer 119 is formed to cover the metal reflection layer 117. That is, the bonding layer 119 is formed to completely cover the forefront end portion of an slope 117c of the metal reflection layer 117, that is, a boundary portion of the metal reflection layer 117 that makes a contour-line as seen from a plane. That is, as seen from a plane, the bonding layer 119 is formed to cover the metal reflection layer 117 and further to project up to the outer circumference side of the metal projection layer 117, and thus no portion of the metal reflection layer 117 is exposed from the lower part of the bonding layer 119. In this case, the boundary portion that makes the contour-line as the bonding layer 119 is seen from the plane is the boundary portion that makes the contour-line as the p-type electrode 111 is seen from the plane.

Another protection film 11 is formed to cover the boundary portion that makes a contour-line as the bonding pad electrode 120 is seen from the plane. That is, another protection film 11 is laminated on the protection film 10, and its end portion 11c is put on the slope (tapered surface) 119c of the bonding layer 119 so as to completely cover the slope 119c. Further, another protection film 11 is formed to cover a portion of the upper surface 119d of the bonding layer 119.

Since the boundary between the bonding layer 119 and the transparent electrode 109 is covered by another protection film 11, penetration of moisture on the boundary between the bonding layer 119 and the transparent electrode 109 can be prevented, and thus it is not easy that external air or moisture invades the junction layer 110. Accordingly, the junction layer 110 is not easily dissolved, and thus the life span of the semiconductor light-emitting element can be lengthened.

In this case, it is sufficient if another protection film 11 is formed to completely cover the boundary portion that makes a contour-line as the bonding pad electrode 120 is seen from the plane, to cover almost the p-type electrode 112, and to install the exposed area that can acquire contact in a portion thereof.

It is sufficient if the material of another protection film 11 is a material that can protect the junction layer 110 from external air or moisture. For example, it is preferable to use $SiO_2$ as the material of another protection film 11. Accordingly, the adhesion of another protection film 11 can be heightened, and thus another protection film 11 can be prevented from easily peeling off to firmly fix the p-type electrode 112.

(Method of Manufacturing a Semiconductor Light-Emitting Element in Embodiment 7)

Next, a method of manufacturing a semiconductor light-emitting element according to an embodiment of the present invention will be described. The method of manufacturing a semiconductor light-emitting element in Embodiment 7 is the method of manufacturing the semiconductor light-emitting element 1 as illustrated in FIG. 14.

In order to manufacture a semiconductor light-emitting element 1 as illustrated in FIG. 14, a laminated semiconductor layer 20 is first formed on a substrate 101. By forming a laminated semiconductor layer 20 using the MOCVD method, a good crystallinity can be obtained. However, by optimizing the conditions in forming a laminated semiconductor layer 20 using the sputtering method, the crystallinity, which is more superior to that obtained in the MOCVD method, can be obtained.

Hereinafter, the "forming of the laminated semiconductor layer" including a buffer layer forming step, a under-layer forming step, an n-type semiconductor layer forming step, a light-emitting layer forming step, and a p-type semiconductor forming step is performed based on the method of manufacturing a semiconductor light-emitting element according to Embodiment 1 as described above. Through the above-described step, the laminated semiconductor layer 20 is formed, and then an n-type electrode 108 and a p-type electrode 111 are formed.

<N-Type Electrode Forming Step>

First, by performing a patterning using a known photolithography method, a portion of the n-contact layer 104a is exposed by etching a portion of the laminated semiconductor layer 20 in a predetermined area. Next, using a sputtering method or the like, the n-type electrode 108 is formed on the exposed surface 104c of the n-contact layer 104a.

<P-Type Electrode Forming Step>

Figure 18:
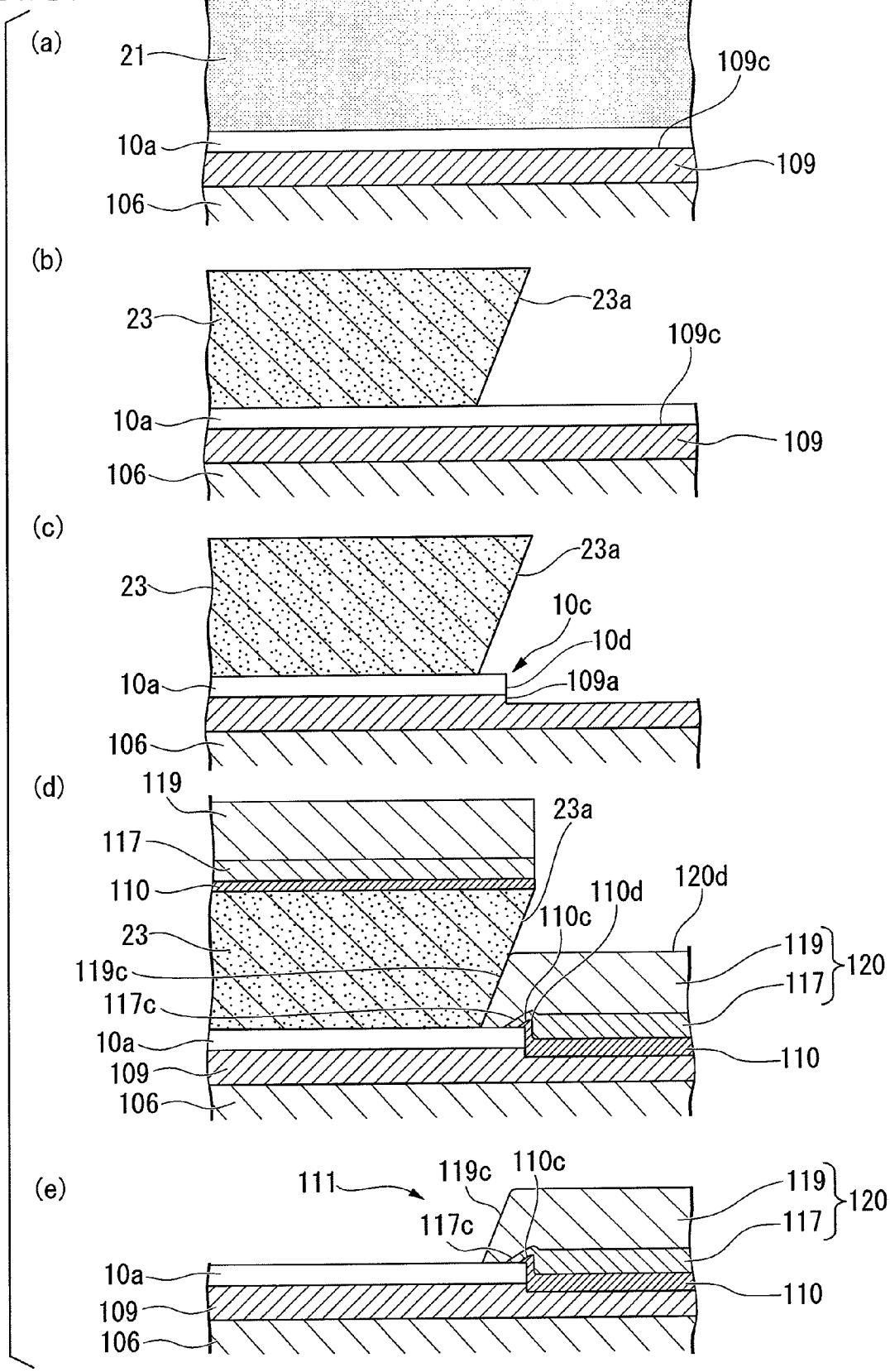
FIG. 18 is a view illustrating an example of a step of manufacturing a p-type electrode, and an enlarged cross-sectional view illustrating only a portion of an area in which a p-type electrode is manufactured.

Next, with reference to FIG. 18, a step of manufacturing a p-type electrode 111 will be described. FIG. 18 is a view illustrating a step of manufacturing a p-type electrode, and an enlarged cross-sectional view illustrating only a portion of an area on which the p-type electrode 111 is manufactured.

As illustrated in FIG. 18(a), in order to manufacture the p-type electrode 111 according this embodiment, a transparent electrode 109 is first formed on the p-type semiconductor layer 106. The transparent electrode 109 is formed in a manner that a mask that covers an area except for an area where the transparent electrode 109 is formed, such as the exposed surface 104c of the n-contact layer 104a on which the n-type electrode 108 is formed, the transparent electrode 109 is formed on the p-type semiconductor layer 106 using a known method such as a sputtering method, and then the mask is removed. In this case, the transparent electrode 109 may be formed after the n-type electrode 108 is formed, or may be formed before the etching of the laminated semiconductor layer 20 for forming the n-type electrode 108.

Next, as illustrated in FIG. 18(a), a transparent protective film 10a is formed on the upper surface 109c of the transparent electrode 109, a resist 21 is coated on the transparent protective film 10a, and then a drying process is performed.

Next, by removing the resist 21 on a portion that corresponds to the portion on which the bonding pad electrode 120 is formed, a reverse-tapered mask 23 illustrated in FIG. 18(b), which has an opening 23a that is in the form of an inner wall of which the cross-sectional area is gradually widened toward the bottom surface, is formed on the upper surface 109c of the transparent electrode 109 on which the transparent protective film 10a is formed. The method of forming the reverse-tapered mask 23 may be a method using the n-type photoresist or a method using an image reversion type photoresist. In this embodiment, with reference to FIG. 19, a method of forming a mask as illustrated in FIG. 18(b) using the image reversion type photoresist will be described.

Figure 19:
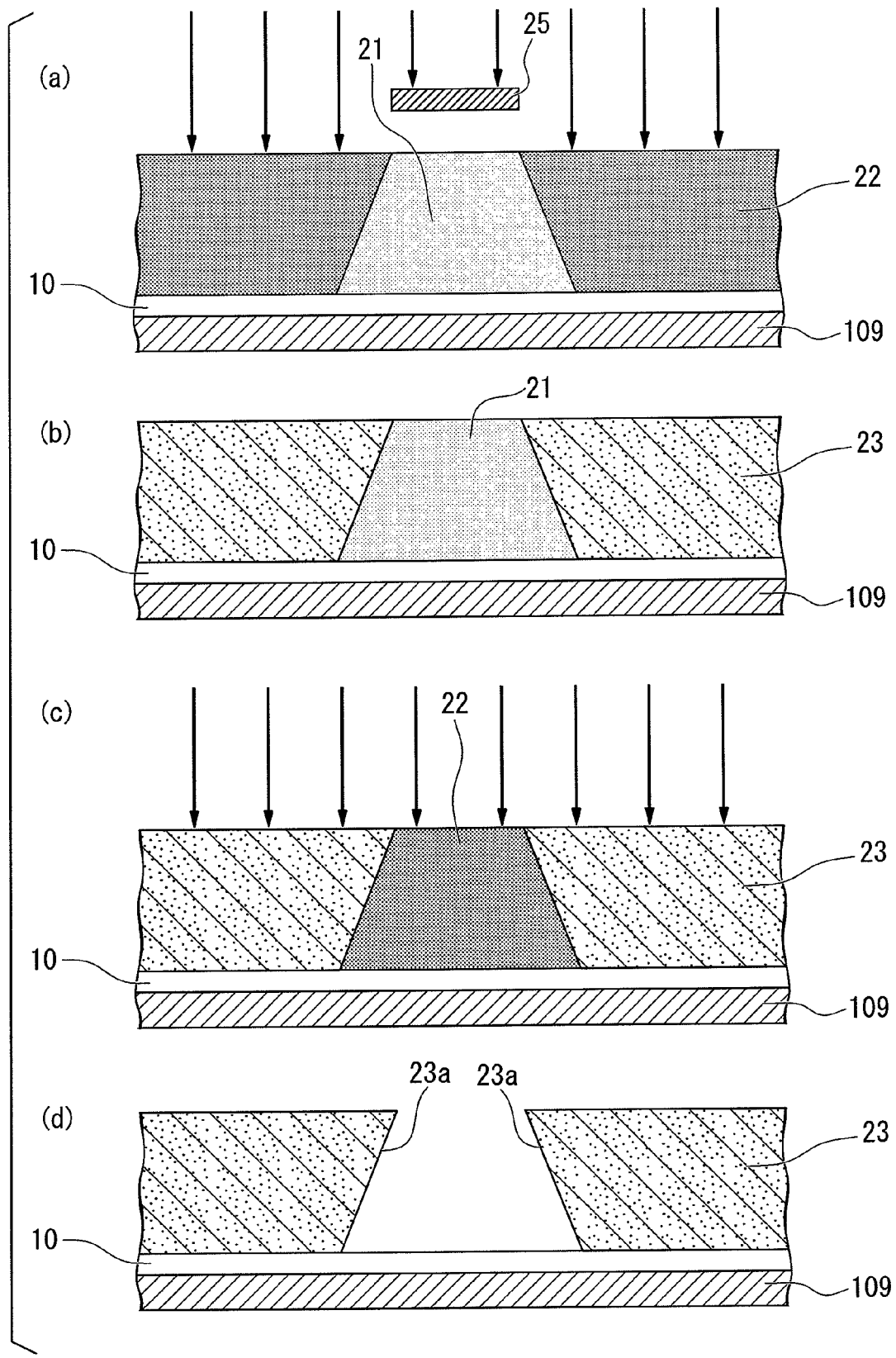
FIG. 19 is a view illustrating an example of a step of manufacturing a mask illustrated in FIG. 18(b), and an enlarged cross-sectional view illustrating only a portion of an area in which a p-type electrode is manufactured.

FIG. 19 is a view illustrating a step of manufacturing a mask illustrated in FIG. 18(b), and enlarged cross-sectional views illustrating only an area in which a p-type electrode 111 is formed.

In this embodiment, as a resist 21, insoluble resist that is an image reversion type photoresist is used. As the image reversion type photoresist, for example, AZ5200NJ (product name: product of AZ Electronic Materials) may be used.

Next, as illustrated in FIG. 19(a), a mask 25 is arranged to cover a predetermined position on the upper side of the resist 21, and as indicated by an arrow in FIG. 19(a), light of a predetermined intensity and wavelength is radiated from the side of the mask 25 to the side of the resist 21. Accordingly, an optical reaction of the resist 21 on a portion, to which the light is radiated, occurs to form a soluble portion 22. Since this optical reaction progresses in accordance with the intensity of light, the light reaction progresses fast on the light irradiation surface side, and the light reaction progresses slowly on the side of the transparent electrode 109. Due to this, the soluble portion 22, as seen from the cross-section, as illustrated in FIG. 19(a), is formed to be in a reverse-tapered shape (reversely inclined shape), in which the side surface of the portion is inwardly receded toward the lower side of the portion. Also, the resist 21 of the portion covered by the mask 25 remains as the insoluble resist (insoluble portion) 21, and as seen from the cross-section, is formed to be in a tapered shape (inclined shape), in which the side surface is inwardly receded toward the upper side thereof.

Next, using a heating device such as a hot plate or an oven, the substrate is heated, and as illustrated in FIG. 19(b), the soluble portion 22 is made to thermally react to form the hardened portion (mask) 23 composed of crosslinked polymer. Thereafter, as illustrated in FIG. 19(c), the light with the predetermined intensity and wavelength is radiated onto the insoluble resist 21 and the surface side of the hardened portion (mask) 23 composed of the crosslinked polymer, without using a mask, and an optical reaction of the insoluble resist 21 as described above using FIG. 19(a), which has not been transformed into the soluble resist 22, occurs to form the soluble portion 22.

Lastly, by dissolving and removing the soluble portion 22 as illustrated in FIG. 19(c) using a predetermined developing solution, as illustrated in FIG. 19(d), the mask 23 composed of crosslinked polymer, in a reverse-tapered shape (reversely inclined shape), having an opening 23a, in which the side surface is inwardly receded toward the lower side of the portion, is obtained.

Then, by removing the transparent protective film 10a that is exposed from the opening 23a of the mask 23 as illustrated in FIG. 18(b) using RIE (Reactive Ion Etching) in a direction vertical to the upper surface 109c of the transparent electrode 109, as illustrated in FIG. 18(c), an opening 10d is formed, through which the upper surface 109c of the transparent electrode 109 is exposed for the opening 10d. Since the RIE (Reactive Ion Etching) is an etching method which has high directivity and low curvature, as seen from the etching direction (upper side in FIG. 18), the transparent protective film 10a that becomes a shadow of the mask 23 is hardly etched and removed, and as illustrated in FIG. 18(c), the end portion 10c of the transparent protective film 10a remains.

Thereafter, as illustrated in FIG. 18(c), by etching the transparent electrode 109 that is exposed from the opening 23a of the mask 23, a junction recess portion 109a is formed on the upper surface 109c of the transparent electrode 109. By forming the junction recess portion 109a, the inner surface of the junction recess portion 109a that is exposed from the transparent electrode 109 has superior adhesion with the junction layer 110 in comparison to the upper surface 109c of the transparent electrode 109.

Here, for example, in the case where the transparent electrode 109 that is etched is an IZO film in an amorphous state, the junction recess portion 109a of a specified shape can be formed due to the superior etching property. The IZO film in an amorphous state can be easily etched with good accuracy using a known etchant (ITO-07N etchant (product of Kanto Chemical Co., Ltd.)). Also, the etching of the IZO film in an amorphous state may be performed using a dry etching device. In this case, $Cl_2$, $SiCl_4$, $BCl_3$, and the like, may be used as an etching gas.

Also, it is preferable that the IZO film in an amorphous state be an IZO film including $In_2O_3$ crystal of a hexagonal crystal structure or an IZO film including $In_2O_3$ crystal of a bixbyite structure by performing heat-treatment. By shifting the film in an amorphous state into a structure that includes the crystal by the heat-treatment or the like, the transparent electrode 109 having good transparency and adhesion with the junction layer 110 rather than the amorphous IZO film can be made. However, since it is difficult to perform the etching of the IZO film including $In_2O_3$ crystal of a hexagonal crystal structure, it is preferable to perform the heat-treatment after the above-described etching process.

In the case of crystallizing the IZO film in an amorphous state, if the film-forming condition, heat-treatment condition, or the like, is different, the crystal structure in the IZO layer becomes different. The heat-treatment for crystallizing the IZO film is performed preferably in the atmosphere that does not include $O_2$. The atmosphere that does not include $O_2$ may be an inert gas atmosphere such as $N_2$ atmosphere, a mixed gas atmosphere including an inert gas such as $N_2$ and $H_2$, or the like, and preferably an $N_2$ atmosphere or a mixed gas atmosphere including $N_2$ and $H_2$. In this case, if the heat-treatment of the IZO film is performed in an $N_2$ atmosphere or a mixed gas atmosphere including $N_2$ and $H_2$, for example, it is possible to crystallize the IZO film on a film that includes $In_2O_3$ crystal of a hexagonal crystal structure and to effectively reduce sheet resistance of the IZO film.

Also, the heat-treatment temperature for crystallizing the IZO film is preferably 500° C. to 1000° C. In the case of performing the heat-treatment at a temperature less than 500° C., the IZO film may not be sufficiently crystallized, and thus the light permeability of the IZO film may not be sufficiently high. In the case of performing the heat-treatment at a temperature exceeding 1000° C., the IZO film may be crystallized, but the light permeability of the IZO film may not be sufficiently high. Also, In the case of performing the heat-treatment at a temperature exceeding 1000° C., the semiconductor layer located below the IZO film may deteriorate.

Next, as illustrated in FIG. 18(d), by the sputtering method, the junction layer 110 is formed to cover the junction recess portion 109a of the transparent electrode 109. In this case, by using the sputtering method that controls the sputter conditions, the junction layer 110 can be formed with high coverage. Accordingly, the junction layer 110 is formed to cover the entire surface of the junction recess portion 109a of the transparent electrode 109, the entire surface on the inner wall surface of the opening 10d of the transparent protective film 10a, and a portion of the end portion 10c of the transparent protective film 10a, and on the outer circumference portion 110d of the junction layer 110, an slope 110c, which is made gradually thinner toward the outside, is formed.

In this case, before the junction layer 110 is formed, pre-processing for cleaning the surface of the junction recess portion 109a of the transparent electrode 109 on which the junction layer 110 is formed may be performed. Here, the cleaning method may be a dry process that exposes the transparent electrode to plasma or the like and a wet process that makes the transparent electrode in contact with a chemical solution, and from the viewpoint of convenience in the process, the dry process is preferable.

Next, by the sputtering method, the metal reflection layer 117 is formed. In this case, in the same manner as the case of forming the junction layer 110, the sputtering method that controls the sputter conditions is used, and thus the coverage of the metal reflection layer 117 can be heightened. The metal reflection layer 117 is formed, which covers the junction layer 110 and has an slope 117c, which is formed on the outer circumference portion of the metal reflection layer 117 and is made gradually thinner toward the outside.

Next, by the sputtering method, the bonding layer 119 is formed. In this case, by using the sputtering method that controls the sputter conditions, the bonding layer 119 can be formed with high coverage. The bonding layer 119 (bonding pad electrode 120) is formed, of which the outer circumference portion is shaped along the inner wall shape of the opening 23a of the mask 23, and which covers the metal reflection layer 117 and has an slope 119c, which is formed on the outer circumference portion 120d of the bonding layer 119 and is made gradually thinner toward the outside.

Thereafter, by soaking in a resist peel-off solution, the mask 23 composed of crosslinked polymer is peeled off. Accordingly, as illustrated in FIG. 18(e), the bonding pad electrode 120 composed of the metal reflection layer 117 and the bonding layer 119 is formed.

In this embodiment, since the mask 23 including the opening 23a having the inner wall shape, of which the cross-sectional area is gradually widened toward a bottom surface, is formed, and the junction layer 110, the metal reflection layer 117, and the bonding layer 119 are formed by the sputtering method having high coverage, layers having different inclination angles are formed according to the thickness of the respective layers including the junction layer 110, the metal reflection layer 117, and the bonding layer 119 in an area that becomes a shadow of the mask 23 as seen from the sputter direction. Accordingly, on the outer circumference portions of the junction layer 110, the metal reflection layer 117, and the bonding layer 119, slopes 110c, 117c, and 119c, which are made gradually thinner toward the outer circumference, are formed.

Next, using a known method, the edge portion protection film 10b, which is roughly in the form of a donut that exposes the center portion of the bonding pad electrode 120 as seen from the plane, and covers the outer edge portion of the bonding pad electrode 120 over a juncture portion of the outer edge portion (contour-line) of the bonding pad electrode 120 and the transparent protective film 10a, is formed.

In this embodiment, on the outer circumference portion 120d of the bonding pad electrode 120, an slope 119c, which is made gradually thinner toward the outside, is formed, and the edge portion protection film 10b is easily formed on the slope 119c of the bonding pad electrode 120 with a uniform thickness. By this, a portion, in which the edge portion protection film 10b is not formed on the portion that is a juncture portion of the outer edge portion (contour-line) of the bonding pad electrode 120 and the transparent protective film 10a, is prevented from occurring, and thus the edge portion protection film 10b can be easily and closely formed over the portion that is a juncture portion of the outer edge portion (contour-line) of the bonding pad electrode 120 and the transparent protective film 10a with a uniform thickness.

Accordingly, a semiconductor light-emitting element 1 having a p-type electrode 111 as illustrated in FIGS. 14 to 16 are formed.

According to the semiconductor light-emitting element 1 according to this embodiment, the p-type electrode 111 includes a transparent electrode 109 having a junction recess portion 109a formed on its upper surface 109c, a junction layer 110 formed to cover the junction recess portion 109a, and a bonding pad electrode 120 formed to cover the junction layer 110 and having an slope 119c which is made gradually thinner toward the outside and is formed on the outer circumference portion 120d, Thus, by the junction layer 110, the transparent electrode 109 and the bonding pad electrode 120 obtain sufficiently high junction strength, and thus the junction of the p-type electrode 111 becomes superior.

Further, according to the semiconductor light-emitting element 1 according to this embodiment, since the bonding pad electrode 120 having an slope 119c, which is made gradually thinner toward the outside, formed on the outer circumference portion 120d is formed to cover the junction layer 110, penetration of external air or moisture into the junction layer 110 can be effectively prevented, and thus the superior anticorrosion property thereof can be obtained.

Figure 25:
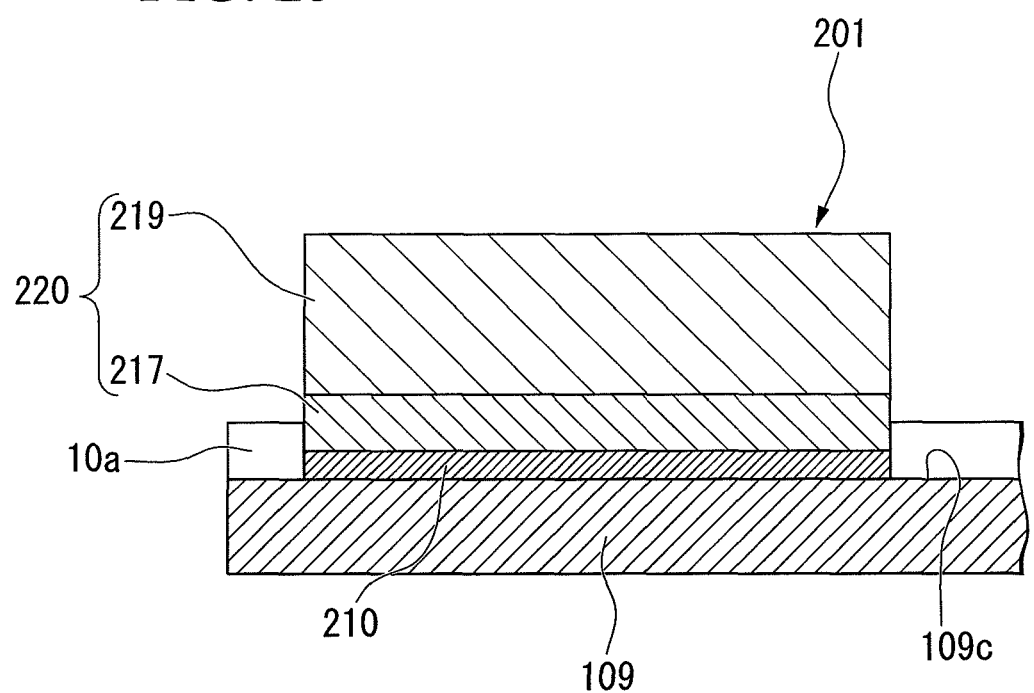
FIG. 25 is a view illustrating effects of a semiconductor light-emitting element according to the present invention, and a schematic enlarged cross-sectional view of a p-type electrode.

Here, the effect of the semiconductor light-emitting element according to this embodiment will be described taking the semiconductor light-emitting element having the p-type electrode as illustrated in FIG. 25 as an example. In this case, in FIG. 25, only the p-type electrode provided in the semiconductor light-emitting element is illustrated, and the illustration of the substrate and the laminated semiconductor layer is omitted. In the p-type electrode 201 illustrated in FIG. 25, unlike the semiconductor light-emitting element 1 according to this embodiment, the edge portion protection film 10b is not formed, the junction recess portion 109a is not formed on the upper surface 109c of the transparent electrode 109, and the side surfaces of the junction layer 210 and the metal reflection layer 217 and the bonding layer 219 constituting the bonding pad electrode 220 are formed almost vertical to the upper surface 109c of the transparent electrode 109.

In the p-type electrode 201 illustrated in FIG. 25, external air or moisture easily invades between the transparent protective film 10a and the metal reflection layer 217 to reach the junction layer 210. If the air or moisture reaches the junction layer 210, the junction layer 210 deteriorates and the life span of the semiconductor light-emitting element is shortened. Particularly, in the case where the junction layer 210 includes Cr, Cr is easily oxidized or hydro-oxidized by the air or moisture having reached the junction layer 210, and thus the junction layer 210 is dissolved and destroyed to cause a serious problem. Further, the oxidation or hydro-oxidation of Cr is accelerated as bias is applied to the semiconductor light-emitting element having the p-type electrode 201 illustrated in FIG. 25, and this may cause the junction layer to be simply dissolved and destroyed.

For this, in the semiconductor light-emitting element 1 according to this embodiment, since the bonding pad electrode 120, which is formed to cover the junction layer 110 and has the slope 119c, which is made gradually thinner toward the outside, formed on the outer circumference portion 120d thereof, is provided, no portion of the junction layer 110 is exposed below the bonding pad electrode 120. Accordingly, according to the semiconductor light-emitting element 1 according to this embodiment, penetration of external air or moisture into the junction layer 110 can be effectively prevented by the semiconductor light-emitting element 1, and thus even in the case where the junction layer 110 is made of Cr, superior anticorrosion property and superior junction property between the transparent electrode 109 and the bonding pad electrode 120 by the junction layer 110 can be obtained.

Also, in the semiconductor light-emitting element 1 according to this embodiment, if the junction layer 110 is made of at least one kind of element selected from the group consisting of Al, Ti, V, Cr, Mn, Co, Zn, Ge, Zr, Nb, Mo, Ru, Hf, Ta, W, Re, Rh, Ir, and Ni, and is a thin film of which the maximum thickness is equal to or more than 10 Å and equal to or less than 400 Å, the junction between the transparent electrode 109 and the bonding pad electrode 120 is much more improved.

Further, in the semiconductor light-emitting element 1 according to this embodiment, since the transparent protective film 10a is formed to cover an area where the junction recess portion 109a is not formed on the upper surface 109c of the transparent electrode 109, and the outer edge portion of the junction layer 110 and the outer edge portion of the bonding pad electrode 120 are arranged on the transparent protective film 10a, further more superior anticorrosion and junction properties can be obtained.

Also, in the semiconductor light-emitting element 1 according to this embodiment, the bonding pad electrode 120 includes a metal reflection layer 117 and the bonding layer 119. No portion of the junction film 110 is exposed from the lower part of the metal reflection layer 117, no portion of the metal reflection layer 117 is exposed from the lower part of the bonding layer 119, and the junction layer 110 is doubly covered by the metal reflection layer 117 and the bonding layer 119. Further, in the semiconductor light-emitting element 1 according to this embodiment, the outer edge portion of the bonding pad electrode 120 is arranged on the transparent protective film 10a. Accordingly, in the semiconductor light-emitting element 1 according to this embodiment, external air or moisture is unable to invade the junction layer 110 of the semiconductor light-emitting element 1 without passing through the junction surface between the transparent protective film 10a and the bonding layer 119 and the junction surface between the transparent protective film 10a and the metal reflection layer 117. Accordingly, the penetration of the external air or moisture into the junction layer 110 of the semiconductor light-emitting element 1 can be prevented more effectively.

Also, in the semiconductor light-emitting element 1 according to this embodiment, since the edge portion protection film 10b, which covers the outer edge portion of the bonding pad electrode 120 and exposes a portion of the bonding pad electrode 120, is formed, further more superior anticorrosion and junction properties can be obtained.

Also, in the method of manufacturing a semiconductor light-emitting element 1 according to this embodiment, the step of manufacturing a p-type electrode 111 includes the steps of forming a transparent electrode 109; forming a mask 23 including an opening 23a having an inner wall shape, of which the cross-sectional area is gradually widened toward a bottom surface, on an upper surface of the transparent electrode 109 on which the transparent protective film 10a is formed; forming a junction recess portion 109a by etching the upper surface 109c of the transparent electrode 109 that is exposed from the opening 23a; forming a junction layer 110 to cover the junction recess portion 109a; forming a bonding pad electrode 120 formed to cover the junction layer 110 and having an slope 119c, which is made gradually thinner toward the outside and is formed in an outer circumference portion 120d of the bonding pad electrode 120, by forming the shape of the outer circumference portion 120d along the inner wall shape of the opening 23a; and removing the mask 23. Accordingly, the semiconductor light-emitting element 1 according to this embodiment which includes electrodes the p-type electrode 111 having superior junction and anticorrosion properties can be easily manufactured.

Also, since the method of manufacturing a semiconductor light-emitting element 1 according to this embodiment includes the steps of forming a junction recess portion 109a by etching the upper surface 109c of a transparent electrode 109 exposed from the opening 23a, and forming a junction layer 110 to cover the junction recess portion 109a, the junction layer 110 is formed in contact with the inner surface of the junction recess portion 109a that is exposed from the transparent electrode 109 by forming the junction recess portion 109a. By forming the junction recess portion 109a, the inner surface of the junction recess portion 109a that is exposed from the transparent electrode 109 has superior adhesion to the junction layer 110 in comparison to the upper surface 109c of the transparent electrode 109, and thus according to the manufacturing method according to this embodiment, the p-type electrode 111 having superior adhesion with the junction layer 110 can be obtained in comparison to the case of forming the junction layer 110 on the upper surface 109c of the transparent electrode 109.

Embodiment 8

Semiconductor Light-Emitting Element

Figure 20:
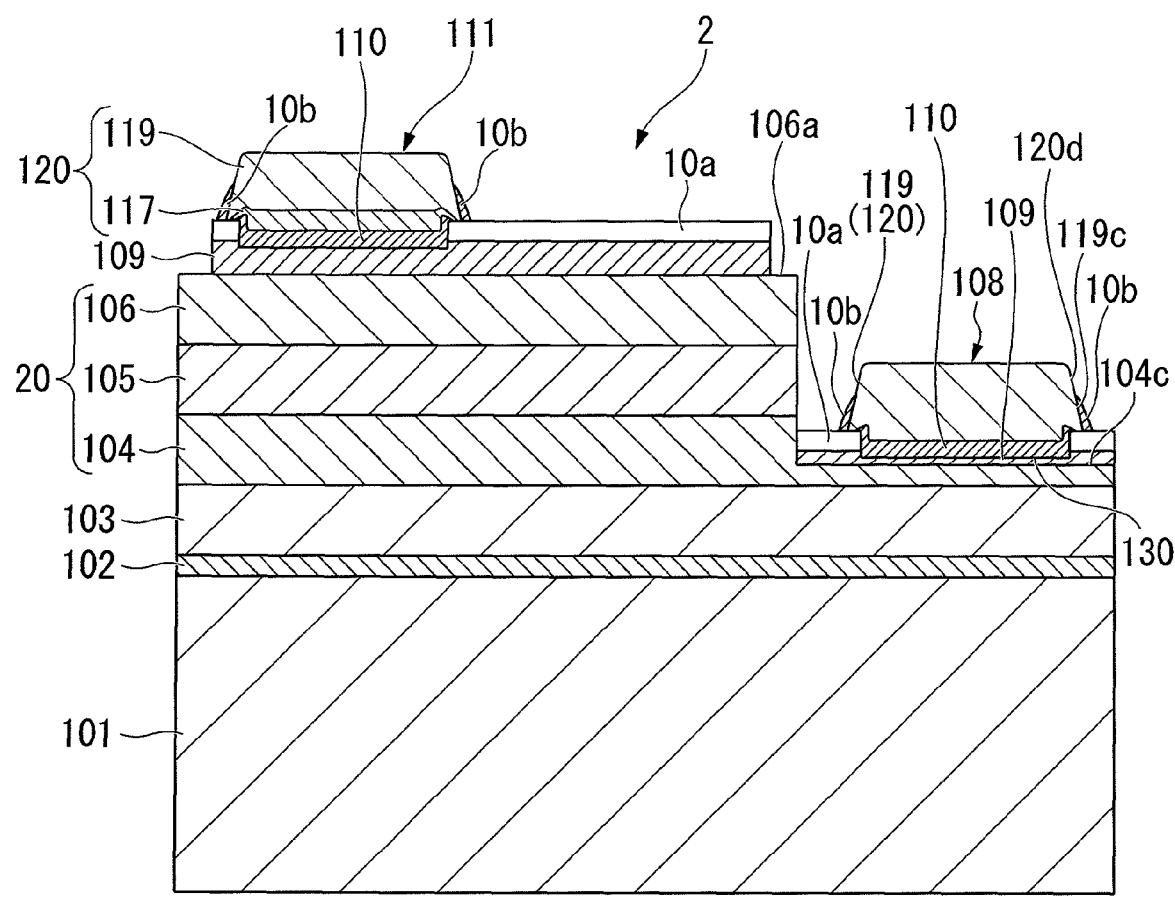
FIG. 20 is a view illustrating another example of a semiconductor light-emitting element according to the present invention, and a schematic cross-sectional view of the semiconductor light-emitting element.

FIG. 20 is a view illustrating another example of a semiconductor light-emitting element according to the present invention, and is a schematic cross-sectional view illustrating a semiconductor light-emitting element according to the present invention. The semiconductor light-emitting element 2 according to this embodiment as illustrated in FIG. 20 has the same configuration as that of the semiconductor light-emitting element 1 as illustrated in FIG. 14 except only for the n-type electrode 108. Accordingly, the same reference numerals are given to the same members as those according to Embodiment 7.

According to the semiconductor light-emitting element 2 according to this embodiment as illustrated in FIG. 20, the same electrode as the p-type electrode 111 is formed except that as the n-type electrode 108, the bonding pad electrode 120 is composed of a single-layer structure including only the bonding layer 119 in this embodiment. Accordingly, the n-type electrode 108 constituting the semiconductor light-emitting element 2 according to this embodiment can be formed in the same manner as the p-type electrode 111 except that the metal reflection layer 117 is not formed in this embodiment.

According to the semiconductor light-emitting element 2 according to this embodiment as illustrated in FIG. 20, the p-type electrode 111 has a superior junction property in the same manner as the semiconductor light-emitting element 1 as illustrated in FIG. 14.

Further, in the semiconductor light-emitting element 2 according to this embodiment as illustrated in FIG. 20, the n-type electrode 108 includes the transparent electrode 109 having the junction recess portion 109a on the upper surface 109c thereof, the junction layer 110 formed to cover the junction recess portion 109a, and the bonding pad electrode 120 formed to cover the junction layer 110 and having the slope 119c, which is made gradually thinner toward the outside and is formed in the outer circumference portion 120d. Accordingly, by the junction layer 110, the transparent electrode 109 and the bonding pad electrode 120 obtain sufficiently high junction strength, and thus the junction of the n-type electrode 108 becomes superior.

Also, in the semiconductor light-emitting element 2 according to this embodiment as illustrated in FIG. 20, the bonding pad electrode 120 including the p-type electrode 111 and the n-type electrode 108 has the slope 119c, which is made gradually thinner toward the outside and is formed in the outer circumference portion 120d, and is formed to cover the junction layer 110. Accordingly, the penetration of the external air or moisture into the junction layer 110 can be effectively prevented, and thus superior anticorrosion property is obtained.

Also, in the method of manufacturing a semiconductor light-emitting element 2 according to this embodiment, the step of manufacturing a p-type electrode 111 and an n-type electrode 108 includes the steps of forming a transparent electrode 109; forming a mask 23 including an opening 23*a* having an inner wall shape, of which the cross-sectional area is gradually widened toward a bottom surface, on an upper surface 109*c* of the transparent electrode 109 on which the transparent protective film 10*a* is formed; forming a junction recess portion 109*a* by etching the upper surface 109*c* of the transparent electrode 109 that is exposed from the opening 23*a*; forming a junction layer 110 to cover the junction recess portion 109*a*; forming a bonding pad electrode 120 formed to cover the junction layer 110 and having an slope 119*c*, which is made gradually thinner toward the outside and is formed in an outer circumference portion 120*d*, by forming the shape of the outer circumference portion 120*d* along the inner wall shape of the opening 23*a*; and removing the mask 23. Accordingly, the semiconductor light-emitting element 2 according to this embodiment which includes the p-type electrode 111 and the n-type electrode 108 having superior junction and anticorrosion properties can be easily manufactured.

Embodiment 9

Semiconductor Light-Emitting Element

Figure 21:
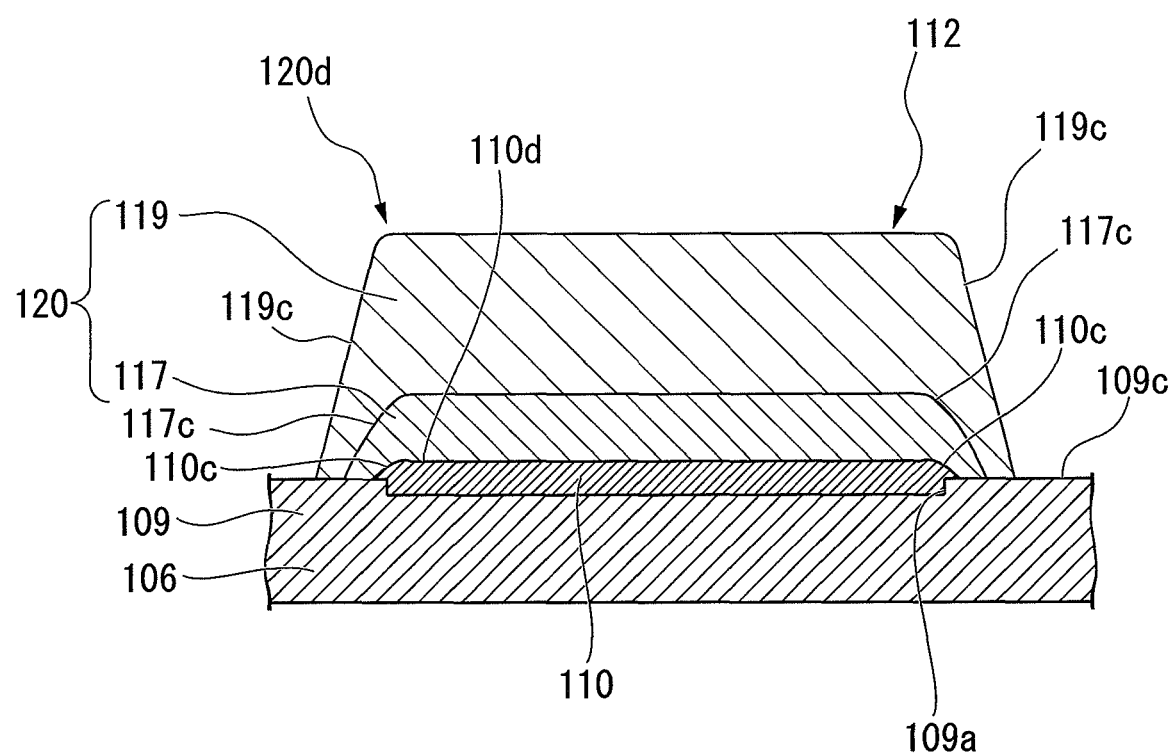
FIG. 21 is a view illustrating another example of a semiconductor light-emitting element according to the present invention, and a schematic enlarged cross-sectional view of a p-type electrode constituting the semiconductor light-emitting element.

FIG. 21 is a view illustrating another example of a semiconductor light-emitting element according to the present invention, and is a schematic enlarged cross-sectional view illustrating a p-type electrode that constitutes the semiconductor light-emitting element. The semiconductor light-emitting element according to this embodiment as illustrated in FIG. 21 has the same configuration as that of the semiconductor light-emitting element 1 as illustrated in FIG. 14 except that the transparent protective film 10*a* and the edge portion protection film 10*b* are not formed in this embodiment. Accordingly, the same reference numerals are given to the same members as those according to Embodiment 7, and the explanation thereof will be omitted.

Also, the p-type electrode 112 that constitutes the semiconductor light-emitting element according to this embodiment can be formed in the same manner as the p-type electrode 111 as illustrated in FIG. 14 except that the transparent protective film 10*a* and the edge portion protection film 10*b* are not formed in this embodiment.

According to the semiconductor light-emitting element according to this embodiment as illustrated in FIG. 21, even in the case where the transparent protective film 10*a* and the edge portion protection film 10*b* are not formed, the p-type electrode 112 includes the transparent electrode 109 having the junction recess portion 109*a* on the upper surface 109*c* thereof, the junction layer 110 formed to cover the junction recess portion 109*a*, and the bonding pad electrode 120 formed to cover the junction layer 110 and having the slope 119*c*, which is made gradually thinner toward the outside and is formed in the outer circumference portion 120*d*. Accordingly, by the junction layer 110, the transparent electrode 109 and the bonding pad electrode 120 obtain sufficiently high junction strength, and thus the junction of the p-type electrode 112 becomes superior.

Further, even in the semiconductor light-emitting element as illustrated in FIG. 21, the bonding pad electrode 120 having the slope 119*c*, which is made gradually thinner toward the outside and is formed in the outer circumference portion 120*d*, is formed to cover the junction layer 110, and thus the penetration of the external air or moisture into the junction layer 110 can be effectively prevented, and thus superior anticorrosion property is obtained.

Embodiment 10

Semiconductor Light-Emitting Element

Figure 22:
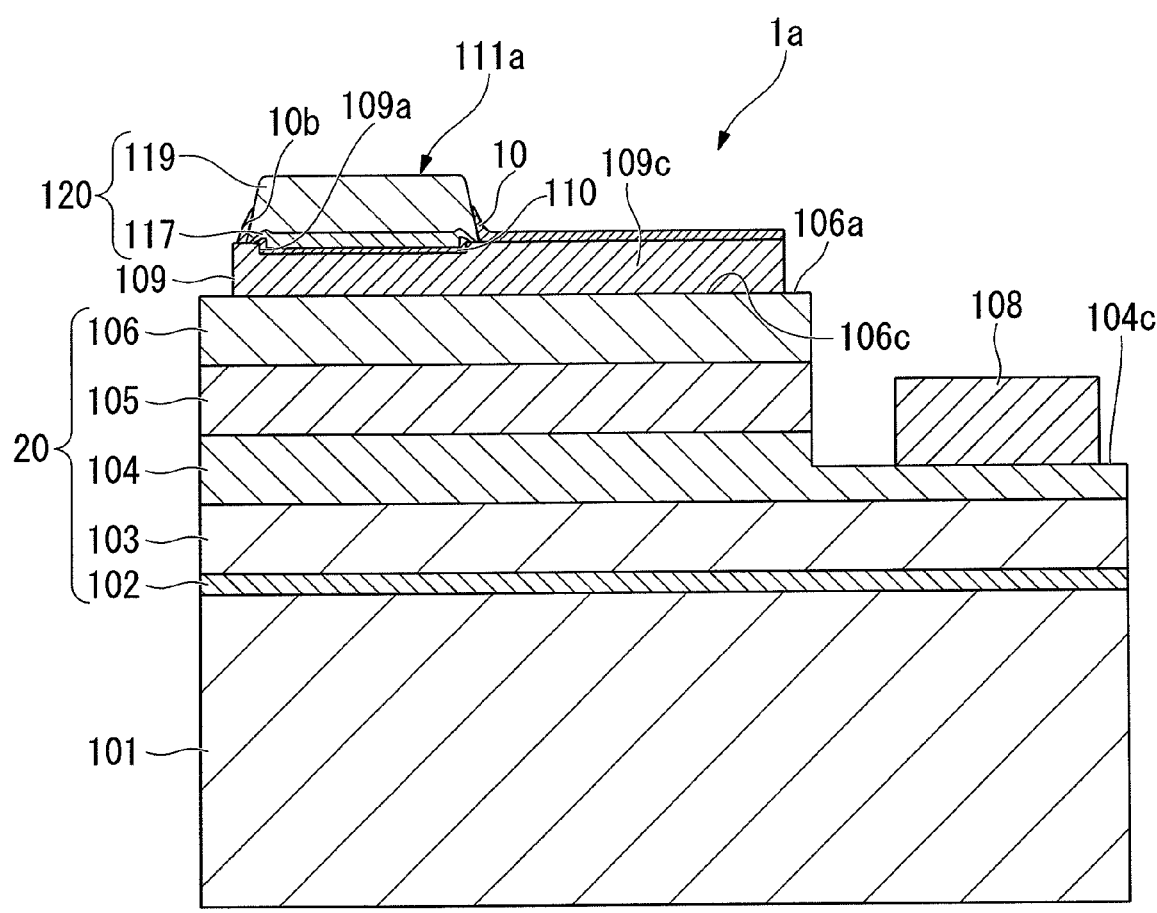
FIG. 22 is a view illustrating another example of a semiconductor light-emitting element according to the present invention, and a schematic cross-sectional view of the semiconductor light-emitting element.

FIG. 22 is a view illustrating another example of a semiconductor light-emitting element according to the present invention, and is a schematic cross-sectional view illustrating a semiconductor light-emitting element according to the present invention. The semiconductor light-emitting element 1*a* according to this embodiment as illustrated in FIG. 22 has the same configuration as that of the semiconductor light-emitting element 1 as illustrated in FIG. 14 except that the transparent protective film 10*a* is not formed, and as seen from the plane, an upper surface protection film 10 is installed on the entire surface of the upper surface 109*c* of the transparent electrode 109 except for the area that exposes the center portion of the bonding pad electrode 120 in this embodiment. Accordingly, the same reference numerals are given to the same members as those according to Embodiment 7, and the explanation thereof will be omitted.

The upper surface protection film 10 may be made of the same material as the transparent protective film 10*a* with the same thickness according to the semiconductor light-emitting element 1 as illustrated in FIG. 14.

In order to manufacture the semiconductor light-emitting element 1*a* as illustrated in FIG. 22, the n-type electrode 108 is formed after the laminated semiconductor layer 20 is formed in the same manner as the semiconductor light-emitting element 1 as illustrated in FIG. 14.

Figure 23:
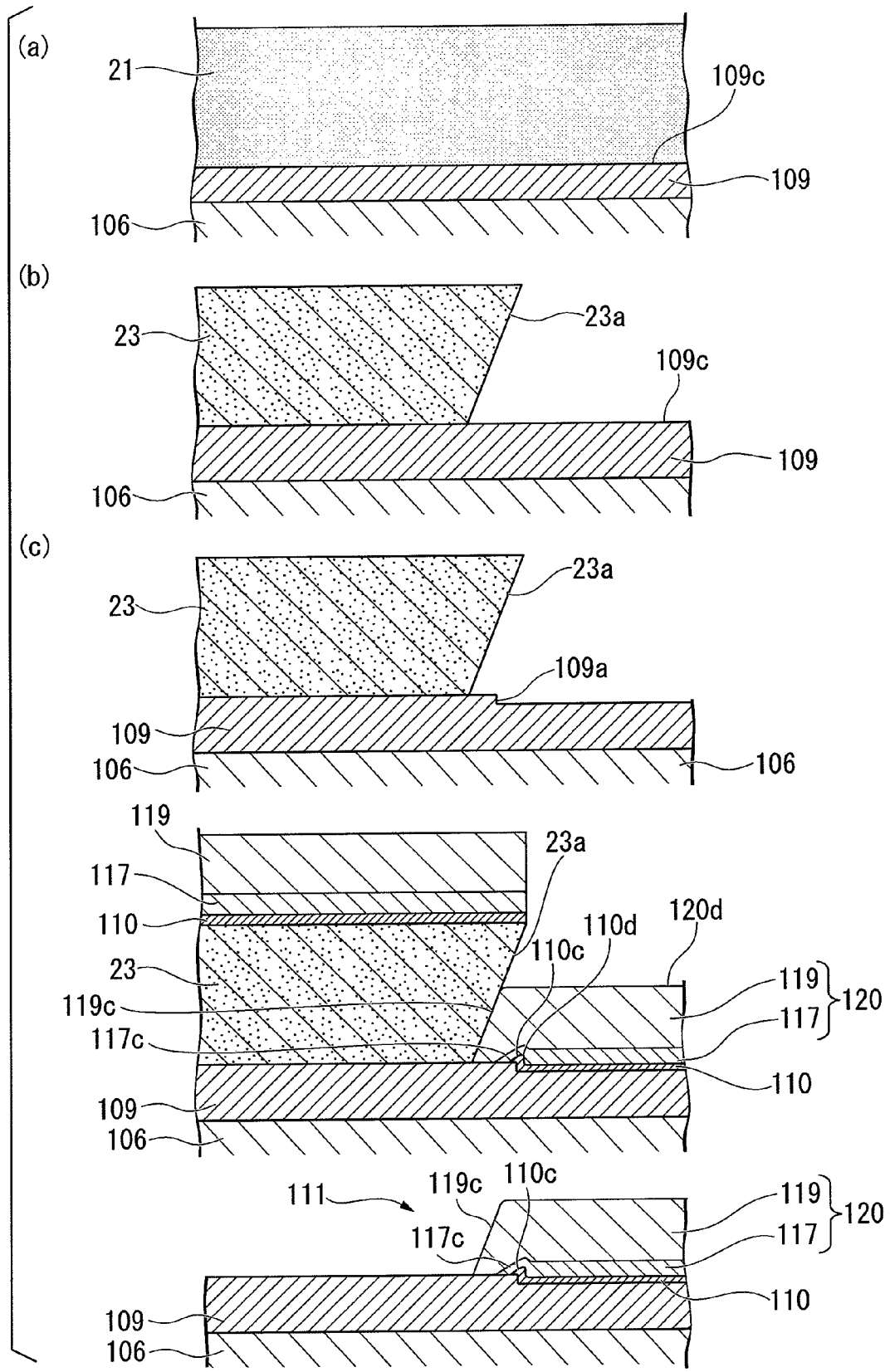
FIG. 23 is a view illustrating a step of manufacturing a p-type electrode, and an enlarged cross-sectional view illustrating only a portion of an area in which the p-type electrode is manufactured.

Then, as described below, the p-type electrode 111*a* is manufactured. FIG. 23 is a view illustrating a step of manufacturing the p-type electrode, and is an enlarged cross-sectional view illustrating only a portion of the area in which the p-type electrode 111*a* is manufactured.

As illustrated in FIG. 23(*a*), in order to manufacture the p-type electrode 111*a* according to this embodiment, the transparent electrode 109 is first formed on the p-type semiconductor layer 106 in the same manner as the semiconductor light-emitting element 1 as illustrated in FIG. 14.

Then, as illustrated in FIG. 23(*a*), a resist 21 is coated on the transparent protective film 10*a* to be dried, and a reverse-tapered mask 23 illustrated in FIG. 23(*b*), which has an opening 23*a* that is in the form of an inner wall of which the cross-sectional area is gradually widened toward the bottom surface, is formed on the upper surface 109*c* of the transparent electrode 109 in the same manner as the semiconductor light-emitting element 1 as illustrated in FIG. 14.

Then, a junction recess portion 109*a* is formed on the upper surface 109*c* of the transparent electrode 109, as illustrated in FIG. 23(*c*), by etching the transparent electrode 109 that is exposed from the opening 23*a* of the mask 23 as illustrated in FIG. 23(*b*) in the same manner as the semiconductor light-emitting element 1 as illustrated in FIG. 14.

Then, as illustrated in FIG. 23(*d*), in the same manner as the semiconductor light-emitting element 1 as illustrated in FIG. 14, a junction layer 110, a metal reflection layer 117, and a bonding layer 119 are formed. Thereafter, in the same manner as the semiconductor light-emitting element 1 as illustrated in FIG. 14, the mask 23 is peeled off. Accordingly, as illustrated in FIG. 23(*e*), a bonding pad electrode 120 including the metal reflection layer 117 and the bonding layer 119 is formed. Even in this embodiment, in the same manner as the semiconductor light-emitting element 1 as illustrated in FIG. 14, slopes 110c, 117c, and 119c, which are made gradually thinner toward the outside, are formed on the outer circumference portions of the junction layer 110, the metal reflection layer 117, and the bonding layer 119.

Next, using a known method in the related art, as seen from a plane, the upper surface protection film 10 is formed on the entire surface of the upper surface 109c of the transparent electrode 109, except for the area that exposes the center portion of the bonding pad electrode 120. By doing this, a semiconductor light-emitting element 1a having the p-type electrode 111a as illustrated in FIG. 22 is formed.

Even in the semiconductor light-emitting element 1a according to this embodiment, in the same manner as the semiconductor light-emitting element 1 as illustrated in FIG. 14, the junction and anticorrosion properties are obtained.

Also, according to the semiconductor light-emitting element 1a according to this embodiment, as seen from a plane, since the upper surface protection film 10 is formed on the entire surface of the upper surface 109c of the transparent electrode 109, except for the area that exposes the center portion of the bonding pad electrode 120, further more superior anticorrosion and junction properties can be obtained.

Embodiment 11

Lamp

Figure 24:
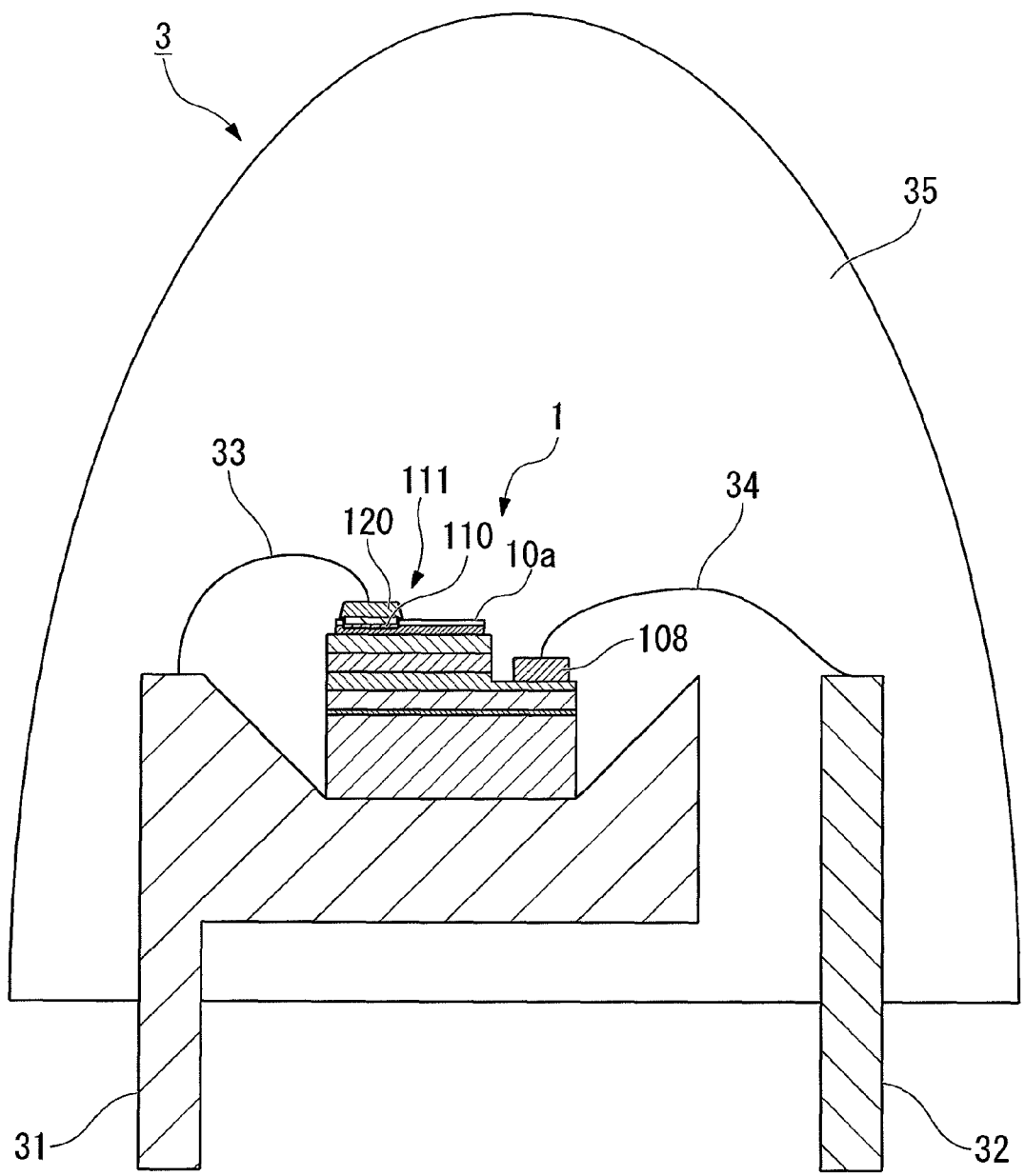
FIG. 24 is a schematic cross-sectional view illustrating an example of a lamp according to the present invention.

FIG. 24 is a schematic cross-sectional view illustrating an example of a lamp according to the present invention. As illustrated in FIG. 24, the lamp 3 according to this embodiment is in the form of a shell, and the semiconductor light-emitting element 1 according to the present invention as illustrated in FIG. 14 is built therein as the semiconductor light-emitting element. In this case, the lamp 3, for example, is configured by combining the semiconductor light-emitting element 1 and phosphors, and has a configuration that is known to those of ordinary skill in the art which is configured by a means that is known to those of ordinary skill in the art. Also, by combining the semiconductor light-emitting element 1 with phosphors, it is known that the light-emitting color can be changed, and it is possible to adopt such technology even in the lamp according to an embodiment of the present invention without any limitation.

As illustrated in FIG. 24, the lamp 3 according to this embodiment includes one frame 31 which is bonded by a wire 33 to the bonding pad electrode 120 of the p-type electrode 111 of the semiconductor light-emitting element 1, the other frame 32 which is bonded by a wire 34 to the n-type electrode 108 (bonding pad) of the semiconductor light-emitting element 1, and a mold 35 made of transparent resin that is formed around the neighborhood of the semiconductor light-emitting element 1.

Since the lamp 3 according to this embodiment is provided with the semiconductor light-emitting element 1 as illustrated in FIG. 14, which has the p-type electrode 111 having superior junction and anticorrosion properties as a semiconductor light-emitting element 1, the junction of the p-type electrode 112 is superior, and thus the lamp 3 can be manufactured with good yield and superior anticorrosion property.

The lamp 3 according to this embodiment may be used in any type for any purpose, such as a shell type for general use, a side view type for a portable backlight, a top view type for use in a displayer, and the like.

Also, since the lamp 3 manufactured from the semiconductor light-emitting element according to the present invention has superior effect as described above, an electronic appliance incorporated with the lamp manufactured by this technique, such as a backlight, portable phone, display, various kinds of panels, computer, game machine, illumination, or the like, and a mechanical device such as a vehicle incorporated with the electronic appliance can provide high reliability as the product in use. Particularly, in an appliance that drives a battery, such as a backlight, portable phone, display, game machine, illumination, or the like, a product provided with a light-emitting element having superior anticorrosion property and high reliability can be preferably provided.

(Method of Manufacturing a Semiconductor Light-Emitting Element in Embodiment 12)

Next, a method of manufacturing a semiconductor light-emitting element according to the present invention will be described. The method of manufacturing a semiconductor light-emitting element according to Embodiment 12 is the method of manufacturing a semiconductor light-emitting element 1 as illustrated in FIG. 26.

In order to manufacture the semiconductor light-emitting element 1 as illustrated in FIG. 26, a laminated semiconductor layer 20 is first formed on the substrate 101. By forming a laminated semiconductor layer 20 using the MOCVD method, a good crystallinity can be obtained. However, by optimizing the conditions in forming a laminated semiconductor layer 20 using the sputtering method, the crystallinity, which is more superior to that obtained in the MOCVD method, can be obtained. Hereinafter, the "forming of the laminated semiconductor layer" including a buffer layer forming step, a under-layer forming step, an n-type semiconductor layer forming step, a light-emitting layer forming step, and a p-type semiconductor forming step is performed based on the method of manufacturing a semiconductor light-emitting element according to Embodiment 1 as described above. Through the above-described steps, the laminated semiconductor layer 20 is formed, and then an n-type electrode 108 and a p-type electrode 111 are formed.

In this embodiment, using FIGS. 30 to 33, in a step of manufacturing an n-type electrode 108 and a step of manufacturing a p-type electrode 111, a manufacturing method for simultaneously performing respective layers of an ohmic junction layer 9, a junction layer 110, and a bonding pad electrode 120 and simultaneously performing heat-treatment for heightening the adhesion of the ohmic junction layer 9 and the junction layer 110 will be described.

Figure 30:
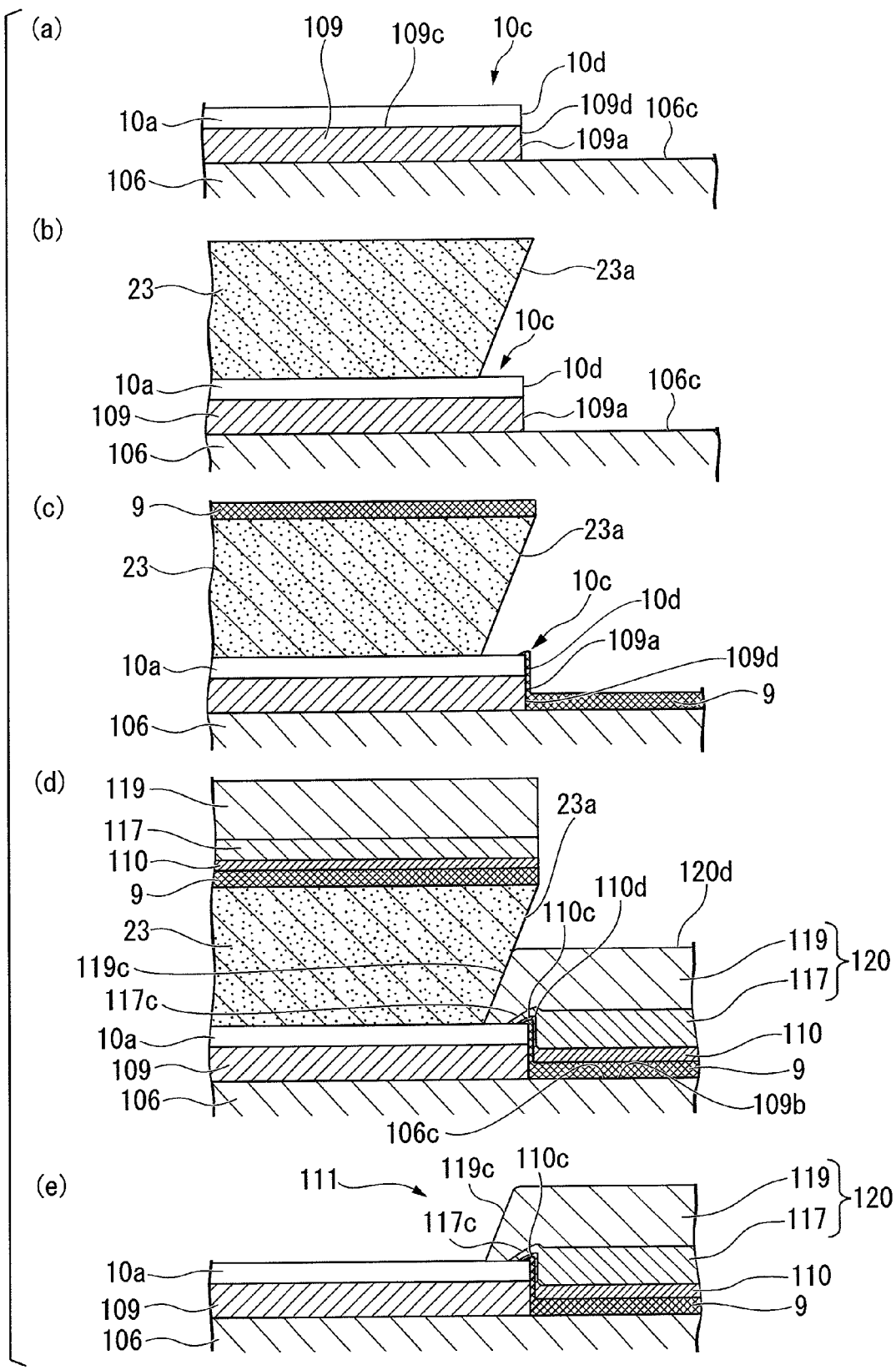
FIG. 30 is a view illustrating a step of manufacturing a p-type electrode, and an enlarged cross-sectional view illustrating only a portion of an area where a p-type electrode 111 is manufactured.
Figure 31:
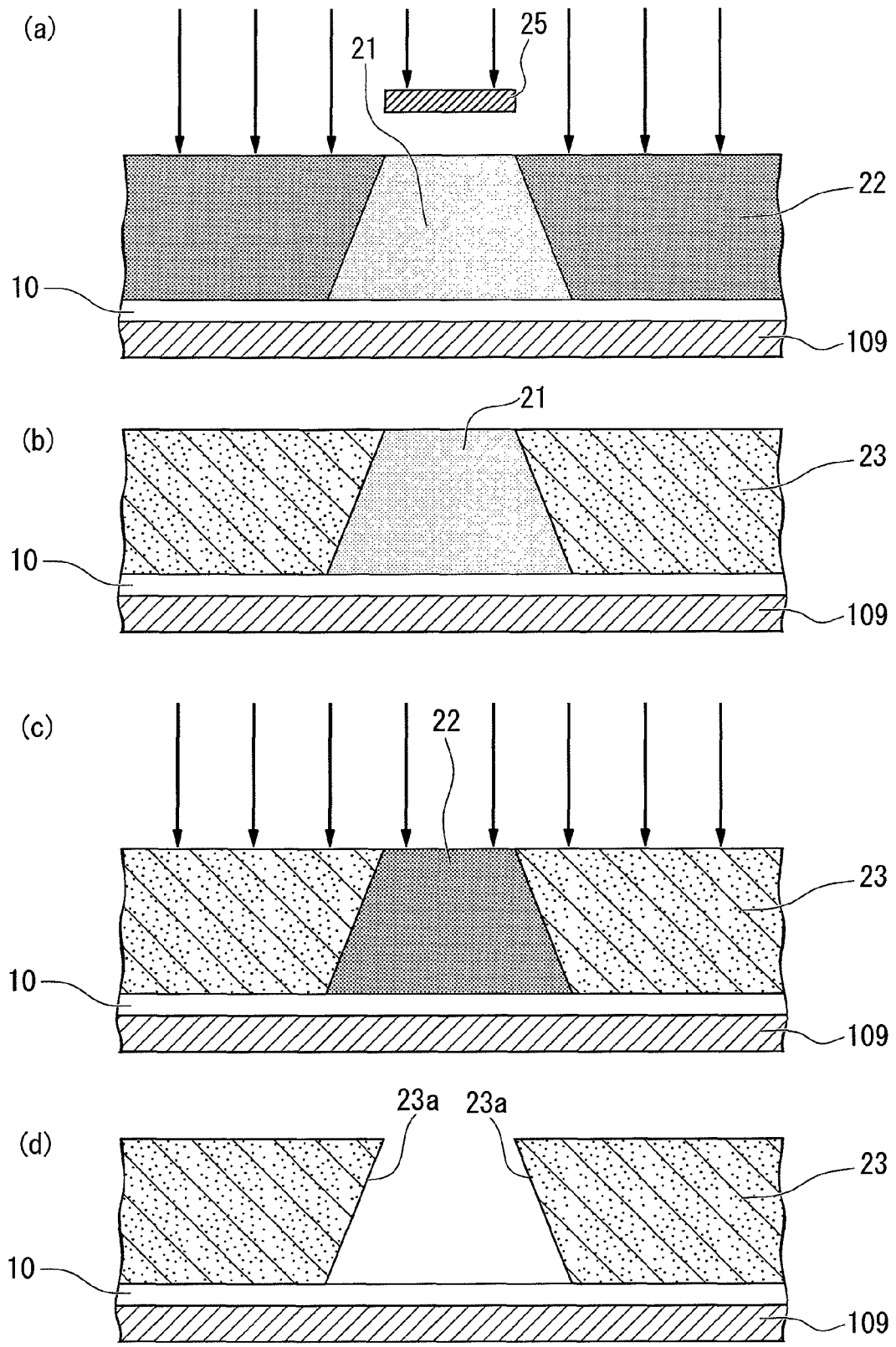
FIG. 31 is a view illustrating a step of manufacturing a mask that is formed when an n-type electrode and a p-type electrode are manufactured, and an enlarged cross-sectional view illustrating only an area where one p-type electrode is formed.
Figure 32:
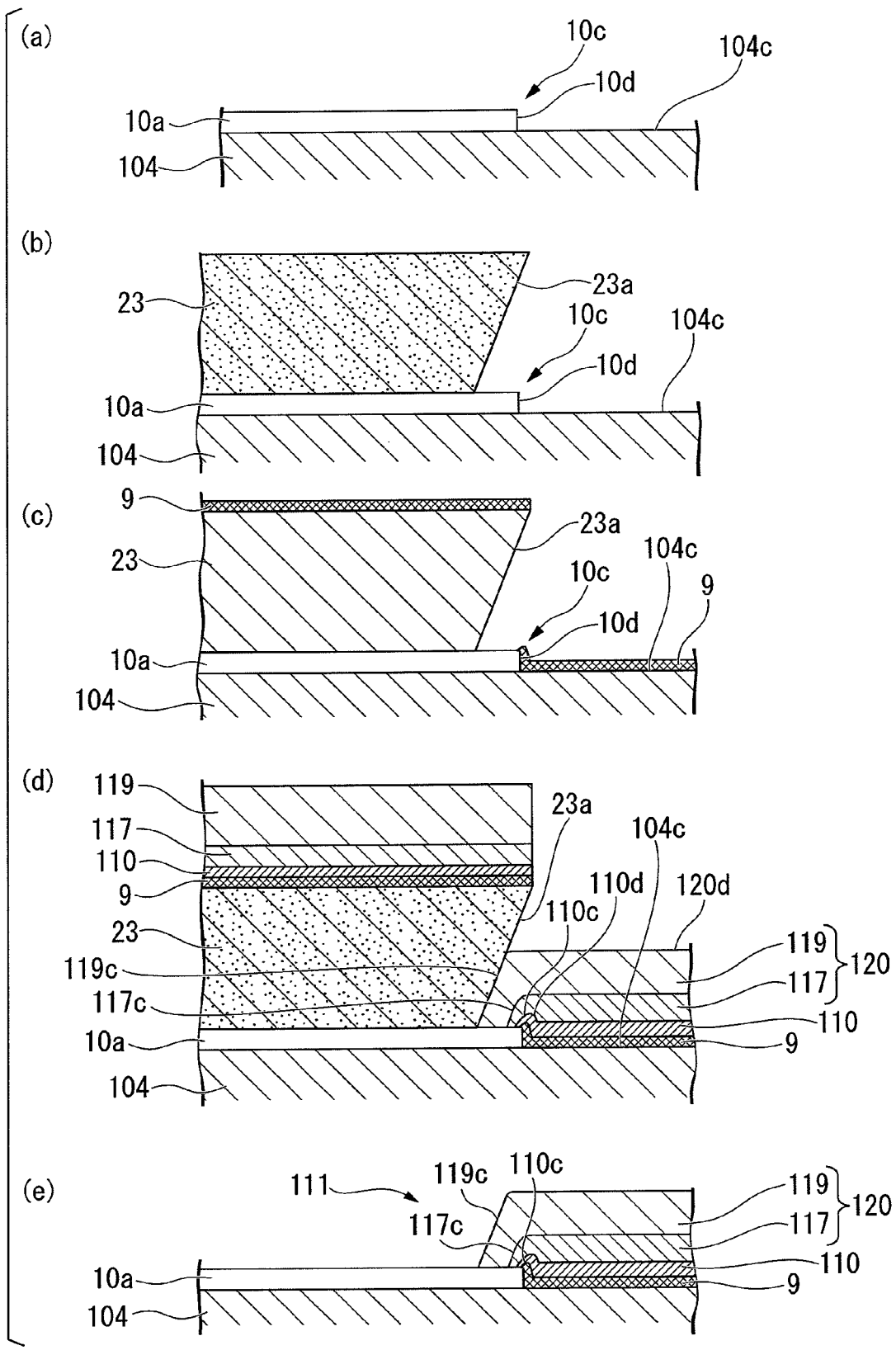
FIG. 32 is a view illustrating a step of manufacturing an n-type electrode, and an enlarged cross-sectional view illustrating only a portion of an area where an n-type electrode is manufactured.
Figure 33:
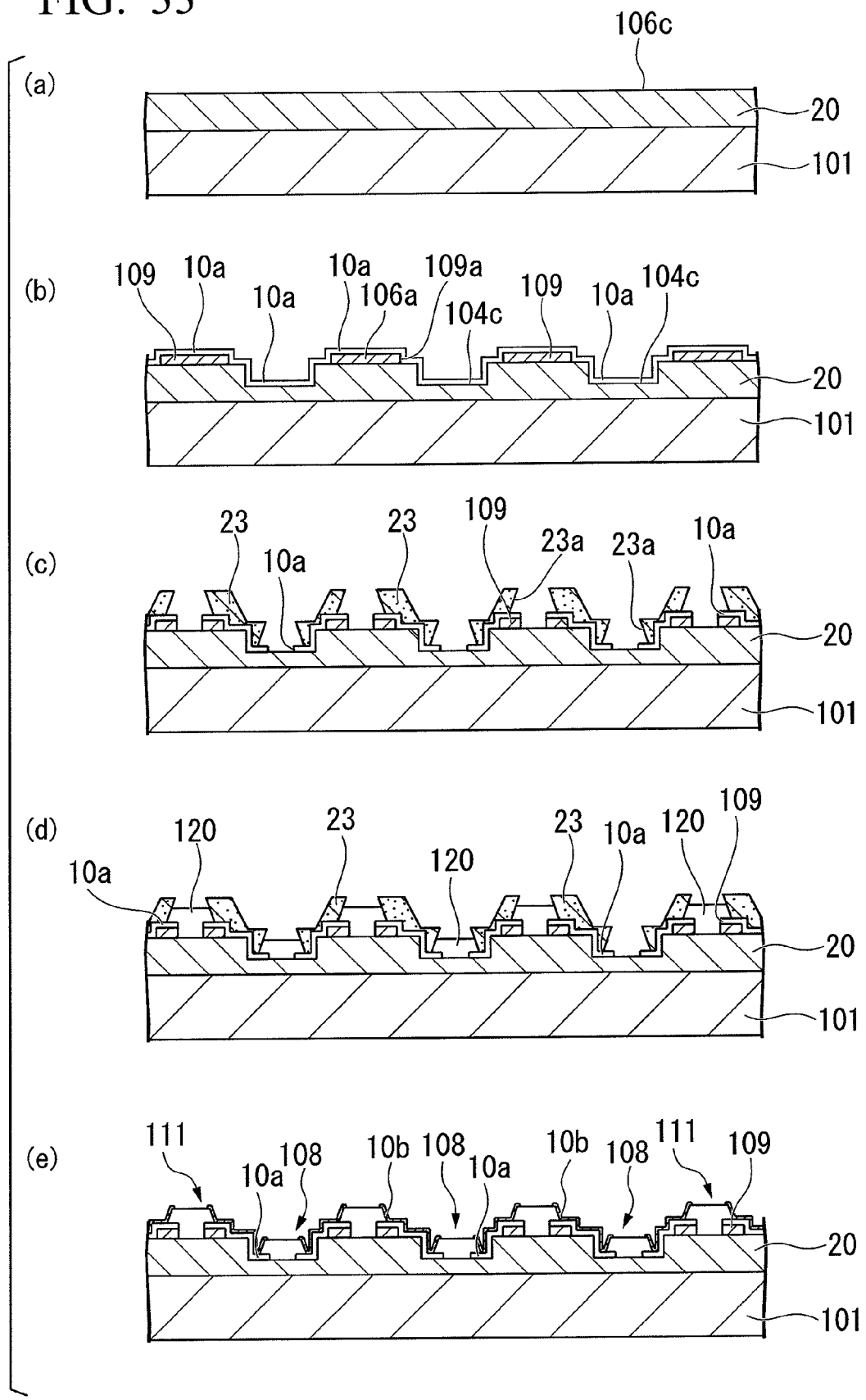
FIG. 33 is a schematic view illustrating a step of manufacturing an n-type electrode 108 and a p-type electrode 111.

FIG. 33 is a schematic view illustrating a step of manufacturing an n-type electrode 108 and a p-type electrode 111. FIG. 30 is a view illustrating a step of manufacturing a p-type electrode, and an enlarged cross-sectional view illustrating only a portion of an area where a p-type electrode 111 is manufactured. Also, FIG. 31 is a view illustrating a step of manufacturing a mask that is formed when an n-type electrode 108 and a p-type electrode 111 are manufactured, and an enlarged cross-sectional view illustrating only an area where one p-type electrode 111 is formed. Also, FIG. 32 is a view illustrating a step of manufacturing an n-type electrode, and an enlarged cross-sectional view illustrating only a portion of an area where an n-type electrode is manufactured.

First, by patterning a laminated semiconductor layer 20 as illustrated in FIG. 33(a) using a known photolithography method, a portion of an n-contact layer 104a is exposed by etching a portion of the laminated semiconductor layer 20 in a predetermined area.

Next, as illustrated in FIG. 33(b), a transparent electrode 109 is formed on a p-type semiconductor layer 106 of the laminated semiconductor layer 20. The transparent electrode 109 is formed in a manner that a mask that covers an area except for an area where the transparent electrode 109 is formed, such as an exposed surface 104c of the n-contact layer 104a on which an n-type electrode 108 is formed, the transparent electrode 109 is formed on the p-type semiconductor layer 106 using a known method such as a sputtering method, and then the mask is removed. In this case, the transparent electrode 109 may be formed after etching the laminated semiconductor layer 20 for forming the n-type electrode 108, or may be formed before etching the laminated semiconductor layer 20 for forming the n-type electrode 108.

Next, a protection film 10a is formed on the upper surface 109c of the transparent electrode 109 as illustrated in FIG. 30(a), and a protection film 10a is formed on an exposed surface 104c of the n-type semiconductor layer 104 as illustrated in FIG. 32(a).

Then, by removing the protection film 10a using RIE (Reactive Ion Etching) in a direction vertical to the upper surface 109c of the transparent electrode 109 and the exposed surface 104c of the n-type semiconductor layer 104, as illustrated in FIG. 30, an opening 10d is formed, through which the upper surface 109c of the transparent electrode 109 and the exposed surface 104c of the n-type semiconductor layer 104 are exposed from the opening 10d. Since the RIE (Reactive Ion Etching) is an etching method which has high directivity and low curvature as illustrated in FIG. 30, the end portion 10c of the protection film 10a remains roughly in a perpendicular shape.

Thereafter, by etching the transparent electrode 109 that is exposed from the opening 10a of the protection film 10d, as illustrated in FIG. 30, a hole portion 109a is formed on the transparent electrode 109. By forming the hole portion 109a, the inner wall 109d of the hole portion 109a that is exposed from the transparent electrode 109 has superior adhesion with the ohmic junction layer 9 in comparison to the upper surface 109c of the transparent electrode 109. Here, in the case where the transparent electrode 109 that is etched is an IZO film in an amorphous state, the hole portion 109a of a specified shape can be easily formed due to the superior etching property. The IZO film in an amorphous state can be easily etched with good accuracy using a known etchant (ITO-07N etchant (product of Kanto Chemical Co., Ltd.)). Also, the etching of the IZO film in an amorphous state may be performed using a dry etching device. In this case, $Cl_2$, $SiCl_4$, $BCl_3$, and the like, may be used as an etching gas.

Here, in the case where the transparent electrode 109 is, for example, an IZO film in an amorphous state, it is preferable that the IZO film in an amorphous state be an IZO film including $In_2O_3$ crystal of a hexagonal crystal structure or an IZO film including $In_2O_3$ crystal of a bixbyite structure by performing heat-treatment. By shifting the film in an amorphous state into a structure that includes the crystal by the heat-treatment or the like, the transparent electrode 109 having good transparency and adhesion with the ohmic junction layer 9 and the junction layer 110 rather than the amorphous IZO film can be made. However, since it is difficult to perform the etching of the IZO film including $In_2O_3$ crystal of a hexagonal crystal structure as described above, it is preferable to perform the heat-treatment after the above-described etching process.

In the case of crystallizing the IZO film in an amorphous state, if the film-forming condition, heat-treatment condition, or the like, is different, the crystal structure in the IZO layer becomes different. The heat-treatment for crystallizing the IZO film is performed preferably in the atmosphere that does not include $O_2$. The atmosphere that does not include $O_2$ may be an inert gas atmosphere such as $N_2$ atmosphere, a mixed gas atmosphere including an inert gas such as $N_2$ and $H_2$, or the like, and preferably an $N_2$ atmosphere or a mixed gas atmosphere including $N_2$ and $H_2$. In this case, if the heat-treatment of the IZO film is performed in an $N_2$ atmosphere or a mixed gas atmosphere including $N_2$ and $H_2$, for example, it is possible to crystallize the IZO film on a film that includes $In_2O_3$ crystal of a hexagonal crystal structure and to effectively reduce sheet resistance of the IZO film.

Also, the heat-treatment temperature for crystallizing the IZO film is preferably 250° C. to 1000° C., and more preferably 500° C. to 700° C. In the case of performing the heat-treatment at a temperature less than 250° C., the IZO film may not be sufficiently crystallized, and thus the light permeability of the IZO film may not be sufficiently high. In the case of performing the heat-treatment at a temperature exceeding 1000° C., the IZO film may be crystallized, but the light permeability of the IZO film may not be sufficiently high. Also, In the case of performing the heat-treatment at a temperature exceeding 1000° C., the semiconductor layer located below the IZO film may deteriorate.

The heat-treatment for crystallizing the IZO film that forms the transparent electrode 109 may be performed just after the hole portion 109a is formed on the transparent electrode 109, or may be performed after the junction layer 110 is formed on the ohmic junction layer 9. In the case of performing the heat-treatment for crystallizing the IZO film that forms the transparent electrode 109 after forming the junction layer 110, the heat-treatment for crystallizing the IZO film and the heat-treatment for improving the adhesion between the ohmic junction layer 9 and the junction layer 110 can be simultaneously performed, and thus the frequency of heat-treatment can be reduced with simplification of the manufacturing step.

Thereafter, by coating and drying resist on the protection film 10a and removing the resist on a portion that corresponds to the portion on which the bonding pad electrode 120 is formed, a reverse-tapered mask 23 having an opening 23a that is in the form of an inner wall, of which the cross-sectional area is gradually widened toward the bottom surface, is formed on the upper surface 109c of the transparent electrode 109, on which the protection film 10a as illustrated in FIG. 30(b) is formed, and on the exposed surface 104c of the n-type semiconductor layer 104, on which the protection film 10a as illustrated in FIG. 32(b) is formed, is formed (see FIG. 33(c)). In this case, as illustrated in FIGS. 30(b) and 33(c), the opening 23a of the mask 23 that is formed on the transparent electrode 109 is formed on the position from which the hole portion 109a of the transparent electrode 109 is exposed.

The method of forming the reverse-tapered mask 23 as illustrated in FIGS. 30(b), 32(b), and 33(c) may be a method using the n-type photoresist or a method using an image reversion type photoresist. In this embodiment, using FIG. 31, a method of forming a mask as illustrated in FIGS. 30(b) and 32(b) using the image reversion type photoresist will be described.

In this embodiment, as the resist 21 illustrated in FIG. 31(a), insoluble resist that is an image reversion type photoresist is used. As the image reversion type photoresist, for example, AZ5200NJ (product name: product of AZ Electronic Materials) may be used.

Next, as illustrated in FIG. 31(a), a mask 25 is arranged to cover a predetermined position on the upper side of the resist 21, and as indicated by an arrow in FIG. 31(a), light of a predetermined intensity and wavelength is radiated from the side of the mask 25 to the side of the resist 21. Accordingly, an optical reaction of the resist 21 on a portion, to which the light is radiated, occurs to form a soluble portion 22. Since this optical reaction progresses in accordance with the intensity of light, the light reaction progresses fast on the light irradiation surface side, and the light reaction progresses slowly on the side of the transparent electrode 109. Due to this, the soluble portion 22, as seen from the cross-section, as illustrated in FIG. 31(a), is formed to be in a reverse-tapered shape (reversely inclined shape), in which the side surface of the portion is inwardly receded toward the lower side of the portion. Also, the resist 21 of the portion covered by the mask 25 remains as the insoluble resist (insoluble portion) 21, and as seen from the cross-section, is formed to be in a tapered shape (inclined shape), in which the side surface is inwardly receded toward the upper side thereof.

Next, using a heating device such as a hot plate or an oven, the substrate is heated, and as illustrated in FIG. 31(b), the soluble portion 22 is made to thermally react to form the hardened portion (mask) 23 composed of crosslinked polymer.

Thereafter, as illustrated in FIG. 31(c), the light with the predetermined intensity and wavelength is radiated onto the insoluble resist 21 and the surface side of the hardened portion (mask) 23 composed of the crosslinked polymer, without using a mask, and as described above using FIG. 31(a), an optical reaction of the insoluble resist 21, which has not been transformed into the soluble resist 22 by the optical reaction, occurs to form the soluble portion 22.

Lastly, by dissolving and removing the soluble portion 22 as illustrated in FIG. 31(c) using a predetermined developing solution, as illustrated in FIG. 31(d), the mask 23 composed of crosslinked polymer, in a reverse-tapered shape (reversely inclined shape), having an opening 23a, in which the side surface is inwardly receded toward the lower side of the portion, is obtained.

[Pad Forming Step]

Thereafter, by the sputtering method, the ohmic junction layer 9 is formed on the upper surface 106c of the laminated semiconductor layer 20 (the bottom surface 109b of the hole portion 109a) as illustrated in FIG. 30(c) and on the exposed surface 104c of the n-type semiconductor layer 104 as illustrated in FIG. 32(c) to cover the inner wall 109d of the hole portion 109a of the transparent electrode 109 and the end portion 10c of the opening 10d of the protection film 10a, using the same material as the material that forms the transparent electrode 109.

Thereafter, as illustrated in FIGS. 30(d) and 32(d), by the sputtering method, the junction layer 110 is formed to cover the ohmic junction layer 9 and the end portion 10c of the opening 10d of the protection film 10a. In this case, by using the sputtering method that controls the sputter conditions, the junction layer 110 can be formed with high coverage. Accordingly, the junction layer 110 is formed to cover the entire surface of the ohmic junction layer 9 and a portion of the end portion 10c of the protection film 10a, and slope 110c, which is made gradually thinner toward the outside, is formed on the outer circumference portion 110d of the junction layer 110.

In this case, before the junction layer 110 is formed, preprocessing for cleaning the surfaces of the ohmic junction layer 9, on which the junction layer 110 is formed, and the end portion 10c of the opening 10d of the protection film 10a may be performed.

Here, the cleaning method may be a method by a dry process that exposes the transparent electrode to plasma or the like or a method by a wet process that makes the transparent electrode in contact with a chemical solution, and from the viewpoint of convenience in the step, the dry process is preferable.

Next, by the sputtering method, the metal reflection layer 117 is formed. In this case, in the same manner as the case of forming the junction layer 110, the sputtering method that controls the sputter conditions is used, and thus the coverage of the metal reflection layer 117 can be heightened. The metal reflection layer 117 is formed, which covers the junction layer 110 and has an slope 117c, which is formed on the outer circumference portion of the metal reflection layer 117 and is made gradually thinner toward the outside.

Next, by the sputtering method, the bonding layer 119 is formed. In this case, by using the sputtering method that controls the sputter conditions, the bonding layer 119 can be formed with high coverage. The bonding layer 119 is formed, of which the outer circumference portion is shaped along the inner wall shape of the opening 23a of the mask 23, and which covers the metal reflection layer 117 and has an slope 119c, which is formed on the outer circumference portion 120d of the bonding layer 119 (bonding pad electrode 120) and is made gradually thinner toward the outside (see FIG. 33(d)).

Thereafter, by soaking in a resist peel-off solution, the mask 23 composed of crosslinked polymer is peeled off. Accordingly, as illustrated in FIGS. 30(e) and 32(e), the bonding pad electrode 120 that is composed of the metal reflection layer 117 and the bonding layer 119 is formed.

In this embodiment, since the mask 23 including the opening 23a having the inner wall shape, of which the cross-sectional area is gradually widened toward a bottom surface, is formed, and the junction layer 110, the metal reflection layer 117, and the bonding layer 119 are formed by the sputtering method having high coverage, layers having different inclination angles are formed according to the thickness of the respective layers including the junction layer 110, the metal reflection layer 117, and the bonding layer 119 in an area that becomes a shadow of the mask 23 as seen from the sputter direction. Accordingly, on the outer circumference portions of the junction layer 110, the metal reflection layer 117, and the bonding layer 119, slopes 110c, 117c, and 119c, which are made gradually thinner toward the outside, are formed.

[Heat Treatment Step]

Thereafter, in order to heighten the adhesion between the ohmic junction layer 9 and the junction layer 110, a heat-treatment is performed at a temperature of 80° C. to 700° C. Here, the heat-treatment may be performed in the same manner as the heat-treatment for crystallizing the transparent electrode 109 composed of an IZO film in an amorphous state. Accordingly, for example, in the case where the ohmic junction layer 9 is the IZO film in an amorphous state, the IZO film in an amorphous state becomes an IZO film that includes $In_2O_3$ crystal of a hexagonal crystal structure or an IZO film that includes $In_2O_3$ crystal of a bixbyite structure by the heat-treatment. By shifting the film in an amorphous state into a structure that includes the crystal by the heat-treatment or the like, the ohmic junction layer 9 having good transparency and adhesion with the junction layer 110 rather than the amorphous IZO film can be made.

Next, using a known method, the edge portion protection film 10b, which is roughly in the form of a donut that exposes the center portion of the bonding pad electrode 120 as seen from the plane, and covers the outer edge portion of the bonding pad electrode 120 over a juncture portion of the outer edge portion (contour-line) of the bonding pad electrode 120 and the protection film 10a, is formed (see FIG. 33(d)). In this embodiment, the edge portion protection film 10b is formed on the entire area, as seen from the plane, except for the area that exposes the center portion of the bonding pad electrode 120.

Here, in this embodiment, on the outer circumference 120d of the bonding pad electrode 120, an slope 119c, which is made gradually thinner toward the outside, is formed, and the edge portion protection film 10b is easily formed on the slope 119c of the bonding pad electrode 120 with a uniform thickness. By this, a portion, in which the edge portion protection film 10b is not formed on the portion that is a juncture portion of the outer edge portion (contour-line) of the bonding pad electrode 120 and the protection film 10a, is prevented from occurring, and thus the edge portion protection film 10b can be easily and closely formed over the portion that is a juncture portion of the outer edge portion (contour-line) of the bonding pad electrode 120 and the protection film 10a with a uniform thickness.

By doing this, a semiconductor light-emitting element 1 having the n-type electrode 108 and the p-type electrode 111 as illustrated in FIG. 26 are formed.

According to the semiconductor light-emitting element 1 according to this embodiment, the n-type electrode 108 and the p-type electrode 111 include an ohmic junction layer 9 formed on the upper surface 106c of the laminated semiconductor layer 20 or the exposed surface 104c of the n-contact layer 104a, a junction layer 110 formed on the ohmic junction layer 9, and a bonding pad electrode 120 formed to cover the junction layer 110. Since both the n-type electrode 108 and the p-type electrode 111 obtain sufficiently high junction strength of the ohmic junction layer 9 against the bonding pad electrode 120 by the junction layer 110 and the bonding pad electrode 120, the n-type electrode 108 and the p-type electrode 111 having superior junction are provided.

Further, according to the semiconductor light-emitting element 1 according to this embodiment, since the bonding pad electrode 120 having an slope 119c, which is made gradually thinner toward the outside, formed on the outer circumference portion 120d is formed to cover the junction layer 110, no portion of the junction layer 110 is exposed from the lower part of the bonding pad electrode 120. Thus, according to the semiconductor light-emitting element 1 according to this embodiment, the penetration of external air or moisture into the junction layer 110 of the semiconductor light-emitting element 1 can be effectively prevented, and thus the superior anticorrosion property thereof can be obtained. Also, superior junction can be obtained between the laminated semiconductor layer 20, the transparent electrode 109, and the bonding pad electrode 120 by the junction layer 110.

Further, in the semiconductor light-emitting element 1 according to this embodiment, since the protection film 10a is formed to cover an area except for the area where the ohmic junction layer 9 of the p-type electrode 111 is formed and the area where the ohmic junction layer 9 of the n-type electrode 108 is formed, and the outer edge portion of the junction layer 110 and the outer edge portion of the bonding pad electrode 120 are arranged on the protection film 10a, so that further more superior anticorrosion and junction properties can be obtained.

Also, in the semiconductor light-emitting element 1 according to this embodiment, the bonding pad electrode 120 includes the metal reflection layer 117 and the bonding layer 119. No portion of the junction layer 110 is exposed from the lower part of the metal reflection layer 117, no portion of the metal reflection layer 117 is exposed from the lower part of the bonding layer 119, and the junction layer 110 is doubly covered by the metal reflection layer 117 and the bonding layer 119. Further, in the semiconductor light-emitting element 1 according to this embodiment, the outer edge portion of the bonding pad electrode 120 is arranged on the protection film 10a. Accordingly, in the semiconductor light-emitting element 1 according to this embodiment, external air or moisture is unable to invade the junction layer 110 of the semiconductor light-emitting element 1 without passing through the junction surface between the protection film 10a and the bonding layer 119 and the junction surface between the protection film 10a and the metal reflection layer 117. Accordingly, in this embodiment, the penetration of the external air or moisture into the junction layer 110 of the semiconductor light-emitting element 1 can be prevented more effectively, and thus the deterioration of junction and anticorrosion properties due to the deterioration of the junction layer 110 can be effectively prevented.

Also, in the semiconductor light-emitting element 1 according to this embodiment, since the edge portion protection film 10b, which covers the outer edge portion of the bonding pad electrode 120 and exposes a portion of the bonding pad electrode 120, is formed, further more superior anticorrosion and junction properties can be obtained. Further, according to the semiconductor light-emitting element 1 according to this embodiment, since the bonding pad electrode 120 having an slope 119c, which is made gradually thinner toward the outside, formed on the outer circumference 120d is formed to cover the junction layer 110, a contact surface area between the outer circumference portion 120d of the bonding pad electrode 120 and the lower surface of the outer circumference portion 120d of the bonding pad electrode 120 (in this embodiment, protection film 10a) can be sufficiently secured to obtain superior junction, and the penetration of the external air or moisture into the junction layer 110 through a portion between the outer circumference portion 120d of the bonding pad electrode 120 and the lower surface thereof can be effectively prevented to provide further more superior anticorrosion property.

In the semiconductor light-emitting element 1 according to this embodiment, since the n-type electrode 108 and the p-type electrode 111 are equal to each other except that the transparent electrode 109 is not installed on the n-type electrode 108, the n-type electrode 108 and the p-type electrode 111 can be simultaneously formed, and thus the productivity becomes superior to facilitate the manufacturing of the semiconductor light-emitting element 1.

For example, in the semiconductor light-emitting element 1 according to this embodiment, if a metal such as Ti/Au is used on the exposed surface 104c of the n-contact layer 104a as the n-type electrode, the n-type electrode and the p-type electrode 111 are not simultaneously formed.

By contrast, in the semiconductor light-emitting element 1 according to this embodiment, if the n-type electrode 108, the p-type electrode 111, and the bonding pad electrode which covers the electrodes and their junction portion are made of the same material except that the transparent electrode 109 is not installed on the n-type electrode 108, the manufacturing conditions of both the n-type electrode 108 and the p-type electrode 111 can be easily optimized in this embodiment. Accordingly, in the semiconductor light-emitting element 1 according to this embodiment, by optimizing the manufacturing conditions of the n-type electrode 108 and the p-type electrode 111, the n-type electrode 108 and the p-type electrode 111 having superior adhesion with the ohmic junction layer 9 and the junction layer 110 can be provided.

Also, according to the method of manufacturing a semiconductor light-emitting element 1 according to this embodiment, since both the step of manufacturing the n-type electrode 108 and the step of manufacturing the p-type electrode 111 include the step of performing heat-treatment at 250° C. to 700° C., which improves the adhesion with the ohmic junction layer 9 and the junction layer 110, the junction layer 110 having superior adhesion with the ohmic junction layer 9 is obtained, and thus the semiconductor light-emitting element 1 having superior adhesion between the ohmic junction layer 9 and the bonding pad electrode 120 can be obtained.

Also, according to the method of manufacturing a semiconductor light-emitting element 1 according to this embodiment, since both the step of manufacturing the n-type electrode 108 and the step of manufacturing the p-type electrode 111 include the step of forming the ohmic junction layer 9 on the upper surface 106c of the laminated semiconductor layer 20 and on the exposed surface 104c of the n-contact layer 104a, the step of forming the junction layer 110 on the ohmic junction layer 9, the step of forming the bonding pad electrode 120 to cover the junction layer 110, and the step of performing the heat-treatment at a temperature of 250° C. to 700° C. to improve the adhesion between the ohmic junction layer 9 and the junction layer 110, the same material can be used for the ohmic junction layer 9, the junction layer 110, and the bonding pad electrode 120 in the step of manufacturing the n-type electrode 108 and the step of manufacturing the p-type electrode 111, and thus the semiconductor light-emitting element 1 can be easily manufactured in comparison to the semiconductor light-emitting element in which different materials are used for the n-type electrode 108 and the p-type electrode 111.

Also, according to the method of manufacturing a semiconductor light-emitting element 1 according to this embodiment, since the pad forming step and the heat-treatment step are simultaneously performed in the step of manufacturing the n-type electrode 108 and the step of manufacturing the p-type electrode 111, and thus the semiconductor light-emitting element 1 can be easily and efficiently manufactured with superior productivity in comparison to the semiconductor light-emitting element in which the pad forming step and the teat treatment step are separately performed.

In this case, according to the method of manufacturing a semiconductor light-emitting element 1 according to this embodiment, it is exemplified that for easy and efficient manufacturing, the ohmic junction layer 9 forming the n-type electrode 108, the junction layer 110, the bonding pad electrode 120, the ohmic junction layer 9 forming the p-type electrode 111, the junction layer 110, and the bonding pad electrode 120 are simultaneously formed. However, the ohmic junction layer 9, the junction layer 110, and the bonding pad electrode 120 may be separately formed for the n-type electrode 108 and the p-type electrode 111, or only a part of the ohmic junction layer 9, the junction layer 110, and the bonding pad electrode 120, which form the n-type electrode 108 and the p-type electrode 111 may be separately formed.

Also, in according to the method of manufacturing a semiconductor light-emitting element 1 according to this embodiment, since the step of forming the hole portion 109a by etching the upper surface 109c of the transparent electrode 109 that is exposed from the opening 10d of the protection film 10a and the step of forming an ohmic junction layer 9 on the inner wall 109d of the hole portion 109a are provided, the ohmic junction layer 9 is formed in contact with the inner wall 109d of the hole portion 109a exposed from the transparent electrode 109 by forming the hole portion 109a. By forming the hole portion 109a, the inner wall 109d of the hole portion 109a exposed from the transparent electrode 109 has superior adhesion with the ohmic junction layer 9 in comparison to the upper surface 109c of the transparent electrode 109, and thus the p-type electrode 111 having superior adhesion with the ohmic junction layer 9 can be obtained in comparison to the case where ohmic junction layer 9 is formed on the upper surface 109c of the transparent electrode 109 according to the manufacturing method of the embodiment.

Embodiment 13

Semiconductor Light-Emitting Element

Figure 34:
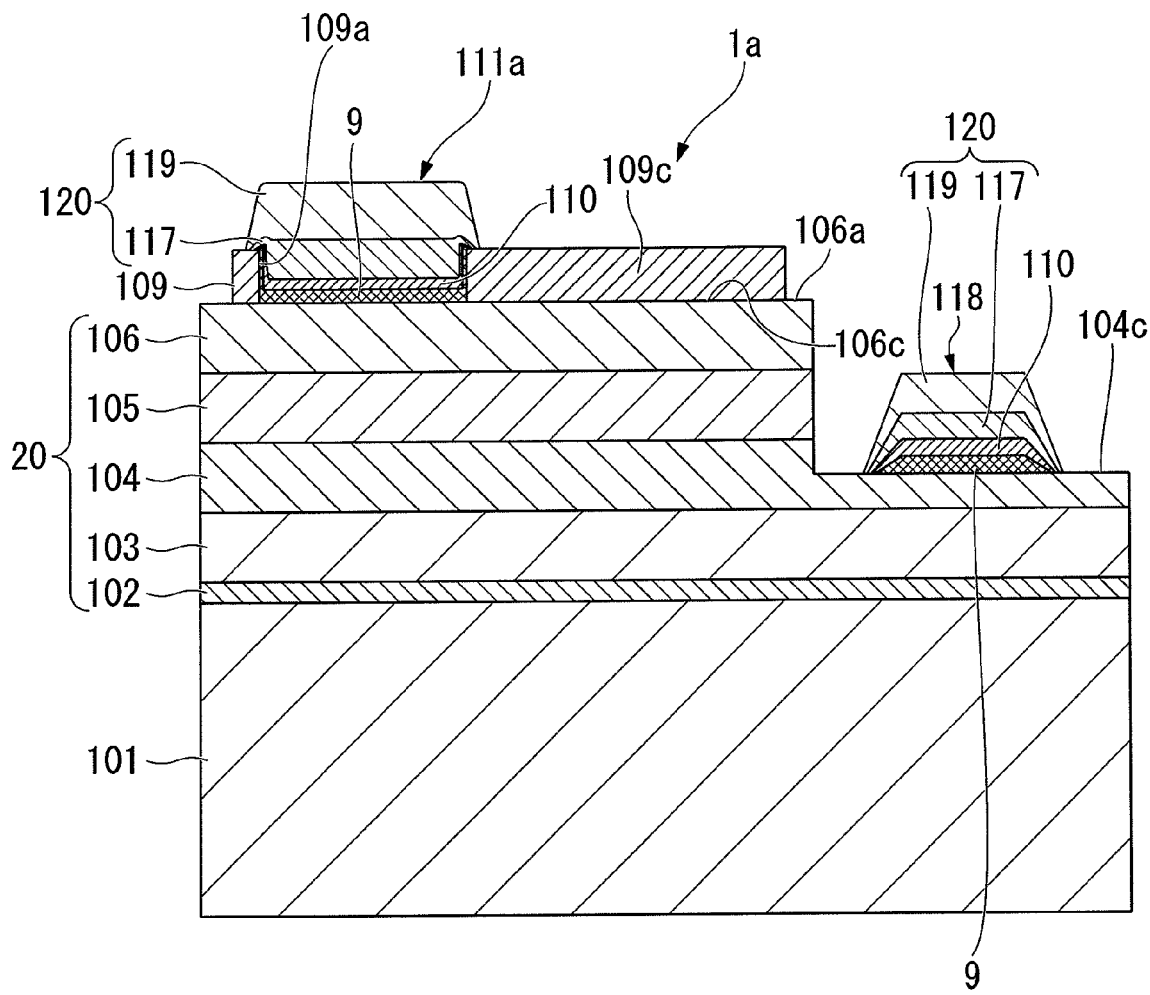
FIG. 34 is a view illustrating another example of a semiconductor light-emitting element according to the present invention, and a schematic cross-sectional view of a semiconductor light-emitting element.

FIG. 34 is a view illustrating another example of a semiconductor light-emitting element according to the present invention, and is a schematic cross-sectional view illustrating a semiconductor light-emitting element. The semiconductor light-emitting element 1a according to this embodiment as illustrated in FIG. 34 has the same configuration as that of the semiconductor light-emitting element 1 as illustrated in FIG. 26 except that the protection film 10a and the edge portion protection film 10b are not formed in this embodiment. Accordingly, the same reference numerals are given to the same members as those according to Embodiment 12, and thus the explanation thereof will be omitted.

Also, the semiconductor light-emitting element 1a according to this embodiment can be formed in the same manner as the semiconductor light-emitting element 1 as illustrated in FIG. 26 except that the protection film 10a and the edge portion protection film 10b are not formed.

Even in the semiconductor light-emitting element 1a according to this embodiment as illustrated in FIG. 34, since the n-type electrode 118 and the p-type electrode 111a are provided with the ohmic junction layer 9 formed on the upper surface 106c of the laminated semiconductor layer 20 and on the exposed surface 104c of the n-contact layer 104a, the junction layer 110 formed on the ohmic junction layer 9, and the bonding pad electrode 120 formed to cover the junction layer 110, both the n-type electrode 118 and the p-type electrode 111a can obtain sufficiently high junction strength of the ohmic junction layer 9 against the bonding pad electrode 120 by the junction layer 110 and the bonding pad electrode 120.

Also, according to the method of manufacturing a semiconductor light-emitting element 1a according to this embodiment as illustrated in FIG. 34, since both the step of manufacturing the n-type electrode 118 and the step of manufacturing the p-type electrode 111a include the step of performing heat-treatment at 250° C. to 700° C., which improves the adhesion with the ohmic junction layer 9 and the junction layer 110, the junction layer 110 having superior adhesion with the ohmic junction layer 9 is obtained, and thus the semiconductor light-emitting element 1a having superior adhesion between the ohmic junction layer 9 and the bonding pad electrode 120 can be obtained.

Even in the semiconductor light-emitting element 1a according to this embodiment as illustrated in FIG. 34, in the same manner as the semiconductor light-emitting element 1 as illustrated in FIG. 26, since the n-type electrode 118 and the p-type electrode 111a are equal to each other except that the transparent electrode 109 is not installed on the n-type electrode 118, the n-type electrode 118 and the p-type electrode 111a can be simultaneously formed, and thus the productivity becomes superior to facilitate the manufacturing of the semiconductor light-emitting element 1a. Also, even in the semiconductor light-emitting element 1a according to this embodiment as illustrated in FIG. 34, both the n-type electrode 118 and the p-type electrode 111a can be manufactured on optimum conditions.

Embodiment 14

Semiconductor Light-Emitting Element

Figure 35:
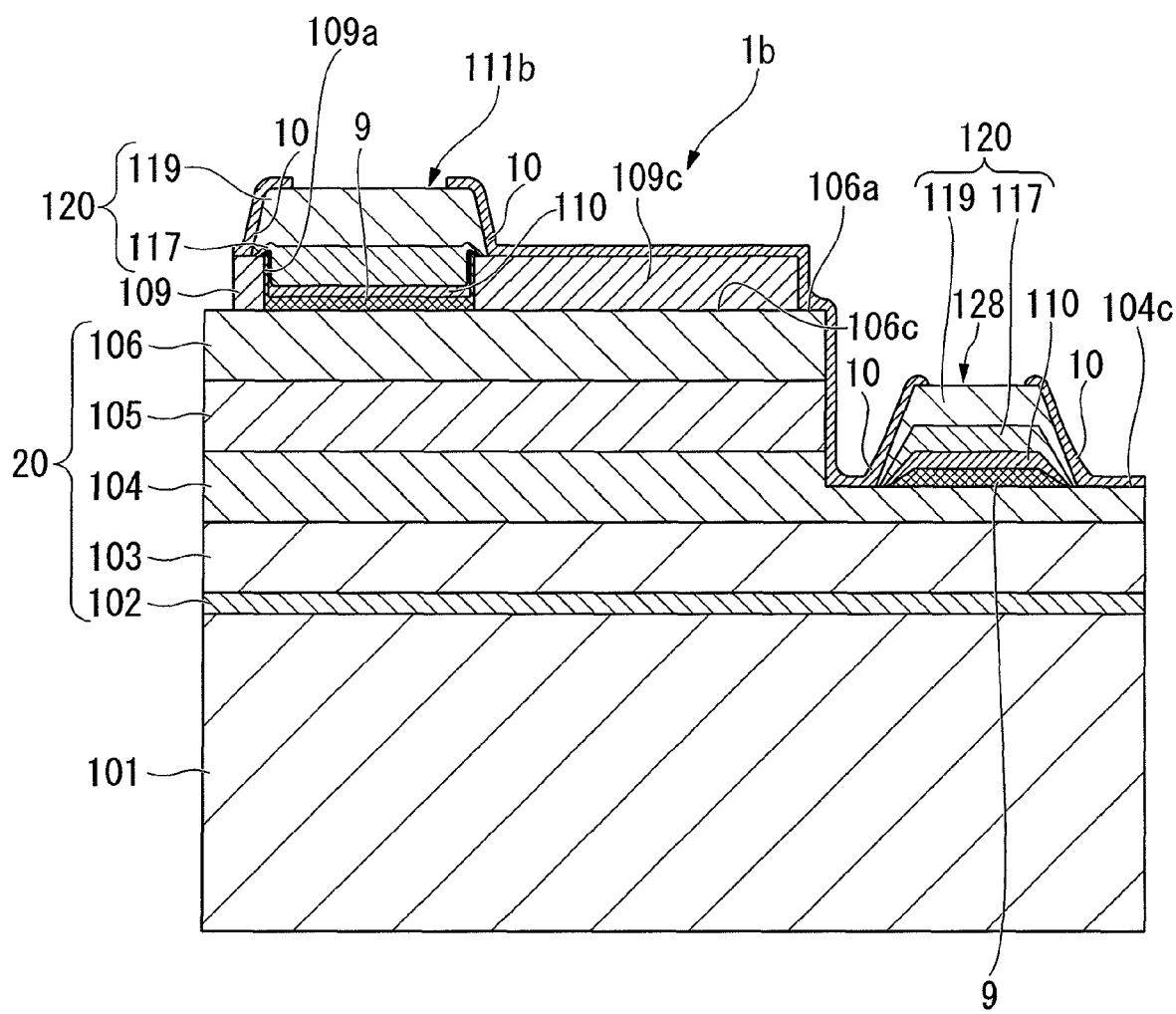
FIG. 35 is a view illustrating another example of a semiconductor light-emitting element according to the present invention, and a schematic cross-sectional view of a semiconductor light-emitting element.

FIG. 35 is a view illustrating another example of a semiconductor light-emitting element according to the present invention, and is a schematic cross-sectional view illustrating a semiconductor light-emitting element according to the present invention. The semiconductor light-emitting element 1b according to this embodiment as illustrated in FIG. 35 has the same configuration as that of the semiconductor light-emitting element 1 as illustrated in FIG. 26 except that the transparent protective film 10a is not formed, and as seen from the plane, an upper surface protection film 10 is installed on the entire surface of the upper surface 109c of the transparent electrode 109 and the exposed surface 104c of the n-contact layer 104a except for the area that exposes the center portion of the bonding pad electrode 120. Accordingly, the same reference numerals are given to the same members as those according to Embodiment 12, and the explanation thereof will be omitted.

The upper surface protection film 10 may be made of the same material as the protection film 10a with the same thickness according to the semiconductor light-emitting element 1 as illustrated in FIG. 26.

In order to manufacture the semiconductor light-emitting element 1a as illustrated in FIG. 35, the n-type electrode 128 and the p-type electrode 111b are manufactured as described below after the laminated semiconductor layer 20 is formed in the same manner as the semiconductor light-emitting element 1 as illustrated in FIG. 26. In this embodiment, a manufacturing method that simultaneously performs the step of manufacturing the n-type electrode 108 and the p-type electrode 111 will be described using FIG. 36.

Figure 36:
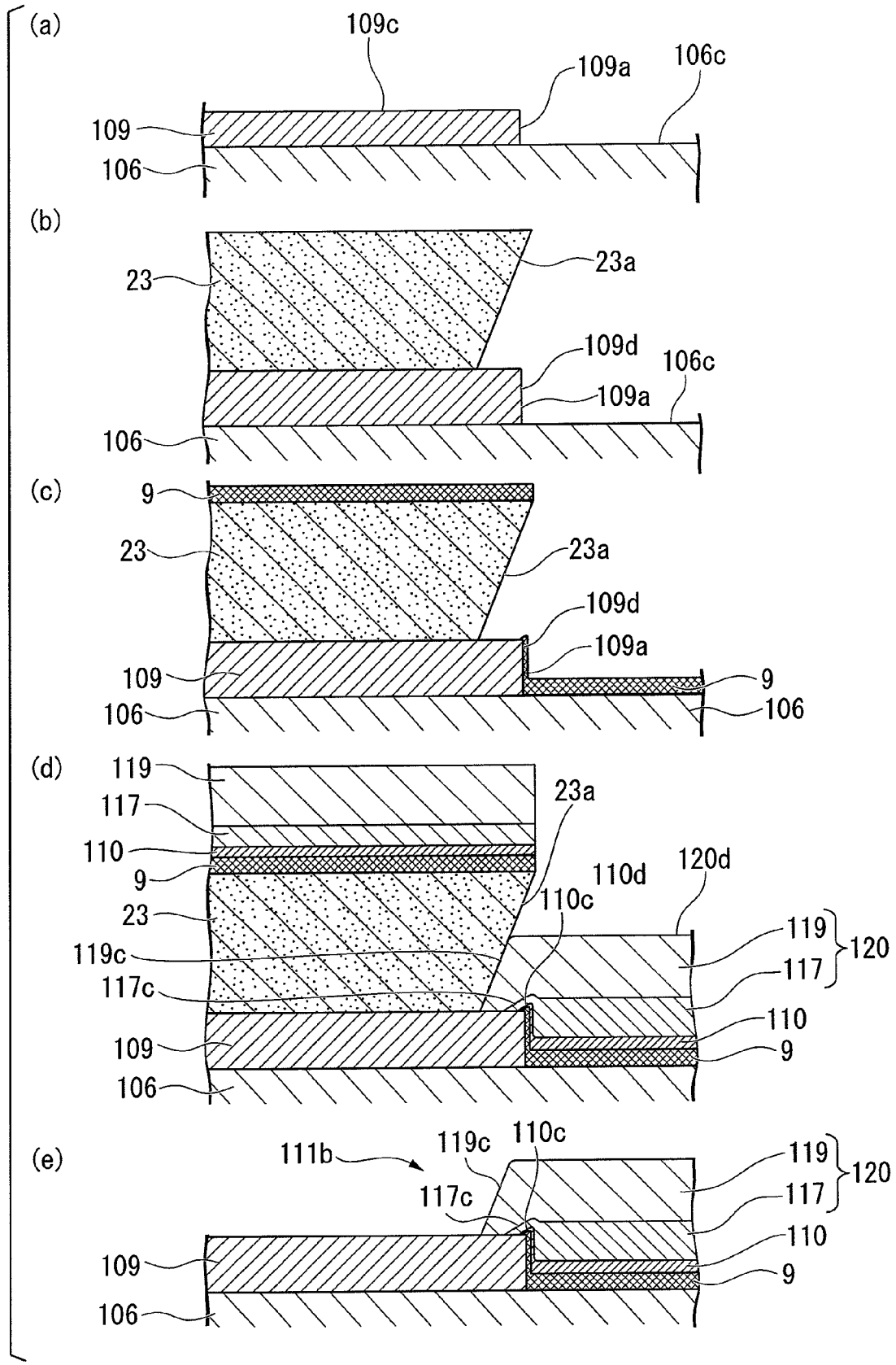
FIG. 36 is a view illustrating a step of manufacturing an n-type electrode 128 and a p-type electrode 111b, and an enlarged cross-sectional view illustrating only a portion of an area where a p-type electrode 111b is manufactured.

FIG. 36 is a view illustrating a step of manufacturing an n-type electrode 128 and a p-type electrode 111b, and an enlarged cross-sectional view illustrating only a portion of an area where a p-type electrode 111b is manufactured. In this case, since the step of forming the n-type electrode 128 is equal to the step of forming the p-type electrode 111b except that the step of installing the transparent electrode 109 is not performed, illustration of the area where the n-type electrode 128 is manufactured will be omitted in FIG. 36.

First, in the same manner as the semiconductor light-emitting element 1 as illustrated in FIG. 26, a portion of the n-contact layer 104a of the laminated semiconductor layer 20 is exposed, and in the same manner as the semiconductor light-emitting element 1 as illustrated in FIG. 26, the transparent electrode 109 is formed on the p-type semiconductor layer 106 of the laminate semiconductor layer 20.

Then, in the same manner as the semiconductor light-emitting element 1 as illustrated in FIG. 26, the transparent electrode 109 is etched to form a hole portion 109a on the transparent electrode 109 as illustrated FIG. 36(*a*).

Here, in the case where the formed transparent electrode 109 is an IZO film in an amorphous state, it is preferable to crystallize the IZO film in the amorphous state by performing heat-treatment in the same manner as the semiconductor light-emitting element 1 as illustrated in FIG. 26.

Then, a resist 21 is coated on the upper surface 109c of the transparent electrode 109 and on the exposed surface 104c of the n-contact layer 104a, and the resist 21 is coated and dried. In the same manner as the semiconductor light-emitting element 1 as illustrated in FIG. 26, by removing the resist 21 on the portion that corresponds to the portion where the bonding pad electrode 120 is formed, as illustrated in FIG. 36(*b*), a reverse-tapered mask 23 having an opening 23a that is in the form of an inner wall of which the cross-sectional area is gradually widened toward the bottom surface, is formed on the upper surface 109c of the transparent electrode 109 and on the exposed surface 104c of the n-contact layer 104a. In this case, as illustrated in FIG. 36(*b*), the opening 23a of the mask 23 formed on the transparent electrode 109 is formed on a position where the hole portion 109a of the transparent electrode 109 is exposed.

[Pad Forming Step]

Next, as illustrated in FIG. 36(*c*), in the same manner as the semiconductor light-emitting element 1 as illustrated in FIG. 26, the ohmic junction layer 9 is formed on the upper surface 106c of the laminated semiconductor layer 20 (the bottom surface 109b of the hole portion 109a) and the exposed surface 104c of the n-contact layer 104a using a material that is the same as the material that forms the transparent electrode 109.

Next, as illustrated in FIG. 36(*d*), in the same manner as the semiconductor light-emitting element 1 as illustrated in FIG. 26, the junction layer 110, the metal reflection layer 117, and the bonding layer 119 are formed in order. Then, in the same manner as the semiconductor light-emitting element 1 as illustrated in FIG. 26, the mask 23 is peeled off. Accordingly, as illustrated in FIG. 36(*e*), the bonding pad electrode 120 including the metal reflection layer 117 and the bonding layer 119 is formed. Even in this embodiment, in the same manner as the semiconductor light-emitting element 1 as illustrated in FIG. 26, the slopes 110c, 117c, and 119c, which are made gradually thinner toward the outside, are formed on the outer circumference portions of the junction layer 110, the metal reflection layer 117 and the bonding layer 119.

[Heat Treatment Step]

Next, in the same manner as the semiconductor light-emitting element 1 as illustrated in FIG. 26, heat-treatment for improving the adhesion between the ohmic junction layer 9 and the junction layer 110 is performed.

Next, using a known method, as seen from the plane, the upper surface protection film 10 is formed on the entire surface of the upper surface 109c of the transparent electrode 109 and on the entire surface of the exposed surface 104c of the n-contact layer 104a except for the area from which the center portion of the bonding pad electrode 120 is exposed. By doing this, the semiconductor light-emitting element 1b including the n-type electrode 128 and the p-type electrode 111b as illustrated in FIG. 35 is formed.

Even in the semiconductor light-emitting element 1a according to this embodiment as illustrated in FIG. 35, since the n-type electrode 128 and the p-type electrode 111b include the ohmic junction layer 9 formed on the upper surface 106c of the laminated semiconductor layer 20 or the exposed surface 104c of the n-contact layer 104a, the junction layer 110 formed on the ohmic junction layer 9, and the bonding pad electrode 120 formed to cover the junction layer 110, both the n-type electrode 128 and the p-type electrode 111b obtain sufficiently high junction strength of the ohmic junction layer 9 against the bonding pad electrode 120 by the junction layer 110 and the bonding pad electrode 120.

Also, even in the method of manufacturing the semiconductor light-emitting element 1b according to this embodiment as illustrated in FIG. 35, since both the step of manufacturing the n-type electrode 128 and the step of manufacturing the p-type electrode 111b include the step of performing heat-treatment at 250° C. to 700° C., which heightens the adhesion between the ohmic junction layer 9 and the junction layer 110, the junction layer 110 having superior adhesion with the ohmic junction layer 9 is obtained, and thus the semiconductor light-emitting element 1b having superior adhesion between the ohmic junction layer 9 and the bonding pad electrode 120 is obtained.

Also, even in the semiconductor light-emitting element 1b according to this embodiment, in the same manner as the semiconductor light-emitting element 1 as illustrated in FIG.

26, since the n-type electrode 128 and the p-type electrode 111b are the same except that the transparent electrode 109 is not installed on the n-type electrode 128, the n-type electrode 128 and the p-type electrode 111b can be simultaneously formed, and thus the productivity for easy and efficient manufacturing becomes superior. Also, even in the semiconductor light-emitting element 1b according to this embodiment as illustrated in FIG. 35, both the n-type electrode 128 and the p-type electrode 111b can be manufactured on optimum conditions.

Embodiment 15

Lamp

Figure 37:
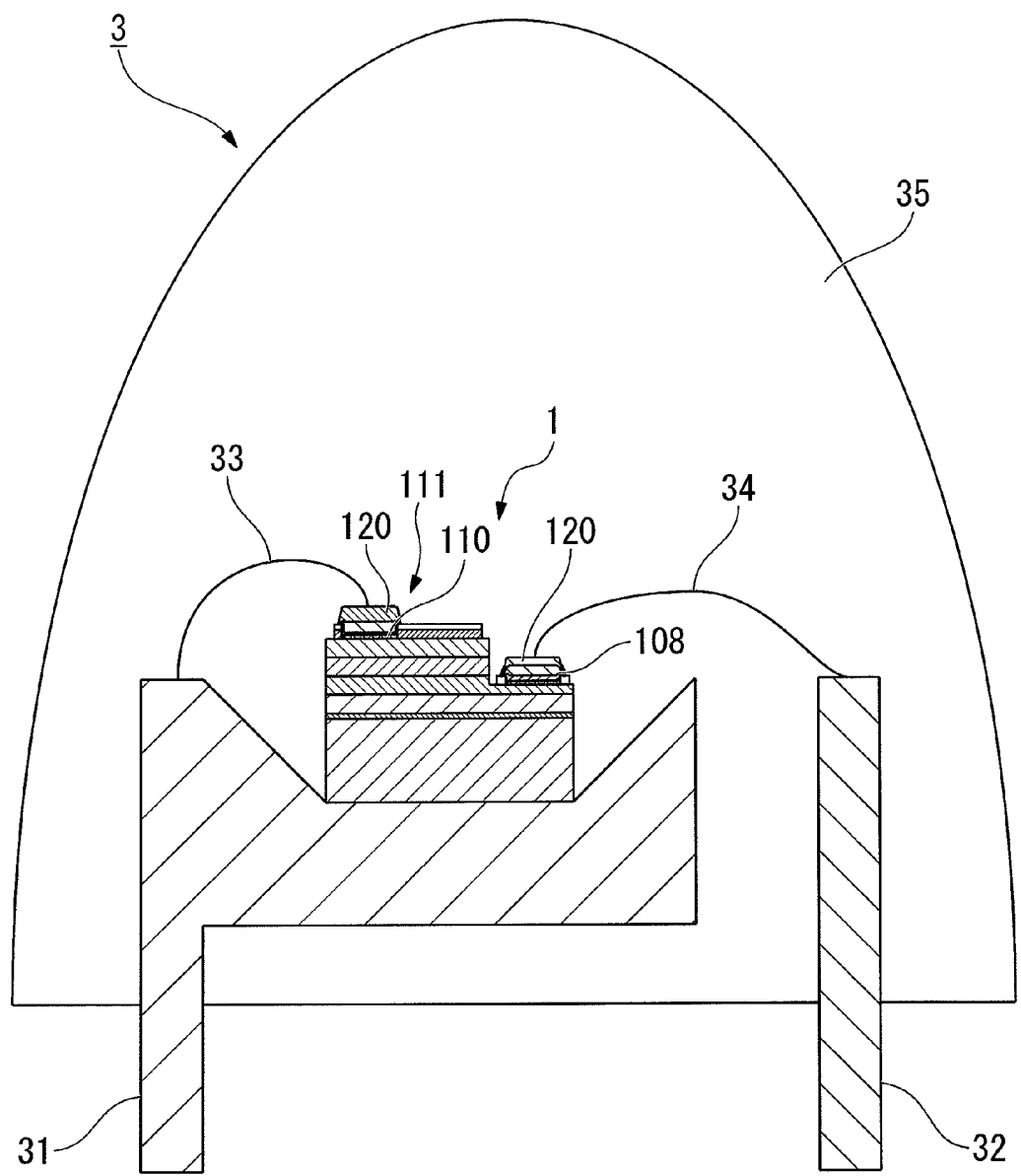
FIG. 37 is a schematic cross-sectional view illustrating an example of a lamp according to the present invention.

FIG. 37 is a schematic cross-sectional view illustrating an example of a lamp according to the present invention. As illustrated in FIG. 37, the lamp 3 according to this embodiment is in the form of a shell, and the semiconductor light-emitting element 1 according to the present invention as illustrated in FIG. 26 is built therein as the semiconductor light-emitting element. In this case, the lamp 3, for example, is configured by combining the semiconductor light-emitting element 1 and phosphors, and has a configuration that is known to those of ordinary skill in the art which is configured by a means that is known to those of ordinary skill in the art. Also, by combining the semiconductor light-emitting element 1 with phosphors, it is known that the light-emitting color can be changed, and it is possible to adopt such technology even in the lamp according to an embodiment without any limitation.

As illustrated in FIG. 37, the lamp 3 according to this embodiment includes one frame 31 which is bonded by a wire 33 to the bonding pad electrode 120 of the p-type electrode 111 of the semiconductor light-emitting element 1, the other frame 32 which is bonded by a wire 34 to the bonding pad electrode 120 of the n-type electrode 108 of the semiconductor light-emitting element 1, and a mold 35 made of transparent resin that is formed around the semiconductor light-emitting element 1.

Also, since the lamp 3 according to this embodiment is provided with the semiconductor light-emitting element of the present invnetion, which has the n-type electrode 108 and the p-type electrode 111 having superior junction and anti-corrosion properties, as a semiconductor light-emitting element, the lamp 3 can be manufactured with good yield and superior anticorrosion properties.

The lamp 3 according to this embodiment may be used in any type for any purpose, such as a shell type for general use, a side view type for a portable backlight, a top view type for use in a displayer, and the like.

Also, since the lamp 3 manufactured from the semiconductor light-emitting element according to the present invention has superior effect as described above, an electronic appliance incorporated with the lamp manufactured by this technique, such as a backlight, portable phone, display, various kinds of panels, computer, game machine, illumination, or the like, and a mechanical device such as a vehicle incorporated with the electronic appliance can provide high reliability as the product in use. Particularly, in an appliance that drives a battery, such as a backlight, portable phone, display, game machine, illumination, or the like, a product provided with a light-emitting element having superior anticorrosion property and high reliability can be preferably provided.

Hereinafter, the present invention will be described in detail based on examples. However, the present invention is not limited to such examples.

EXAMPLES

Examples of Embodiment 1 to Embodiment 6

Example 1

<Production of Semiconductor Light-Emitting Element>

A semiconductor light-emitting element (hereinafter referred to as a "semiconductor light-emitting element of Example 1") made of gallium nitride-based compound semiconductor was manufactured as follows.

First, an under-layer made of undoped GaN with a thickness of 8 μm was formed on a substrate made of sapphire via a buffer layer made of AlN. Next, a Si-doped n-type GaN contact layer with a thickness of 2 μm and an n-type $In_{0.1}Ga_{0.9}N$ clad layer with a thickness of 250 nm were formed, and a Si-doped GaN barrier layer with a thickness of 16 nm and an n-type $In_{0.2}Ga_{0.8}N$ well layer with a thickness of 2.5 nm were laminated five times. Lastly, a light-emitting layer of a multiple quantum well structure, in which the barrier layer was installed, was formed. Further, a Mg-doped p-type $Al_{0.07}Ga_{0.93}N$ clad layer with a thickness of 10 nm and a Mg-doped p-type GaN contact layer with a thickness of 150 nm were formed in order.

At that time, the lamination of a gallium nitride-based compound semiconductor layer was performed by a MOCVD method under well-known typical conditions in the corresponding technical field.

Next, a transparent electrode made of ITO with a thickness of 200 nm was formed on the p-type GaN contact layer, and then a protection film made of $SiO_2$ was formed.

Further, in accordance with a mask forming step as illustrated in Embodiment 1, a reverse-tapered mask was formed. As resist, AZ5200NJ (product name: product of AZ Electronic Materials) was used.

In a state where the reverse-tapered mask was prepared, a portion of the upper surface of the transparent electrode and the n-type contact layer were exposed by etching the protection film made of $SiO_2$, and then a junction layer made of Cr with a thickness of 20 Å was formed by a sputtering method. Further, on the junction layer, a bonding pad electrode of a three-layer structure including a metal reflection layer made of Rh with a thickness of 200 nm, a barrier layer made of Ti with a thickness of 80 nm, and a bonding layer made of Au with a thickness of 200 nm was formed. Thereafter, the reverse-tapered mask was removed using a resist peel-off solution. The n-type electrode was prepared with the same electrode laminated structure as the p-type electrode.

<Evaluation of Semiconductor Light-Emitting Element>

A forward voltage measured with respect to the semiconductor light-emitting element of Example 1 was 3.0V through conduction by a probe with an applied current value of 20 mA. Thereafter, as a result of measuring the light emission output of the semiconductor light-emitting element mounted in a TO-18 can package by a tester, the light emission output for the applied current of 20 mA was 19.5 mW. Also, the emitting-light distribution on the light emission surface could be confirmed as light emission from the entire surface below the positive electrode.

Further, the reflection ratio of a bonding pad electrode produced in this example was 70% in a wavelength area of 460 nm. This value was measured by a spectrophotometer using a glass dummy substrate put into the same chamber during the forming of the bonding pad electrode.

Also, although a bonding test was made with respect to 100,000 chips (the number of bonding inferiorities), there was no chip in which the pad was peeled off.

<Test in High Temperature and Humidity Conditions>

According to a typical method, a chip test in high temperature and humidity conditions was made. As a test method, chips were put in high-temperature high-humidity tester (ISUZU Seisakusho, Co., Ltd., μ-SERIES), and light emission test (the amount of current passing through the chip was 5 mA, for 2000 hours) was made with respect to 100 chips under the environment of temperature of 85° and relative humidity of 85RH %. The number of inferiorities was "0".

<Anticorrosion Test>

In a state where the semiconductor light-emitting element emitted light under the conditions of the applied current value of 20 mA, the forward voltage of 3.0V, and the light emission output of 19.5 mW, the semiconductor light-emitting element in Example 1 was sunk under water in a water tank. The semiconductor light-emitting element was kept in the state for 10 minutes, as it was pulled out of the water, and then the light emission characteristic was measured again. The light emission characteristic was almost not changed in comparison to that measured before the semiconductor light-emitting element was sunk under water.

Examples 2 to 20

Semiconductor light-emitting elements in Examples 2 to 20 were manufactured in the same manner as Example 1 except that the p-type electrode was formed with materials and thicknesses as indicated in Table 1.

Evaluation was performed in the same manner as Example 1, and evaluation results were obtained as shown in Table 2.

TABLE 1

| | | | | | Bonding Pad Electrode | | | | |
| --- | --- | --- | --- | --- | --- | --- | --- | --- | --- |
| | Transparent Electrode | | Junction Layer | | Metal Reflection Layer | | Barrier Layer | | Bonding Layer |
| Sample | Material | Thickness (nm) | Material | Thickness (nm) | Material | Thickness (nm) | Material | Thickness (nm) | Material | Thickness (nm) |
| Ex. 1 | ITO | 200 | Cr | 2 | Rh | 200 | Ti | 80 | Au | 200 |
| Ex. 2 | IZO | 200 | Cr | 2 | Al | 200 | Ti | 80 | Au | 200 |
| Ex. 3 | IZO | 200 | Cr | 2 | Ag | 200 | Ti | 80 | Au | 200 |
| Ex. 4 | IZO | 200 | Cr | 2 | Rh | 200 | Ti | 80 | Au | 200 |
| Ex. 5 | IZO | 250 | Cr | 10 | Pt | 100 | — | — | Au | 1100 |
| Ex. 6 | IZO | 250 | Cr | 40 | Pt | 100 | — | — | Au | 1100 |
| Ex. 7 | IZO | 200 | Ni | 2 | Al | 200 | Ti | 80 | Au | 200 |
| Ex. 8 | IZO | 200 | Ni | 2 | Ag | 100 | Ti | 80 | Au | 200 |
| Ex. 9 | IZO | 200 | Ni | 40 | Pt | 100 | — | — | Au | 1100 |
| Ex. 10 | IZO | 200 | Ti | 10 | Rh | 100 | — | — | Au | 1100 |
| Ex. 11 | IZO | 200 | Ti | 10 | Pt | 100 | — | — | Au | 1100 |
| Ex. 12 | IZO | 200 | Ti | 10 | Ir | 100 | — | — | Au | 1100 |
| Ex. 13 | ITO | 200 | Ti | 2 | Pt | 200 | — | — | Au | 550 |
| Ex. 14 | ITO | 200 | Ti | 2 | Ir | 200 | — | — | Au | 550 |
| Ex. 15 | IZO | 200 | Ta | 10 | Rh | 100 | — | — | Au | 1100 |
| Ex. 16 | IZO | 200 | Ta | 10 | Pt | 100 | — | — | Au | 1100 |
| Ex. 17 | IZO | 200 | Ta | 10 | Ir | 100 | — | — | Au | 1100 |
| Ex. 18 | ITO | 200 | Ta | 2 | Pt | 200 | — | — | Au | 550 |
| Ex. 19 | ITO | 200 | Ta | 2 | Ir | 200 | — | — | Au | 550 |
| Ex. 20 | IZO | 200 | Co | 2 | Al | 200 | Ti | 80 | Au | 200 |
| Com. 1 | ITO | 200 | Cr | 2 | Al | 200 | Ti | 80 | Au | 200 |
| Com. 2 | ITO | 200 | — | — | Al | 200 | Ti | 80 | Au | 200 |
| Com. 3 | ITO | 200 | Ti | 2 | Al | 200 | Ti | 80 | Au | 200 |

TABLE 2

| | Evaluation Result | | | | |
| --- | --- | --- | --- | --- | --- |
| Sample | Forward Voltage (V) | Light Emission Output (mW) | Reflection Ratio of Bonding Pad Electrode (%) | The Number of Bonding Inferiorities (among 100,000 chips) | The number of Inferiorities in Test in High Temperature and Humidity Conditions (among 100 chips) |
| Ex. 1 | 3.0 | 19.5 | 70 | 0 | 0 |
| Ex. 2 | 3.1 | 22 | 80 | 1 | 2 |
| Ex. 3 | 3.1 | 22.5 | 85 | 2 | 2 |
| Ex. 4 | 3.1 | 21 | 70 | 0 | 0 |
| Ex. 5 | 3.0 | 22 | 80 | 0 | 0 |
| Ex. 6 | 3.0 | 21 | 70 | 0 | 0 |
| Ex. 7 | 3.0 | 22 | 80 | 1 | 2 |
| Ex. 8 | 3.0 | 22 | 80 | 1 | 3 |
| Ex. 9 | 3.0 | 21 | 70 | 0 | 0 |
| Ex. 10 | 3.0 | 20 | 60 | 0 | 0 |
| Ex. 11 | 3.0 | 20 | 60 | 0 | 0 |

TABLE 2-continued

| Sample | Forward Voltage (V) | Light Emission Output (mW) | Reflection Ratio of Bonding Pad Electrode (%) | The Number of Bonding Inferiorities (among 100,000 chips) | The number of Inferiorities in Test in High Temperature and Humidity Conditions (among 100 chips) |
|---|---|---|---|---|---|
| Ex. 12 | 3.0 | 20 | 60 | 0 | 0 |
| Ex. 13 | 3.0 | 19.5 | 70 | 0 | 0 |
| Ex. 14 | 3.0 | 19.5 | 70 | 0 | 0 |
| Ex. 15 | 3.0 | 20 | 60 | 0 | 0 |
| Ex. 16 | 3.0 | 20 | 60 | 0 | 0 |
| Ex. 17 | 3.0 | 20 | 60 | 0 | 0 |
| Ex. 18 | 3.0 | 19.5 | 70 | 0 | 0 |
| Ex. 19 | 3.0 | 19.5 | 70 | 0 | 0 |
| Ex. 20 | 3.0 | 22 | 80 | 3 | 7 |
| Com. 1 | 3.0 | 20 | 90 | 50 | 65 |
| Com. 2 | 3.0 | 21.5 | 90 | 100 | 100 |
| Com. 3 | 3.0 | 20 | 90 | 57 | 11 |

Comparative Example 1

Figure 12:
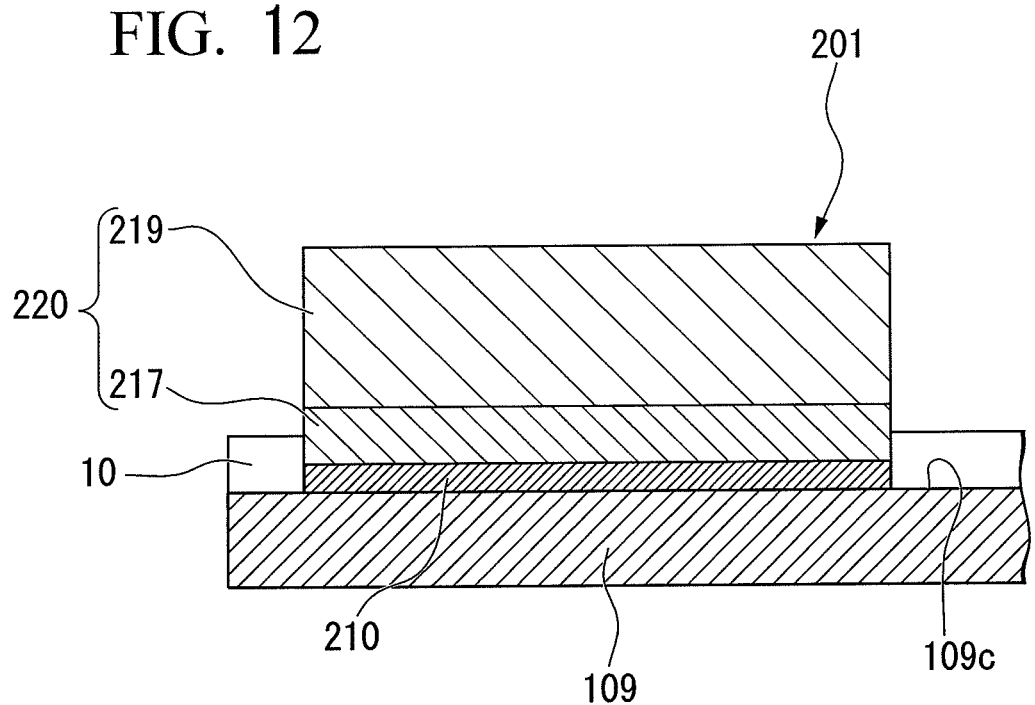
FIG. 12 is a schematic cross-sectional view illustrating a semiconductor light-emitting element according to a comparative example.

FIG. 12 is an enlarged cross-sectional view illustrating a p-type electrode of a semiconductor light-emitting element in Comparative example 1. As illustrated in FIG. 12, the p-type electrode 201 of the semiconductor light-emitting element includes a transparent electrode 109 made of ITO, a junction layer 210 made of Cr, and a bonding pad electrode 220.

The upper surface 109c of the transparent electrode 109 is covered by a protection film 10 made of $SiO_2$, and a junction layer 210 is formed with uniform thickness on the upper surface 109c of the transparent electrode 109 that is exposed through the opening of a portion of the protection film 10. A metal reflection layer 217 made of Al is formed on the junction layer 210, and a barrier layer made of Ti and a bonding layer 219 made of Au are formed on the metal reflection layer 217 in order. Also, side surfaces of the respective layers of the junction layer 210, the metal reflection layer 217, the barrier layer (not illustrated), and the bonding layer 219 are formed almost vertically to the upper surface 109c of the transparent electrode 109.

The semiconductor light-emitting element of Comparative example 1 was formed as follows.

First, in the same manner as Example 1, a gallium nitride-based compound semiconductor layer was laminated by the MOCVD method under well-known typical conditions in the corresponding technical field.

Next, a transparent electrode 109 made of ITO with a thickness of 200 nm was formed on a p-type GaN contact layer.

Figure 13:
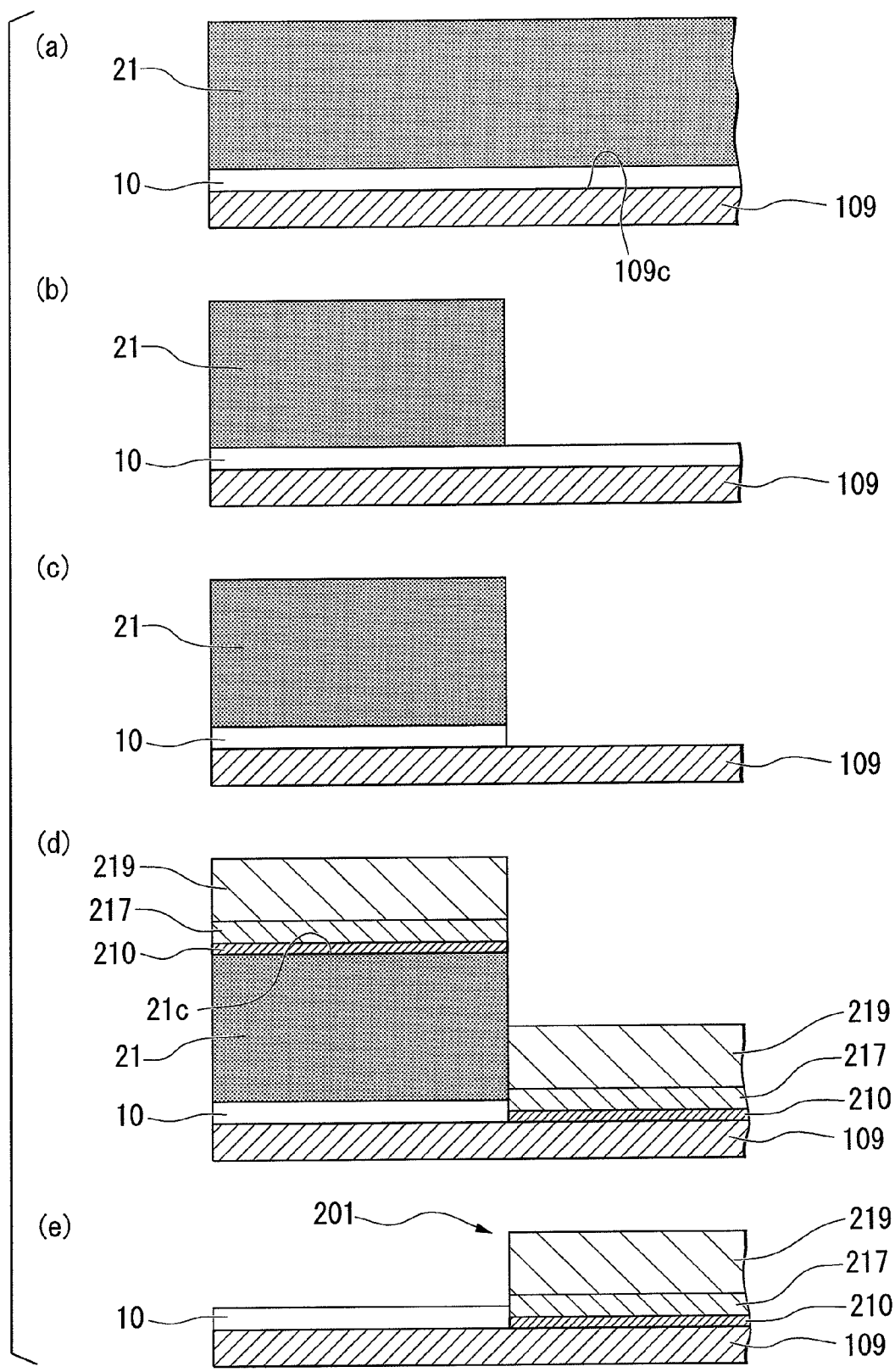
FIG. 13 is a cross-sectional view illustrating a step for a p-type electrode of a semiconductor light-emitting element according to a comparative example.

Next, as illustrated in FIG. 13(a), a protection film 10 made of $SiO_2$ was formed on the upper surface 109c of the transparent electrode 109, and then a resist 21 was formed on the protection film 10 by coating and drying the resist.

Next, as illustrated in FIG. 13(b), using a typical photolithography method, the resist 21 on a portion that corresponds to the portion where the bonding pad electrode was formed was made into soluble resist by exposing the resist 21, and then the resist 21 having a vertical cross-section with respect to the upper surface of the protection film 10 was formed by removing the soluble resist by a predetermined developing solution.

Next, as illustrated in FIG. 13(c), the protection film 10 on the portion that corresponds to the portion, where the bonding pad electrode was formed, was removed by etching the protection film 10 using the remaining resist 21 as a mask, so that the upper surface 109c of the transparent electrode 109 and the n-type contact layer were exposed.

Next, by the sputtering method, the junction layer 210 made of Cr with a thickness of 20 Å was formed to cover the upper surface 109c of the exposed transparent electrode 109 and the upper surface 21a of the resist 21. Further, the metal reflection layer 217 made of Al with a thickness of 200 nm was formed to cover the junction layer 210. Also, as illustrated in FIG. 13(d), the barrier layer (not illustrated) made of Ti with a thickness of 80 nm was formed to cover the metal reflection layer 217, and the bonding layer 219 made of Au with a thickness of 200 nm was formed to cover the barrier layer.

Lastly, by peeling off the resist 21 by a resist peel-off solution, as illustrated in FIG. 13(e), a p-type electrode 201, in which a bonding pad electrode 220 of a three-layer structure including the metal reflection layer 217, the barrier layer, and the bonding layer 219 was laminated on the junction layer 210, was formed.

In this step, the p-type electrode 201 of the structure as illustrated in FIG. 12 was formed. At that time, the n-type electrode was prepared with the same electrode laminated structure as the p-type electrode.

<Evaluation of Semiconductor Light-Emitting Element>

A forward voltage measured with respect to the semiconductor light-emitting element of Comparative example 1 was 3.0V through conduction by a probe with an applied current value of 20 mA. Thereafter, as a result of measuring the light emission output of the semiconductor light-emitting element mounted in a TO-18 can package by a tester, the light emission output for the applied current of 20 mA was 20 mW. Also, the emitting-light distribution on the light emission surface could be confirmed as light emission from the entire surface below the positive electrode. As described above, the light emission characteristic was the same as that of Example 1.

Further, the reflection ratio of a bonding pad electrode produced in Comparative example 1 was 90% in a wavelength area of 460 nm. This value was measured by a spectrophotometer using a glass dummy substrate put into the same chamber during the forming of the bonding pad electrode.

Also, although a bonding test was made with respect to 100,000 chips (the number of bonding inferiorities), there were 50 chips in which the pad was peeled off.

<Test in High Temperature and Humidity Conditions>

In the same manner as Example 1, a chip test in high temperature and humidity conditions was made. Light emission test (the amount of current passing through the chip was 5 mA, for 2000 hours) was made with respect to 100 chips under the environment of temperature of 85° and relative humidity of 85 RH %. The number of inferiorities was "65".

<Anticorrosion Test>

In the same manner as Example 1, an anticorrosion test was made. In a state where the semiconductor light-emitting element emitted light under the conditions of the applied current value of 20 mA, the forward voltage of 3.0V, and the light emission output of 20 mW, the semiconductor light-emitting element in Comparative example 1 was sunk under water in a water tank. The semiconductor light-emitting element was kept in the state only for several seconds, and thus no light was emitted.

Comparative Example 2 and Comparative Example 3

In the same manner as Comparative example 1, except that the p-type electrode was formed with materials and thicknesses as illustrated in Table 1, the semiconductor light-emitting element of Comparative example 2 and Comparative example 3 was manufactured.

In the same manner as Comparative example 1, the evaluation was made, and the evaluation result as illustrated in Table. 2 was obtained.

Examples of Embodiment 7 to Embodiment 11

Example 21

A semiconductor light-emitting element made of gallium nitride-based compound semiconductor as illustrated in FIGS. 14 to 16 was manufactured as follows.

[Forming of Laminated Semiconductor Layer]

First, an under-layer 103 made of undoped GaN with a thickness of 8 μm was formed on a substrate 101 made of sapphire via a buffer layer 102 made of AlN. Next, an n-contact layer 104a made of Si-doped n-type GaN with a thickness of 2 μm and an n-type clad layer 104b made of n-type $In_{0.1}Ga_{0.9}N$ with a thickness of 250 nm were formed. Thereafter, a Si-doped GaN barrier layer with a thickness of 16 nm and an $In_{0.2}Ga_{0.8}N$ well layer with a thickness of 2.5 nm were laminated five times, and lastly, a light-emitting layer 105 of a multiple quantum well structure, in which the barrier layer was installed, was formed. Further, a p-clad layer 106a made of Mg-doped p-type $Al_{0.07}Ga_{0.93}N$ with a thickness of 10 nm and a p-contact layer 106b made of Mg-doped p-type GaN with a thickness of 150 nm were formed in order. At that time, the forming of the laminated semiconductor layer 20 was performed by a MOCVD method on well-known typical conditions in the corresponding technical field.

[Forming of Electrode]

After the laminated semiconductor layer 20 was formed as described above, a portion of the n-contact layer 104a was exposed by patterning the laminated semiconductor layer 20 by a photolithography method and etching a portion of the laminated semiconductor layer 20 of a predetermined area. Next, an n-type electrode 108 made of Ti/Pt/Au in order was formed on the exposed surface 104c of the n-contact layer 104a by a sputtering method.

Thereafter, as described below, a p-type electrode 111 was formed. First, a transparent electrode 109 made of IZO with a thickness of 250 nm was formed on the p-type GaN contact layer 106b, and a transparent protective film 10a made of $SiO_2$ with a thickness of 100 nm was formed on the transparent electrode 109.

Next, using AZ5200NJ (product name: product of AZ Electronic Materials) as an image reversion type photoresist, a reverse-tapered mask 23 having an opening 23a that is in the form of an inner wall of which the cross-sectional area was gradually widened toward the bottom surface, was formed on the upper surface of the transparent electrode 109 on which the transparent protective film 10a was formed.

Then, by removing the transparent protective film 10a that is exposed from the opening 23a of the mask 23 using RIE (Reactive Ion Etching) in a direction vertical to the upper surface 109c of the transparent electrode 109, an opening 10d was formed, and the upper surface 109c of the transparent electrode 109 was exposed from the opening 10d.

Next, by dry-etching the transparent electrode 109 that is exposed form the opening 23a of the mask 23, a junction recess portion 109a with a depth of 10 nm was formed on the upper surface 109c of the transparent electrode 109.

Next, by the sputtering method, the junction layer 110 made of Cr was formed with a maximum thickness of 10 Å to cover the junction recess portion 109a of the transparent electrode 109. Next, by the sputtering method, a metal reflection layer 117 made of Pt with a maximum thickness of 100 nm which covers the junction layer 110 and has an slope 117c, which is made gradually thinner toward the outside, formed on the outer circumference thereof was formed. Then, by the sputtering method, the bonding layer 119 made of Au with a maximum thickness of 1100 nm, of which the shape of the outer circumference was formed along the inner wall shape of the opening 23a of the mask 23, which covered the metal reflection layer 117, and had an slope 119c, which was made gradually thinner toward the outside, formed on the outer circumference portion 120d, was formed. Accordingly, the bonding pad electrode 120 including the metal reflection layer 117 and the bonding layer 119 was formed.

Thereafter, by soaking the resist in a resist peel-off solution, the mask 23 was peeled off. Next, as seen from the plane, the edge portion protection film 10b, which was made of $SiO_2$ with a width of 5 μm and with a maximum thickness of 100 nm, covered the outer edge portion of the bonding pad electrode 120 through a portion that is a juncture between the outer edge portion (contour-line) of the bonding pad electrode 120 and the transparent protective film 10a, and was roughly in the form of a donut that exposes the center portion of the bonding pad electrode 120. By doing this, a semiconductor light-emitting element 1 of Example 21 having the p-type electrode 111 as illustrated in FIGS. 14 to 16 was obtained.

Comparative Example 4

Except that the edge portion protection film 10b was not formed, the junction recess portion 109a was not formed on the upper surface 109c of the transparent electrode 109, and the side surfaces of the metal reflection layer 217 and the bonding layer 219 constituting the bonding pad electrode 220 and the junction layer 210 were formed almost vertical to the upper surface 109c of the transparent electrode 109, the semiconductor light-emitting element as illustrated in FIG. 25 which is the same as the semiconductor light-emitting element 1 of Example 21 was manufactured.

<Evaluation of Semiconductor Light-Emitting Element>

With respect to the semiconductor light-emitting elements of Example 21 and Comparative example 4, a forward voltage was measured. The measured forward voltage in Example 21 and Comparative example 4 was 3.0V through conduction by a probe with an applied current value of 20 mA.

Thereafter, the semiconductor light-emitting elements of Example 21 and Comparative example 4 were mounted in the To-18 can package, and the light emission output was measured by a tester. As a result, the light emission output of Example 21 and Comparative example 4 was 20 mW for the applied current of 20 mA. Also, both in Example 21 and Comparative example 4, the emitting-light distribution on the light emission surface in Example 21 and Comparative example 4 could be confirmed as light emission from the entire surface below the positive electrode. As described above, the light emission characteristic was confirmed to be the same as that of Example 1.

Further, in the Example 21 and the Comparative example 4, the reflection ratio of the bonding pad electrode produced in this example was 80% in a wavelength area of 460 nm. The reflection ratio was measured by a spectrophotometer using a glass dummy substrate with the same thickness as the bonding pad electrode formed on the dummy substrate, which was put into the same chamber during the forming of the bonding pad electrode.

Also, a bonding test was performed with respect to the semiconductor light-emitting elements (chips) of Example 211 and Comparative example 4. As a result, in Embodiment 21, there was no chip in which the pad was peeled off (bonding inferiority) among the 100,000 chips. By contrast, in Comparative example 4, there were three chips in which the pad was peeled off (bonding inferiority) among the 100,000 chips.

<Chip Test in High Temperature and Humidity Conditions>

The semiconductor light-emitting elements (chip) of Example 21 and Comparative example 4 were put into high-temperature high-humidity tester (ISUZU Seisakusho, Co., Ltd., μ-SERIES), and a light emission test (the amount of current passing through the chip was 5 mA, for 2000 hours) was made with respect to 100 chips under the environment of temperature of 85° and relative humidity of 85RH %. As a result, the number of inferiorities was "0" in Example 21, but the number of inferiorities was 20 in Comparative example 4.

<Anticorrosion Test>

In a state where the semiconductor light-emitting element emitted light under the conditions of the applied current value of 20 mA, the forward voltage of 3.0V, and the light emission output of 20 mW, the semiconductor light-emitting elements in Example 21 and Comparative example 4 were sunk under water in a water tank.

In Example 21, the semiconductor light-emitting elements were kept in this state for 10 minutes, was pulled out of the water, and then the light emission characteristic was measured again. As a result, in Example 21, the light emission characteristics after the semiconductor light-emitting element was sunk under water in the water tank was almost not changed in comparison to that measured before the semiconductor light-emitting element was sunk under water.

In Comparative example 4, the light emission was kept only for several seconds in a state where the semiconductor light-emitting element is sunk under water in the water tank and no further light was emitted thereafter.

Examples 22 to 41

In the same manner as in Example 21, except that the p-type electrode was formed with materials and thicknesses as shown in Table 3, the semiconductor light-emitting elements of Examples 22 to 41 were manufactured.

In the same manner as in Example 21, the evaluation was made, and the results of evaluation as illustrated in FIG. 4 were obtained.

Comparative Examples 5 to 7

In the same manner as in Comparative example 21, except that the p-type electrode was formed with materials and thicknesses as shown in Table 3, the semiconductor light-emitting elements of Comparative examples 5 to 7 were manufactured.

In the same manner as in Comparative example 4, the evaluation was made, and the results of evaluation as illustrated in FIG. 4 were obtained.

TABLE 3

| | Transparent Electrode | | Junction Layer | | Bonding Pad Electrode | | | | | |
|---|---|---|---|---|---|---|---|---|---|---|
| | | | | | Metal Reflection Layer | | Barrier Layer | | Bonding Layer | |
| Sample | Material | Thickness (nm) | Material | Thickness (nm) | Material | Thickness (nm) | Material | Thickness (nm) | Material | Thickness (nm) |
| Ex. 21 | IZO | 250 | Cr | 1 | Pt | 100 | — | — | Au | 1100 |
| Ex. 22 | ITO | 200 | Cr | 2 | Rh | 200 | Ti | 80 | Au | 200 |
| Ex. 23 | IZO | 200 | Cr | 2 | Al | 200 | Ti | 80 | Au | 200 |
| Ex. 24 | IZO | 200 | Cr | 2 | Ag | 200 | Ti | 80 | Au | 200 |
| Ex. 25 | IZO | 200 | Cr | 2 | Rh | 200 | Ti | 80 | Au | 200 |
| Ex. 26 | IZO | 250 | Cr | 10 | Pt | 100 | — | — | Au | 1100 |
| Ex. 27 | IZO | 250 | Cr | 40 | Pt | 100 | — | — | Au | 1100 |
| Ex. 28 | IZO | 200 | Ni | 2 | Al | 200 | Ti | 80 | Au | 200 |
| Ex. 29 | IZO | 200 | Ni | 2 | Ag | 100 | Ti | 80 | Au | 200 |
| Ex. 30 | IZO | 200 | Ni | 40 | Pt | 100 | — | — | Au | 1100 |
| Ex. 31 | IZO | 200 | Ti | 10 | Rh | 100 | — | — | Au | 1100 |
| Ex. 32 | IZO | 200 | Ti | 10 | Pt | 100 | — | — | Au | 1100 |
| Ex. 33 | IZO | 200 | TI | 10 | Ir | 100 | — | — | Au | 1100 |
| Ex. 34 | ITO | 200 | Ti | 2 | Pt | 200 | — | — | Au | 550 |
| Ex. 35 | ITO | 200 | Ti | 2 | Ir | 200 | — | — | Au | 550 |
| Ex. 36 | IZO | 200 | Ta | 10 | Rh | 100 | — | — | Au | 1100 |
| Ex. 37 | IZO | 200 | Ta | 10 | Pt | 100 | — | — | Au | 1100 |
| Ex. 38 | IZO | 200 | Ta | 10 | Ir | 100 | — | — | Au | 1100 |
| Ex. 39 | ITO | 200 | Ta | 2 | Pt | 200 | — | — | Au | 550 |
| Ex. 40 | ITO | 200 | Ta | 2 | Ir | 200 | — | — | Au | 550 |

TABLE 3-continued

| | | | | | Bonding Pad Electrode | | | | | |
|---|---|---|---|---|---|---|---|---|---|---|
| | Transparent Electrode | | Junction Layer | | Metal Reflection Layer | | Barrier Layer | | Bonding Layer | |
| Sample | Material | Thickness (nm) | Material | Thickness (nm) | Material | Thickness (nm) | Material | Thickness (nm) | Material | Thickness (nm) |
| Ex. 41 | IZO | 200 | Co | 2 | Al | 200 | Ti | 80 | Au | 200 |
| Com. 4 | IZO | 250 | Cr | 1 | Pt | 100 | — | — | Au | 1100 |
| Com. 5 | ITO | 200 | — | — | Al | 200 | Ti | 80 | Au | 200 |
| Com. 6 | ITO | 200 | Cr | 2 | Al | 200 | Ti | 80 | Au | 200 |
| Com. 7 | ITO | 200 | Ti | 2 | Al | 200 | Ti | 80 | Au | 200 |

TABLE 4

| | Evaluation Result | | | | |
|---|---|---|---|---|---|
| Sample | Forward Voltage (V) | Light Emission Output (mW) | Reflection Ratio of Bonding Pad Electrode (%) | The Number of Bonding Inferiorities (among 100,000 chips) | The number of Inferiorities in Test in High Temperature and Humidity Conditions (among 100 chips) |
| Ex. 21 | 3.0 | 20 | 80 | 0 | 0 |
| Ex. 22 | 3.0 | 19.5 | 70 | 0 | 0 |
| Ex. 23 | 3.1 | 22 | 80 | 1 | 0 |
| Es. 24 | 3.1 | 22.5 | 85 | 0 | 0 |
| Ex. 25 | 3.1 | 21 | 70 | 0 | 0 |
| Ex. 26 | 3.0 | 22 | 80 | 0 | 0 |
| Ex. 27 | 3.0 | 21 | 70 | 0 | 0 |
| Ex. 28 | 3.0 | 22 | 80 | 0 | 1 |
| Ex. 29 | 3.0 | 22 | 80 | 1 | 0 |
| Ex. 30 | 3.0 | 21 | 70 | 0 | 0 |
| Ex. 31 | 3.0 | 20 | 60 | 0 | 0 |
| Ex. 32 | 3.0 | 20 | 60 | 0 | 0 |
| Ex. 33 | 3.0 | 20 | 60 | 0 | 0 |
| Ex. 34 | 3.0 | 19.5 | 70 | 0 | 0 |
| Ex. 35 | 3.0 | 19.5 | 70 | 0 | 0 |
| Ex. 36 | 3.0 | 20 | 60 | 0 | 0 |
| Ex. 37 | 3.0 | 20 | 60 | 0 | 0 |
| Ex. 38 | 3.0 | 20 | 60 | 0 | 0 |
| Ex. 39 | 3.0 | 19.5 | 70 | 0 | 0 |
| Ex. 40 | 3.0 | 19.5 | 70 | 0 | 0 |
| Ex. 41 | 3.0 | 22 | 80 | 3 | 7 |
| Com. 4 | 3.0 | 20 | 80 | 3 | 20 |
| Com. 5 | 3.0 | 21.5 | 90 | 100 | 100 |
| Com. 6 | 3.0 | 20 | 90 | 50 | 65 |
| Com. 7 | 3.0 | 20 | 90 | 57 | 11 |

Examples of Embodiment 12 to Embodiment 14

Example 42

A semiconductor light-emitting element made of gallium nitride-based compound semiconductor as illustrated in FIGS. 26 to 28, of which the p-type electrode (ohmic junction layer, junction layer, and bonding pad electrode (metal reflection layer, barrier layer, and bonding layer)) and the n-type electrode were as shown in Table 5, was manufactured as follows.

TABLE 5

| | P-type Electrode | | | | | | | | | | | | | |
|---|---|---|---|---|---|---|---|---|---|---|---|---|---|---|
| | | | | | | | Bonding Pad Electrode | | | | | | | |
| | Transparent Electrode | | Ohmic Junction Layer | | Junction Layer | | Metal Reflection Layer | | Barrier Layer | | Bonding Layer | | | Heat ttreat-ment for Electrode Junction (° C.) |
| Sample | Ma. | Th. (nm) | Ma. | Th. (nm) | Ma. | Th (nm) | Ma. | Th. (nm) | Ma. | Th (nm) | Ma. | Th. (nm) | N-type electrode | |
| Ex. 42 | IZO | 250 | IZO | 100 | Cr | 10 | Pt | 100 | — | — | Au | 1100 | Cr/Pt/Au | 360 |
| Ex. 43 | IZO | 250 | IZO | 150 | Cr | 10 | Pt | 100 | — | — | Au | 1100 | Same as ohnic | 275 |

TABLE 5-continued

| | P-type Electrode | | | | | | | | | | | | |
|---|---|---|---|---|---|---|---|---|---|---|---|---|---|
| | | | | | | Bonding Pad Electrode | | | | | | | |
| | Transparent Electrode | | Ohmic Junction Layer | | Junction Layer | | Metal Reflection Layer | | Barrier Layer | | Bonding Layer | | Heat ttreat-ment for |
| | Ma. | Th. (nm) | Ma. | Th. (nm) | Ma. | Th (nm) | Ma. | Th. (nm) | Ma. | Th (nm) | Ma. | Th. (nm) | N-type electrode | Electrode Junction (° C.) |
| Ex. 44 | ITO | 250 | ITO | 150 | Cr | 2 | Rh | 200 | Ti | 80 | Au | 200 | junction layer, junction layer, and bonding pad electrode of P-type electrode Same as above | Same as above |
| Ex. 45 | IZO | 250 | IZO | 150 | Cr | 2 | Al | 200 | Ti | 80 | Au | 200 | Same as above | Same as above |
| Ex. 46 | IZO | 250 | IZO | 150 | Cr | 2 | Ag | 200 | Ti | 80 | Au | 200 | Same as above | Same as above |
| Ex. 47 | IZO | 250 | IZO | 150 | Cr | 2 | Rh | 200 | Ti | 80 | Au | 200 | Same as above | Same as above |
| Ex. 48 | IZO | 250 | IZO | 150 | Ni | 2 | Al | 200 | Ti | 80 | Au | 200 | Same as above | Same as above |
| Ex. 49 | IZO | 250 | IZO | 150 | Co | 2 | Al | 200 | Ti | 80 | Au | 200 | Same as above | Same as above |
| Ex. 50 | IZO | 250 | IZO | 150 | Cr | 1 | Al | 200 | Ti | 80 | Au | 200 | Same as above | Same as above |
| Ex. 51 | IZO | 250 | IZO | 150 | Cr | 5 | Al | 200 | Ti | 80 | Au | 200 | Same as above | Same as above |
| Ex. 52 | IZO | 250 | IZO | 150 | Cr | 40 | Pt | 100 | — | — | Au | 1100 | Same as above | Same as above |
| Ex. 53 | IZO | 250 | IZO | 150 | Ti | 10 | Rh | 100 | — | — | Au | 1100 | Same as above | Same as above |
| Ex. 54 | IZO | 250 | IZO | 150 | Ti | 10 | Pt | 100 | — | — | Au | 1100 | Same as above | Same as above |
| Ex. 55 | IZO | 250 | IZO | 150 | Ti | 10 | Ir | 100 | — | — | Au | 1100 | Same as above | Same as above |
| Ex. 56 | ITO | 250 | ITO | 150 | Ti | 2 | Pt | 200 | — | — | Au | 550 | Same as above | Same as above |
| Ex. 57 | ITO | 250 | ITO | 150 | Ti | 2 | Ir | 200 | — | — | Au | 550 | Same as above | Same as above |
| Ex. 58 | ITO | 250 | ITO | 150 | Ni | 40 | — | — | — | — | Au | 1100 | Same as above | Same as above |
| Ex. 59 | ITO | 250 | ITO | 150 | Ni | 40 | Pt | 200 | — | — | Au | 550 | Same as above | Same as above |
| Com. 8 | IZO | 250 | — | — | Cr | 10 | Pt | 100 | — | — | Au | 1100 | Ti/Au | 275 |

(* In Table, "Ma." denotes material, "Th." denotes thickness, and "—" means that the corresponding layer is not included)

[Forming of Laminated Semiconductor Layer]

First, an under-layer 103 made of undoped GaN with a thickness of 8 μm was formed on a substrate 101 made of sapphire via a buffer layer 102 made of AlN. Next, an n-contact layer 104a made of Si-doped n-type GaN with a thickness of 2 μm and an n-clad layer 104b made of n-type $In_{0.1}Ga_{0.9}N$ with a thickness of 250 nm were formed. Thereafter, a Si-doped GaN barrier layer with a thickness of 16 nm and an $In_{0.2}Ga_{0.8}N$ well layer with a thickness of 2.5 nm were laminated five times, and lastly, a light-emitting layer 105 of a multiple quantum well structure, in which the barrier layer was installed, was formed.

Further, a p-clad layer 106a made of Mg-doped p-type $Al_{0.07}Ga_{0.93}N$ with a thickness of 10 nm and a p-contact layer 106b made of Mg-doped p-type GaN with a thickness of 150 nm were formed in order. At that time, the forming of the laminated semiconductor layer 20 was performed by a MOCVD method on well-known typical conditions in the corresponding technical field.

[Forming of Electrode]

After the laminated semiconductor layer 20 was formed as described above, a portion of the n-contact layer 104a was exposed by patterning the laminated semiconductor layer 20 by a photolithography method and etching a portion of the laminated semiconductor layer 20 of a predetermined area.

Thereafter, a transparent electrode 109 made of IZO with a thickness of 250 nm was formed on the p-type GaN contact layer 106b, and a protection film 10a made of $SiO_2$ with a thickness of 100 nm was formed on the transparent electrode 109 and the exposed surface 104c of the n-contact layer 104a.

Then, by removing the protection film 10a using RIE (Reactive Ion Etching) in a direction vertical to the upper surface 109c of the transparent electrode 109, an opening 10d was formed, and the upper surface 109c of the transparent elec-trode 109 and the exposed surface 104c of the n-contact layer 104a were exposed from the opening 10d.

Next, by dry-etching the transparent electrode 109, a hole portion 109a was formed. Thereafter, by performing heat-treatment at temperature of 650° C. at nitrogen atmosphere, the IZO layer in an amorphous state forming the transparent electrode 109 was crystallized.

Next, using AZ5200NJ (product name: product of AZ Electronic Materials) as an image reversion type photoresist, a reverse-tapered mask 23 having an opening 23a that is in the form of an inner wall of which the cross-sectional area is gradually widened toward the bottom surface, was formed on the upper surface of the transparent electrode 109 on which the protection film 10a was formed and on the exposed surface 104c of the n-contact layer 104a. In this case, the opening 23a of the mask 23 formed on the transparent electrode 109 was formed in a position from which the hole portion 109a of the transparent electrode 109 is exposed from the opening 23a.

[Pad Forming Step]

Next, by the sputtering method, an ohmic junction layer 9 made of IZO with a thickness of 100 nm was formed to successively cover the bottom surface 109b of the hole portion 109a of the transparent electrode 109, the exposed surface 104c of the n-contact layer 104a, the inner wall 109d of the hole portion 109a of the transparent electrode 109, and the end portion 10c of the opening 10d of the protection film 10a. Next, a junction layer 110 made of Cr with the maximum thickness of 10 nm was formed to successively cover the ohmic junction layer 9 and the end portion 10c of the opening 10d of the protection film 10a. Next, by the sputtering method, a metal reflection layer 117 made of Pt with a maximum thickness of 100 nm which covers the junction layer 110 and has an slope 117c, which is made gradually thinner toward the outside, formed on the outer circumference portion thereof was formed. Then, by the sputtering method, the bonding layer 119 made of Au with a maximum thickness of 1100 nm, of which the shape of the outer circumference portion was formed along the inner wall shape of the opening 23*a* of the mask 23, covered the metal reflection layer 117, and had an slope 119*c*, which was made gradually thinner toward the outside, formed on the outer circumference portion 120*d*, was formed. Accordingly, the bonding pad electrode 120 including the metal reflection layer 117 and the bonding layer 119 was formed.

Thereafter, by soaking the resist in a resist peel-off solution, the mask 23 was peeled off.

[Heat Treatment Step]

Then, in order to improve the adhesion between the ohmic junction layer 9 and the junction layer 110, heat-treatment was performed at a temperature of 360° C. at nitrogen atmosphere.

Also, even without performing the heat-treatment step, the adhesion between the ohmic junction layer 9 and the junction layer 110 can be improved.

Next, as seen from the plane, the edge portion protection film 10*b*, which was made of SiO$_2$ with the maximum thickness of 250 nm was formed on the entire area except for the area that exposed the center portion of the bonding pad electrode 120.

By doing this, the semiconductor light-emitting device 1 of Example 42, having the p-type electrode 111 as illustrated in FIGS. 26 to 28 was obtained.

Examples 43 to 59

Semiconductor light-emitting elements of Examples 43 to 59, which were the same as the semiconductor light-emitting element 1 of Example 42 except that the p-type electrode (ohmic junction layer, junction layer, and bonding pad electrode (metal reflection layer, barrier layer, and bonding layer)) and the n-type electrode were configured as shown in Table 5, were manufactured.

Comparative Example 8

A semiconductor light-emitting element of Comparative example 8 was manufactured, which was the same as the semiconductor light-emitting element 1 of Example 42, except that the n-type electrode 108 made of Ti/Au on the corresponding surface was formed on the exposed surface 104*c* of the n-contact layer 104*a* by the sputtering method before forming of the transparent electrode 109, (1) the p-type electrode 111 had no opening (the upper surface of the transparent electrode was flat); (2) the p-type electrode 111 had no ohmic junction layer; (3) side surfaces of the junction layer 110 and the bonding pad electrode 120 were formed almost vertical to the upper surface 109*c* of the transparent electrode 109, and the heat-treatment temperature was 275° C.; and (4) the insulating protection film 10*b* was not formed.

<Evaluation of Semiconductor Light-Emitting Element>

With respect to the semiconductor light-emitting elements of Examples 42 to 59 and Comparative example 8, a forward voltage was measured through conduction by a probe with an applied current value of 20 mA. The results are shown in Table 6.

As shown in Table 6, the forward voltage in Examples 42 to 59 was 3.0V or 3.1V, and the forward voltage in Comparative example 8 was 3.0V.

TABLE 6

|  | Forward Voltage (V) | Light Emission Output (mW) | Reflection Ratio of Bonding Pad Electrode (%) | The Number of Bonding Inferiorities (among 100,000 chips) | The number of Inferiorities in Test in High Temperature and Humidity Conditions (among 100 chips) | Anticorrosion Test (Inferiority Ratio among 100 chips) |
|---|---|---|---|---|---|---|
| Ex. 42 | 3.0 | 22 | 80 | 0 | 2 | 4 |
| Ex. 43 | 3.0 | 22.5 | 85 | 2 | 5 | 8 |
| Ex. 44 | 3.0 | 21 | 70 | 0 | 2 | 5 |
| Ex. 45 | 3.0 | 22 | 80 | 1 | 5 | 6 |
| Ex. 46 | 3.0 | 22.5 | 85 | 2 | 5 | 6 |
| Ex. 47 | 3.0 | 20.5 | 70 | 0 | 3 | 5 |
| Ex. 48 | 3.0 | 22 | 80 | 2 | 0 | 0 |
| Ex. 49 | 3.0 | 22 | 80 | 3 | 0 | 0 |
| Ex. 50 | 3.0 | 23 | 90 | 5 | 4 | 8 |
| Ex. 51 | 3.0 | 21 | 75 | 0 | 2 | 6 |
| Ex. 52 | 3.0 | 20 | 60 | 0 | 2 | 10 |
| Ex. 53 | 3.0 | 21 | 70 | 0 | 0 | 0 |
| Ex. 54 | 3.0 | 20.5 | 65 | 0 | 0 | 0 |
| Ex. 55 | 3.0 | 20 | 60 | 0 | 0 | 0 |
| Ex. 56 | 3.0 | 21 | 75 | 0 | 0 | 0 |
| Ex. 57 | 3.0 | 21 | 75 | 0 | 0 | 0 |
| Ex. 58 | 3.0 | 19.5 | 60 | 0 | 0 | 0 |
| Ex. 59 | 3.0 | 20.5 | 65 | 0 | 0 | 0 |
| Com. 8 | 3.0 | 20 | 60 | 30 | 20 | 40 |

Thereafter, the semiconductor light-emitting elements of Examples 42 to 59 and Comparative example 8 were mounted in the To-18 can package, and the light emission output was measured by a tester. The results of measurement are shown in Table 6.

As shown in Table 6, the light emission outputs of Examples 42 to 59 were in the range of 19.0 to 23 mW, and the light emission output of Comparative example 8 was 21 mW.

Further, in the Examples 42 to 59 and the Comparative example 8, the reflection ratio of the produced bonding pad electrode was measured. The measurement of the reflection ratio was performed in a wavelength area of 460 nm using a spectrophotometer with respect to the same thin film as the bonding pad electrode formed using a glass dummy substrate put into the chamber during the forming of the bonding pad electrode. The results of measurement are shown in Table 6.

Also, boding test was performed with respect to the semiconductor light-emitting elements (chips) of Examples 42 to 59 and Comparative example 8. The results are shown in Table 2.

As illustrated in Table 6, in Examples 42, 44, 47, and 51 to 59, there was no chip in which the pad was peeled off (the number of bonding inferiorities) among 100,000 chips. Also, in other examples, the number of bonding inferiorities was 5 or less, which was very small. By contrast, in Comparative example 8, the number of bonding inferiorities was 30 among 100,000 chips.

<Chip Test in High Temperature and Humidity Conditions>

The semiconductor light-emitting elements (chip) of Examples 42 to 59 and Comparative example 8 were put into high-temperature high-humidity tester (ISUZU Seisakusho, Co., Ltd., μ-SERIES), and a light emission test (the amount of current passing through the chip was 5 mA, for 2000 hours) was made with respect to 100 chips under the environment of a temperature of 85° C. and relative humidity of 85RH %. The test results are shown in Table 6.

As shown in Table 6, the number of inferiorities in 100 chips was "0" in Examples 48, 49, and 53 to 59. Also, in other examples, the number of inferiorities was 5 or less, which is quite small. By contrast, in Comparative example 8, the number of inferiorities in 100 chips was 20.

<Anticorrosion Test>

In a state where the semiconductor light-emitting element emitted light under the conditions of the applied current value of 20 mA, the forward voltage of 3.0V, and the light emission output of 20 mW, the semiconductor light-emitting elements in Examples 42 to 59 and Comparative example 8 were sunk under water in a water tank. The semiconductor light-emitting elements were kept in this state for 10 minutes, was pulled out of the water, and then the light emission characteristic was measured again. The results of measurement are shown in Table 6.

As shown in Table 6, the number of inferiorities in 100 chips was "0" in Examples 48, 49, and 53 to 59. Also, in other examples, the number of inferiorities was 10 or less, which is quite small. By contrast, in Comparative example 8, the number of inferiorities in 100 chips was 40.

Example 60

A lamp (package) mounted with the semiconductor light-emitting element manufactured in Examples 1 to 59 could be manufactured based on a method as described in Japanese Unexamined Patent Application Publication No. 2007-194401. Also, as an example of an electronic appliance or mechanical device, a backlight incorporated with the lamp could be manufacture.

INDUSTRIAL APPLICABILITY

The present invention relates to a semiconductor light-emitting element, an electrode, a manufacturing method for the element, and a lamp, and can be used in the industry that manufactures and uses the semiconductor light-emitting element having the electrode improved in junction and anticorrosion properties, the electrode and the manufacturing method for the element, and the lamp.

EXPLANATION OF REFERENCE NUMERALS 1, 2, 1a, 1b: SEMICONDUCTOR LIGHT-EMITTING ELEMENT
3: LAMP
9: OHMIC JUNCTION LAYER
10, 10a: PROTECTION FILM (TRANSPARENT PROTECTION FILM)
10b: EDGE PORTION PROTECTION FILM
10c: END PORTION
10d: OPENING
11: PROTECTION FILM
20: LAMINATED SEMICONDUCTOR LAYER
21: UNSOLUBLE RESIST (RESIST PORTION)
22: SOLUBLE RESIST (SOLUBLE PORTION)
23: HARDENED PORTION (MASK) MADE OF CROSSLINKED POLYMER
23a: OPENING
25: MASK
31, 32: FRAME
33, 34: BONDING WIRE (WIRE)
35: MOLD
101: SUBSTRATE
102: BUFFER LAYER
103: UNDER-LAYER
104: n-TYPE SEMICONDUCTOR LAYER
104a: n-CONTACT LAYER
104b: n-CLAD LAYER
104c: EXPOSED SURFACE (SEMICONDUCTOR LAYER EXPOSED SURFACE)
105: LIGHT EMITTING LAYER
105a: BARRIER LAYER
105b: WELL LAYER
106: p-TYPE SEMICONDUCTOR LAYER
106a: p-CLAD LAYER
106b: p-CONTACT LAYER
106c: UPPER SURFACE
108, 118, 128: n-TYPE ELECTRODE (ANOTHER ELECTRODE)
108c: SLOPE
108d: OUTER CIRCUMFERENCE PORTION
109: TRANSPARENT ELECTRODE
109a: JUNCTION RECESS PORTION(HOLE PORTION)
109b: BOTTOM SURFACE
109c: UPPER SURFACE
109d: INNER WALL
110: JUNCTION LAYER
110c: SLOPE
110d: OUTER CIRCUMFERENCE PORTION
111, 111a, 111b, 112: p-TYPE ELECTRODE (ONE ELECTRODE)
117: METAL REFLECTION LAYER

117c: SLOPE
119: BONDING LAYER
119c: SLOPE
120: BONDING PAD ELECTRODE
120d: OUTER CIRCUMFERENCE PORTION
130: JUNCTION LAYER
130c: SLOPE
130d: OUTER CIRCUMFERENCE PORTION
201: p-TYPE ELECTRODE
217: METAL REFLECTION LAYER
219: BONDING LAYER
220: BONDING PAD ELECTRODE

What is claimed is:

1. A semiconductor light-emitting element comprising a substrate, a laminated semiconductor layer comprising a light-emitting layer formed on the substrate, one electrode formed on an upper surface of the laminated semiconductor layer, and another electrode formed on an exposed surface of the semiconductor layer, from which the laminated semiconductor layer is partially cut off;
   wherein at least one of the one electrode and the other electrode comprises a junction layer and a bonding pad electrode formed to cover the junction layer,
   the bonding pad electrode has a maximum thickness that is larger than the maximum thickness of the junction layer, and is composed of one or two or more layers,
   slopes, which are made gradually thinner toward an outer circumference, are formed in outer circumference portions of the junction layer and the bonding pad electrode,
   a transparent electrode is formed between the one electrode and the upper surface of the laminated semiconductor layer or between the electrode and the exposed surface of the semiconductor layer,
   a junction recess portion is provided on an upper surface of the transparent electrode, and
   the junction recess portion is covered by the junction layer.

2. The semiconductor light-emitting element according to claim 1, further comprising an ohmic junction layer formed on the upper surface of the laminated semiconductor layer or the exposed surface of the semiconductor layer;
   wherein the junction layer is formed on the ohmic junction layer.

3. The semiconductor light-emitting element according to claim 1, wherein the bonding pad electrode is composed of a bonding layer made of Au, Al, or an alloy comprising any one of these metals.

4. The semiconductor light-emitting element according to claim 1, wherein the bonding pad electrode is composed of a metal reflection layer formed to cover the junction layer and a bonding layer formed to cover the metal reflection layer, and
   the metal reflection layer is made of any one of Ag, Al, Ru, Rh, Pd, Os, Ir, Pt, and Ti or an alloy comprising any one of these metals.

5. The semiconductor light-emitting element according to claim 1, further comprising an edge portion protection film formed to cover an outer edge portion of the bonding pad electrode and to partially expose the bonding pad electrode.

6. The semiconductor light-emitting element according to claim 1, further comprising a transparent protective film formed to cover an area where the junction recess portion is not formed on the upper surface of the transparent electrode;
   wherein the outer edge portion of the junction layer and the outer edge portion of the bonding pad electrode are arranged on the transparent protective film.

7. The semiconductor light-emitting element according to claim 1, wherein the laminated semiconductor layer is formed by laminating in order an n-type semiconductor layer, the light-emitting layer, and a p-type semiconductor layer on the substrate, and the light-emitting layer has a multiple quantum well structure.

8. The semiconductor light-emitting element according to claim 1, wherein the laminated semiconductor layer is composed of gallium nitride-based semiconductor as the main body.

9. A method of manufacturing the semiconductor light-emitting element according to claim 1, the method comprises a step of manufacturing at least one of the one electrode and the other electrode;
   wherein the step of manufacturing at least one of the one electrode and the other electrode comprises steps of:
   forming a transparent electrode;
   forming a mask comprising an opening having an inner wall shape, of which the cross-sectional area is gradually widened toward a bottom surface, on an upper surface of the transparent electrode;
   forming a junction recess portion by etching the upper surface of the transparent electrode that is exposed from the opening;
   forming a junction layer to cover the junction recess portion;
   forming a bonding pad electrode formed to cover the junction layer and having slopes, which are made gradually thinner toward the outside and are formed in an outer circumference portion of the bonding pad electrode, by forming the shape of the outer circumference portion along the inner wall shape of the opening; and
   removing the mask.

10. A lamp comprising:
    a semiconductor light-emitting element as described in claim 1;
    a first frame on which the semiconductor light-emitting element is arranged and which is wire-bonded with one electrode of the semiconductor light-emitting element;
    a second frame which is wire-bonded with the other electrode of the semiconductor light-emitting element; and
    a mold formed around the semiconductor light-emitting element.

11. An electronic appliance incorporated with the lamp described in claim 10.

12. A mechanical device incorporated with the electronic appliance described in claim 11.

13. A method of manufacturing the semiconductor light-emitting element according to claim 1, the method comprises steps of forming a laminated semiconductor layer comprising a light-emitting layer on a substrate, forming an exposed surface of the semiconductor layer by partially cutting off the laminated semiconductor layer, and forming one electrode and the other electrode on an upper surface of the laminated semiconductor layer and the exposed surface of the semiconductor layer, respectively;
    wherein the step of forming the electrodes comprises the steps of forming a junction layer on the upper surface of the laminated semiconductor layer or the exposed surface of the semiconductor layer after forming a reverse-tapered mask on at least one of the upper surface of the laminated semiconductor layer and the exposed surface of the semiconductor layer, and forming the one electrode or the other electrode by forming a bonding pad electrode, which has a maximum thickness that is larger than the maximum thickness of the junction layer, to cover the junction layer.

14. The method of manufacturing a semiconductor light-emitting element according to claim 13, further comprising the step of forming a transparent electrode on the upper surface of the laminated semiconductor layer or the exposed surface of the semiconductor layer before the step of forming the electrode.

15. The method of manufacturing a semiconductor light-emitting element according to claim 13, wherein the step of forming the electrode comprises the steps of forming a metal reflection layer, which has a maximum thickness that is larger than the maximum thickness of the junction layer, to cover the junction layer after forming the reverse-tapered mask and the junction layer, and forming the one electrode or the other electrode by forming a bonding layer, which has a maximum thickness that is larger than the maximum thickness of the metal reflection layer, to cover the metal reflection layer.

16. The method of manufacturing a semiconductor light-emitting element according to claim 13, further comprising the step of forming a protection film on the upper surface of the transparent electrode and the upper surface of the laminated semiconductor layer or the exposed surface of the semiconductor layer before the step of forming the mask.

17. The method of manufacturing a semiconductor light-emitting element according to claim 13, comprising the steps of:

forming a laminated semiconductor layer comprising a light-emitting layer on a substrate;

forming one electrode on an upper surface of the laminated semiconductor layer; and forming an exposed surface of the semiconductor layer by partially cutting off the laminated semiconductor layer, and forming the other electrode on the exposed surface of the semiconductor layer;

wherein both the step of forming the one electrode and the step of forming the other electrode comprise:

a pad forming step of forming an ohmic junction layer on the upper surface of the laminated semiconductor layer or the exposed surface of the semiconductor layer, forming a junction layer on the ohmic junction layer, and forming a bonding pad electrode to cover the junction layer; and a heat-treatment step of performing a heat-treatment to improve the adhesion of the ohmic junction layer and the junction layer at a temperature of 80° C. to 700° C.

* * * * *